US012513956B2

(12) United States Patent
Lee et al.

(10) Patent No.: US 12,513,956 B2
(45) Date of Patent: Dec. 30, 2025

(54) SEMICONDUCTOR DEVICE AND METHOD OF FORMING THE SAME

(71) Applicant: TAIWAN SEMICONDUCTOR MANUFACTURING COMPANY, LTD., Hsinchu (TW)

(72) Inventors: Hsin-Yi Lee, Hsinchu (TW); Cheng-Lung Hung, Hsinchu (TW); Chi On Chui, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 176 days.

(21) Appl. No.: 18/410,063

(22) Filed: Jan. 11, 2024

(65) Prior Publication Data

US 2024/0145543 A1    May 2, 2024

Related U.S. Application Data

(63) Continuation of application No. 17/461,304, filed on Aug. 30, 2021, now Pat. No. 11,908,893.

(51) Int. Cl.
| | | |
|---|---|---|
| *H10D 30/01* | (2025.01) | |
| *H10D 30/00* | (2025.01) | |
| *H10D 30/62* | (2025.01) | |
| *H10D 62/10* | (2025.01) | |
| *H10D 62/13* | (2025.01) | |
| *H10D 62/17* | (2025.01) | |
| *H10D 64/66* | (2025.01) | |
| *H10D 84/83* | (2025.01) | |

(52) U.S. Cl.
CPC ......... *H10D 62/121* (2025.01); *H10D 30/014* (2025.01); *H10D 30/0191* (2025.01); *H10D 30/024* (2025.01); *H10D 30/502* (2025.01); *H10D 30/6211* (2025.01); *H10D 62/149* (2025.01); *H10D 62/221* (2025.01); *H10D 64/667* (2025.01); *H10D 84/832* (2025.01); *H10D 84/834* (2025.01)

(58) Field of Classification Search
CPC ............... H10D 62/121; H10D 30/014; H10D 30/0191; H10D 30/024; H10D 30/502; H10D 30/6211; H10D 62/149; H10D 62/221; H10D 64/667; H10D 84/832; H10D 84/834; H01L 29/0673; H01L 27/0886; H01L 29/0843; H01L 29/1029; H01L 29/66795; H01L 29/7851; H01L 29/66439; H01L 29/785; H01L 29/78696; H01L 29/42392
See application file for complete search history.

(56) References Cited

U.S. PATENT DOCUMENTS 6,090,709 A * 7/2000 Kaloyeros ............... C23C 16/14
                                                438/653
9,209,247 B2   12/2015 Colinge et al.
(Continued)

*Primary Examiner* — Earl N Taylor
(74) *Attorney, Agent, or Firm* — Birch, Stewart, Kolasch & Birch, LLP

(57) ABSTRACT

A semiconductor device includes source and drain regions, a channel region between the source and drain regions, and a gate structure over the channel region. The gate structure includes a gate dielectric over the channel region, a work function metal layer over the gate dielectric and comprising iodine, and a fill metal over the work function metal layer.

20 Claims, 54 Drawing Sheets

(56) References Cited

U.S. PATENT DOCUMENTS

| | | | |
|---|---|---|---|
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,728,409 B2 | 8/2017 | Harada et al. | |
| 10,847,371 B2* | 11/2020 | Mousa | C23C 16/34 |
| 2001/0002334 A1* | 5/2001 | Lee | H01L 21/76856 |
| | | | 257/E21.17 |
| 2004/0222474 A1* | 11/2004 | Chau | H10D 84/038 |
| | | | 257/407 |
| 2011/0215412 A1* | 9/2011 | Pei | H01L 21/26586 |
| | | | 257/E21.135 |
| 2011/0263115 A1* | 10/2011 | Ganguli | C23C 16/32 |
| | | | 257/E21.19 |
| 2012/0261773 A1* | 10/2012 | Ogawa | H01L 21/28088 |
| | | | 257/E21.409 |
| 2012/0269962 A1* | 10/2012 | Blomberg | C23C 16/409 |
| | | | 427/126.3 |
| 2013/0065391 A1* | 3/2013 | Ogawa | H01L 21/28556 |
| | | | 438/658 |
| 2013/0221445 A1* | 8/2013 | Lei | H10D 84/0181 |
| | | | 257/368 |
| 2014/0242790 A1* | 8/2014 | Harada | H01L 21/28114 |
| | | | 438/592 |
| 2015/0122334 A1* | 5/2015 | Otsubo | H10D 30/6755 |
| | | | 136/263 |
| 2015/0140838 A1* | 5/2015 | Kashefi | H01L 21/0228 |
| | | | 438/785 |
| 2015/0279663 A1* | 10/2015 | Harada | C23C 16/34 |
| | | | 438/785 |
| 2015/0279682 A1* | 10/2015 | Nakatani | H01L 21/28506 |
| | | | 438/585 |
| 2016/0133650 A1* | 5/2016 | Sugawara | H10D 86/451 |
| | | | 257/43 |
| 2016/0376704 A1* | 12/2016 | Raisanen | H10D 64/667 |
| 2017/0011926 A1* | 1/2017 | Harada | H01L 21/67196 |
| 2017/0162607 A1* | 6/2017 | Abe | H10K 59/127 |
| 2019/0348515 A1* | 11/2019 | Li | H01L 21/28088 |
| 2019/0378998 A1* | 12/2019 | Sakii | H10K 10/84 |
| 2020/0098891 A1* | 3/2020 | Bih | H01L 21/321 |
| 2020/0273710 A1* | 8/2020 | Zhang | H01L 21/28088 |
| 2020/0381311 A1* | 12/2020 | Kim | H10D 30/43 |
| 2021/0057280 A1* | 2/2021 | Wu | H10D 84/834 |
| 2021/0083214 A1* | 3/2021 | Sakii | G06K 19/0723 |
| 2021/0399102 A1* | 12/2021 | Lee | H10D 84/038 |
| 2022/0037505 A1* | 2/2022 | Wan | H10D 30/6713 |
| 2022/0077299 A1* | 3/2022 | Zhao | H01L 21/28568 |
| 2022/0231124 A1* | 7/2022 | Lee | H01L 21/02631 |

\* cited by examiner

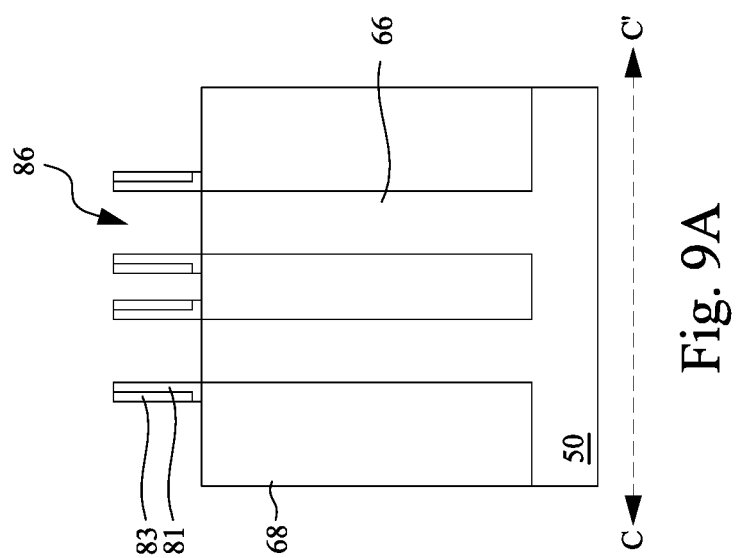

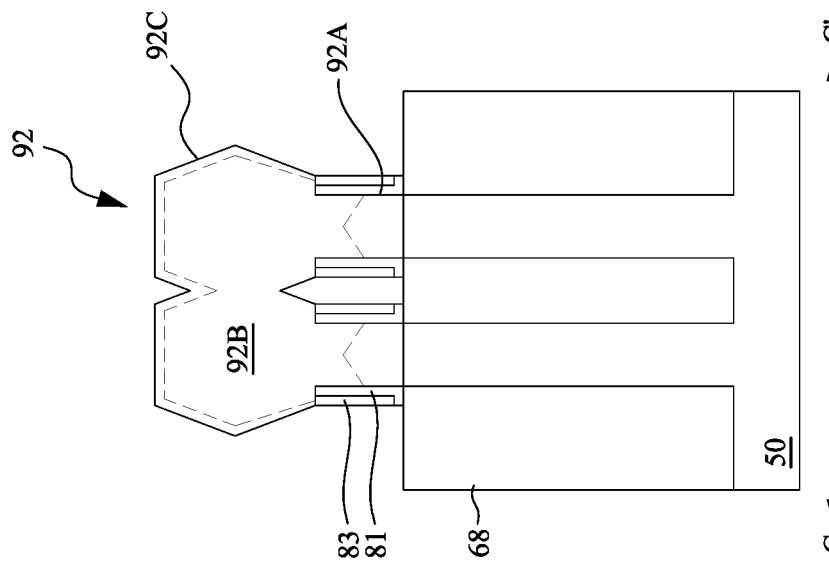

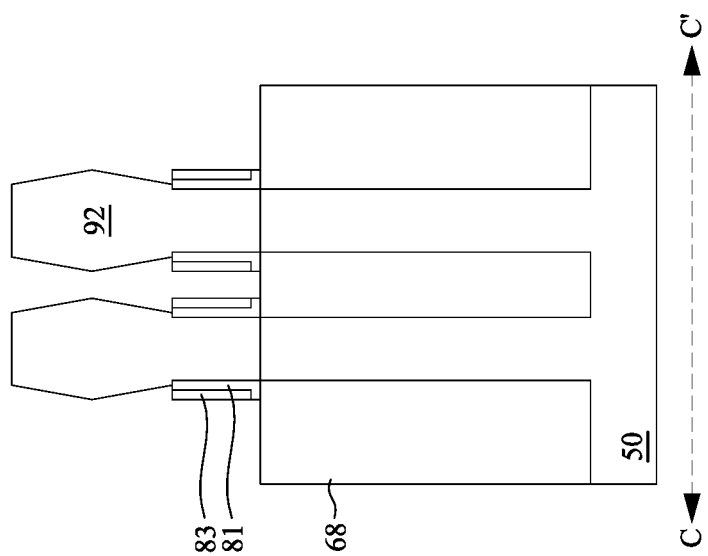

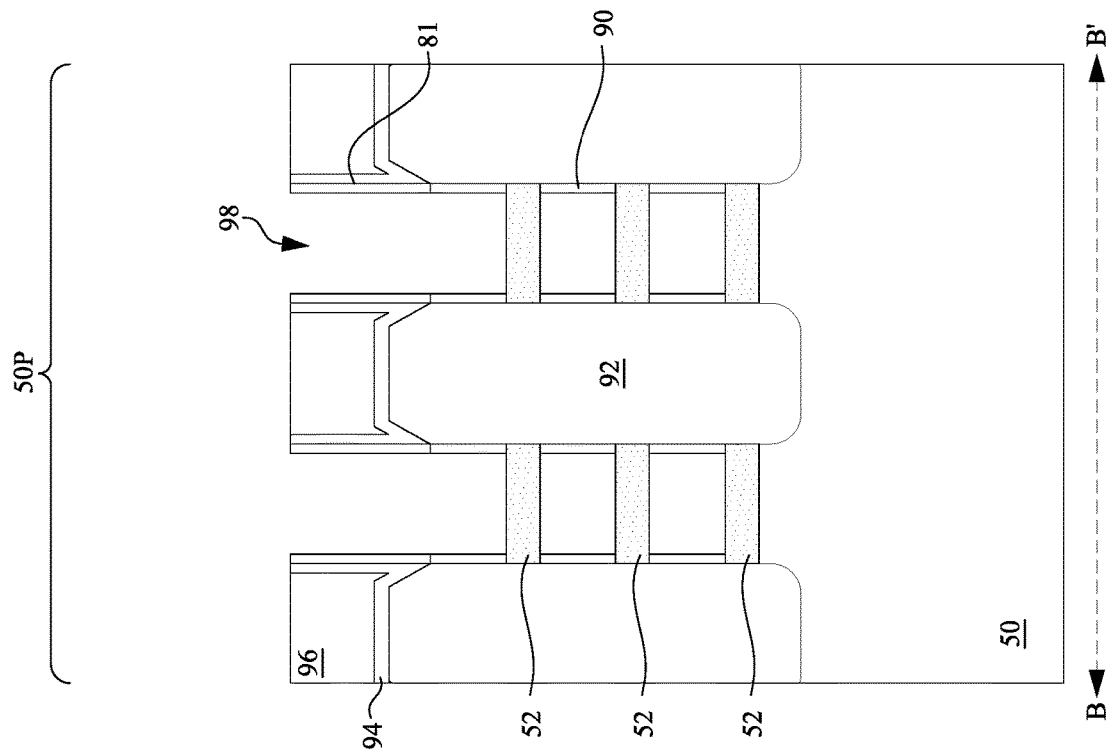
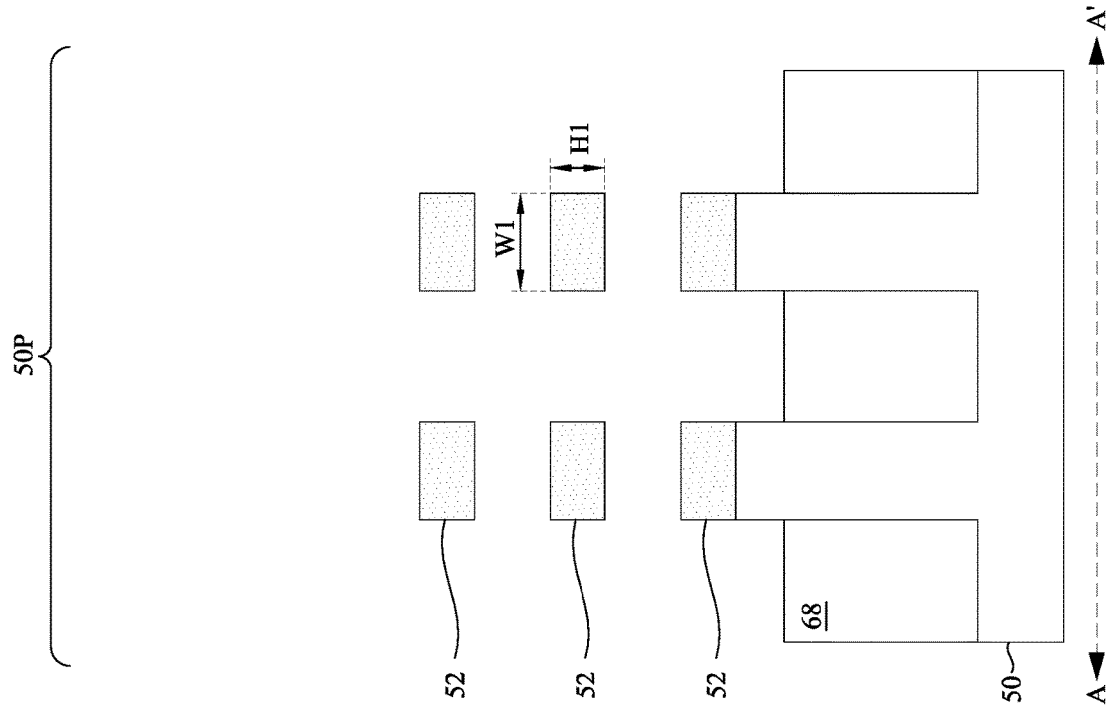
Fig. 16A
Fig. 16B

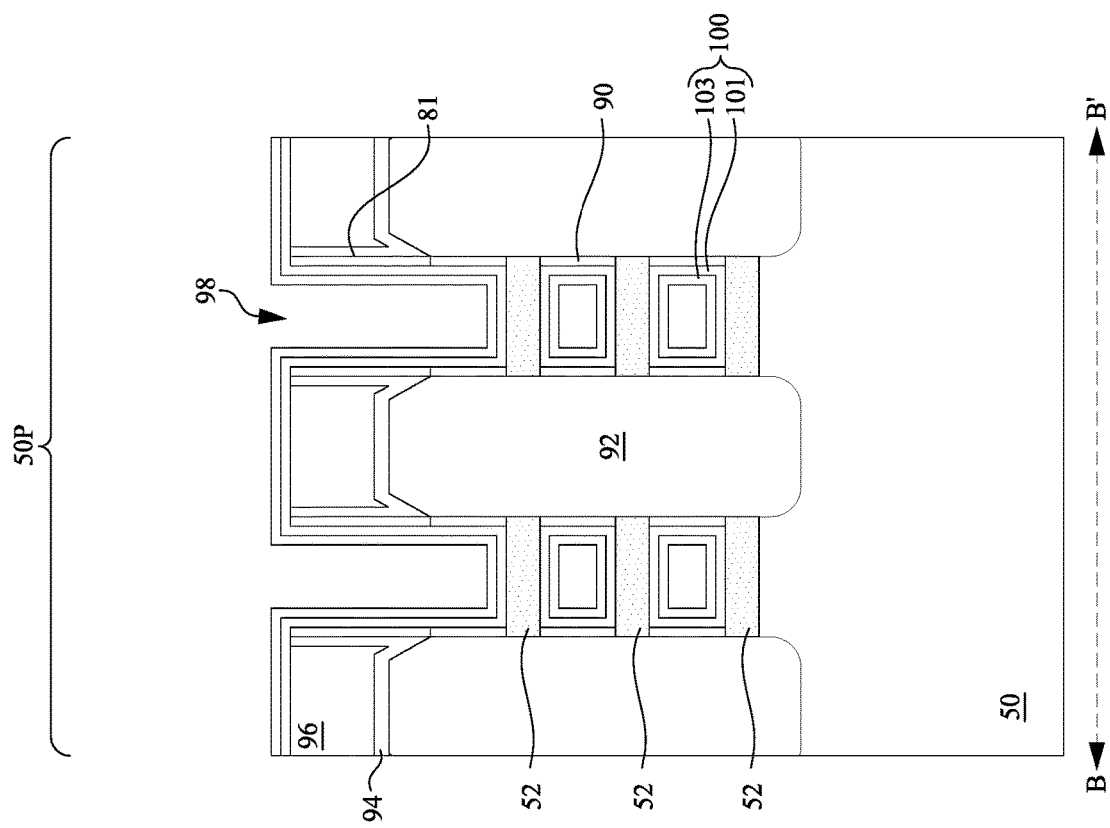
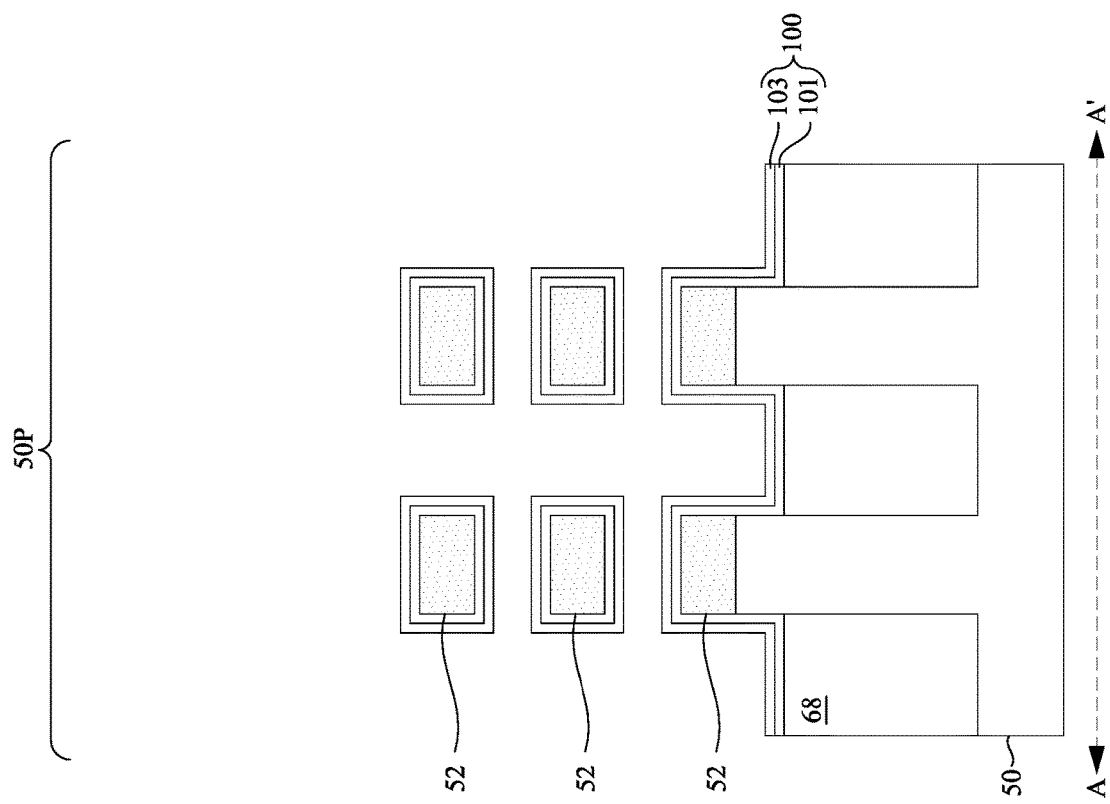
Fig. 17B
Fig. 17A

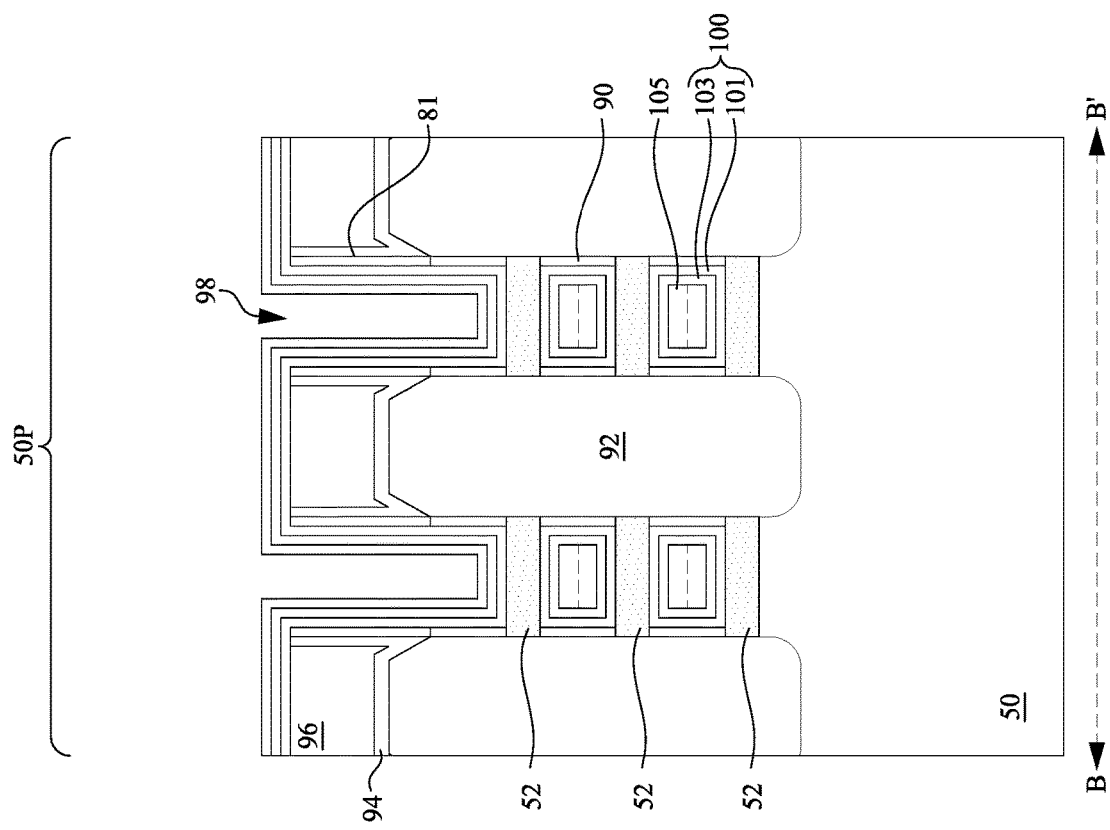
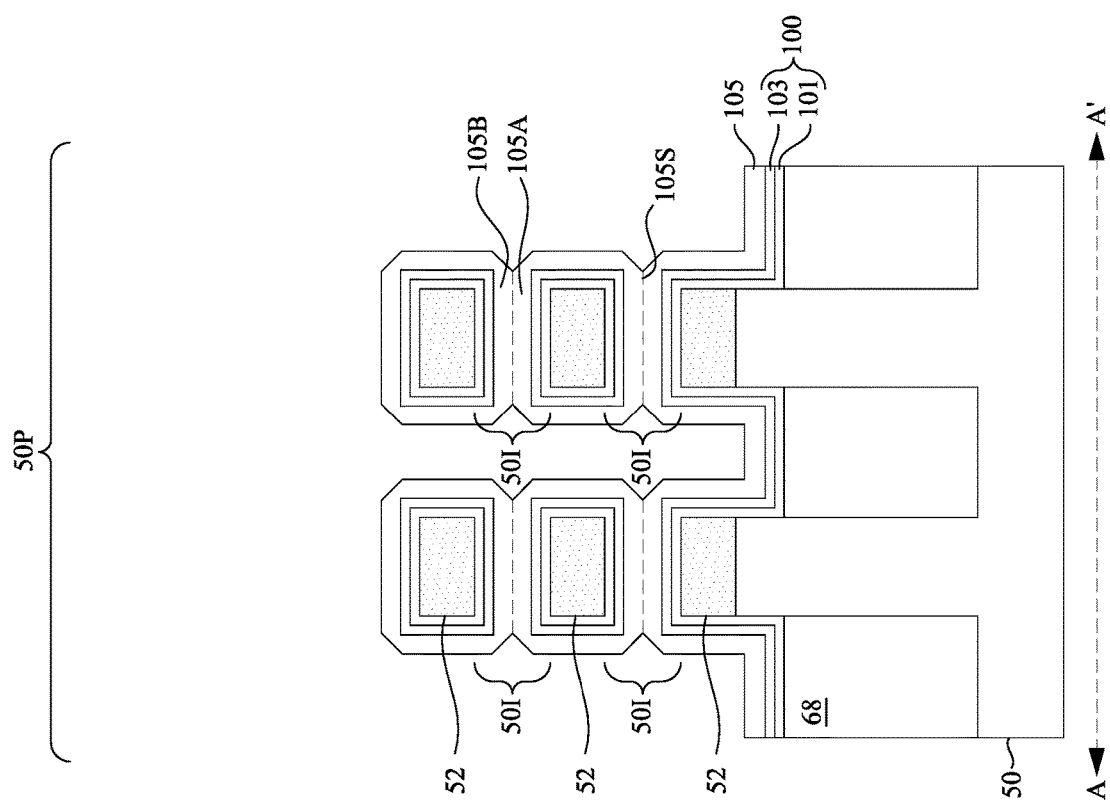
Fig. 18B
Fig. 18A

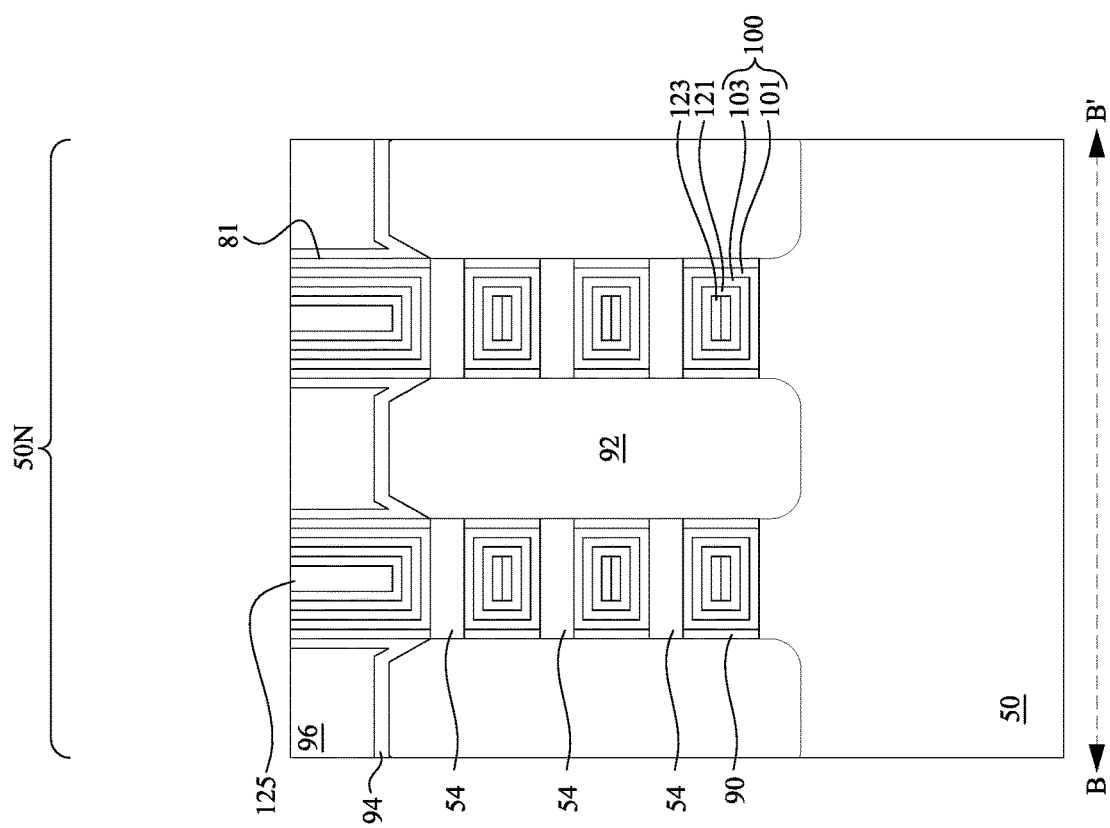
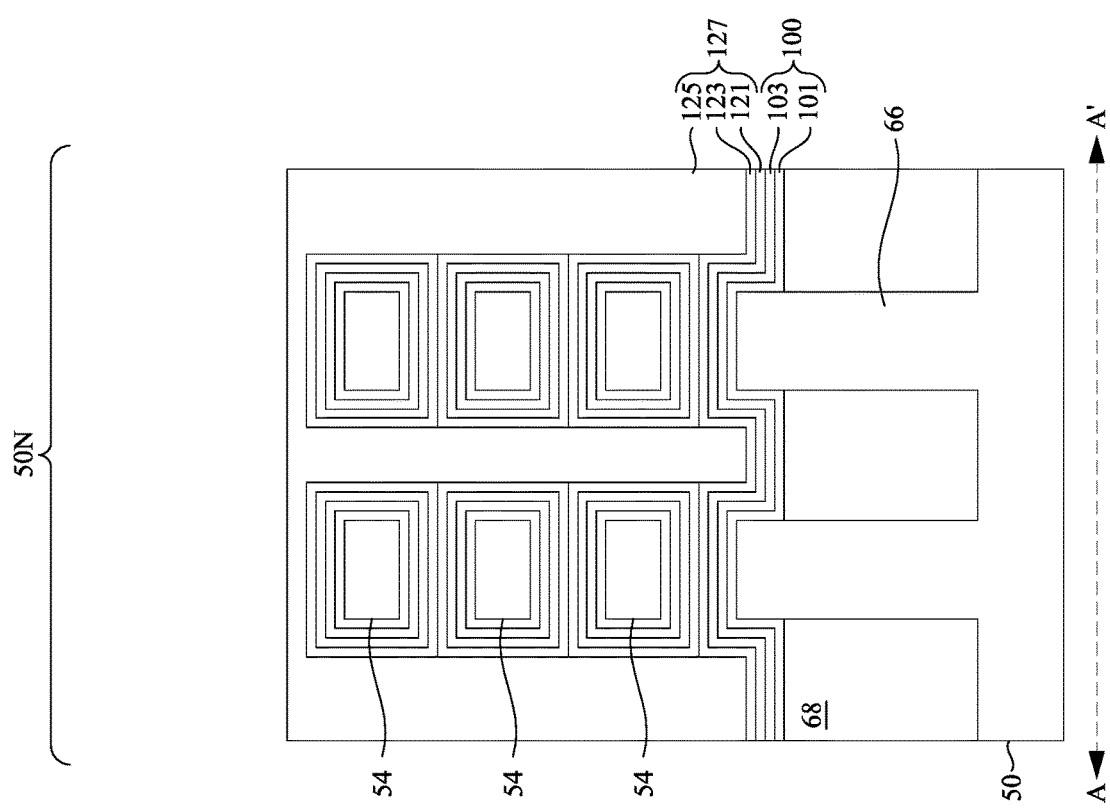
Fig. 25B
Fig. 25A

SEMICONDUCTOR DEVICE AND METHOD OF FORMING THE SAME

CROSS-REFERENCE TO RELATED APPLICATION

This application is continuation application of U.S. application Ser. No. 17/461,304, filed Aug. 30, 2021, which is herein incorporated by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 11A, 11B, 11C, 12A, 12B, 12C, 12D, 13A, 13B, 13C, 14A, 14B, 15A, 15B, 16A, 16B, 17A, 17B, 18A, 18B, 21A, 21B, 21C, 21D, 25A, 25B, 26A, 26B, 26C, 27A, 27B, and 27C are cross-sectional and top down views of intermediate stages in the manufacturing of nano-FETs, in accordance with some embodiments.

DETAILED DESCRIPTION

Figure 1:
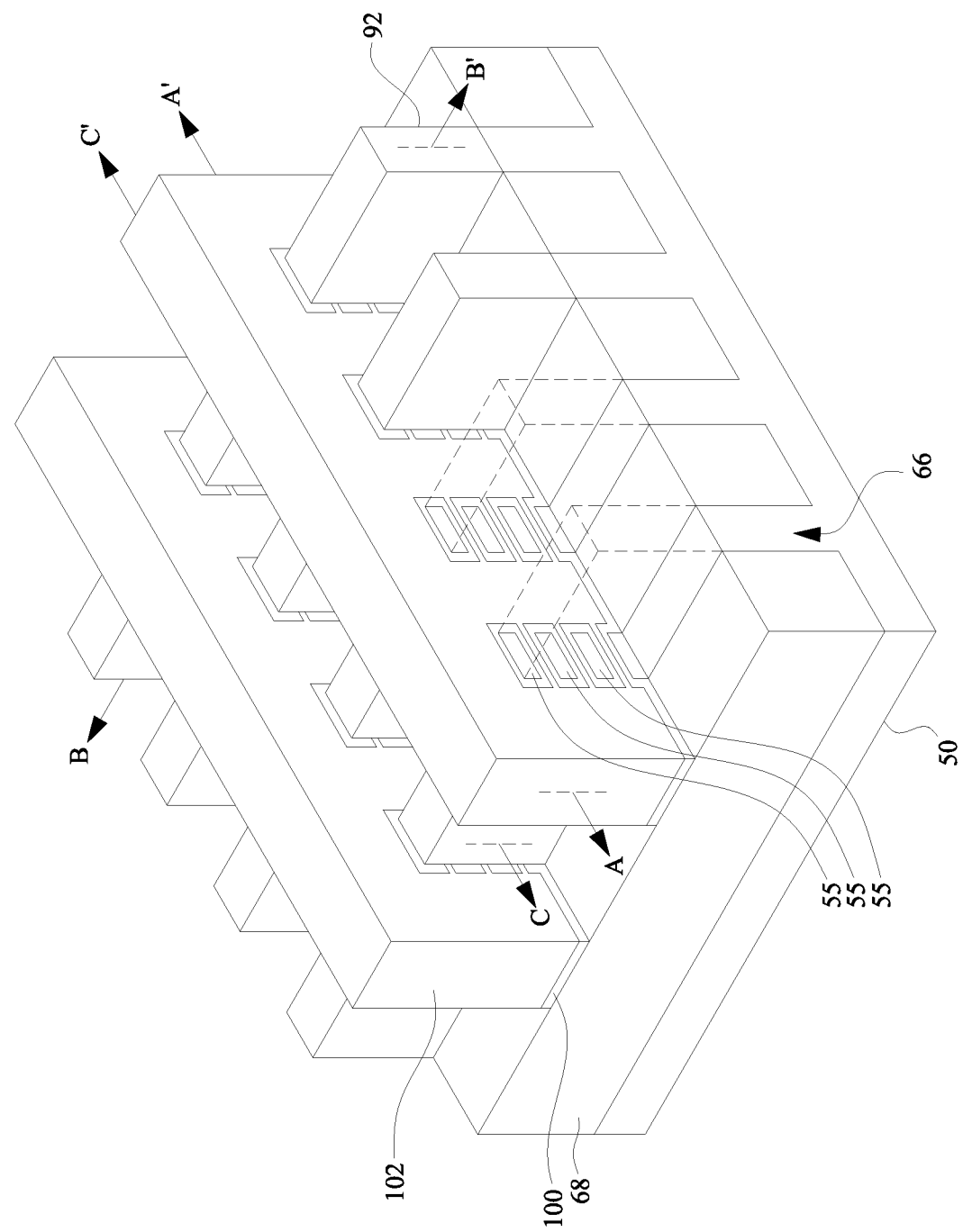
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 illustrates an example of nano-FETs (e.g., nanowire FETs, nanosheet FETs, or the like) in a three-dimensional view, in accordance with some embodiments. The nano-FETs include nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include P-type nanostructures, N-type nanostructures, or a combination thereof. Isolation regions 68 are disposed between adjacent fins 66, in which the fins 66 may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may include a single material or a plurality of materials. In this context, the fins 66 refer to the portion extending between the neighboring isolation regions 68.

Gate dielectrics 100 are over top surfaces of the fins 66 and along top surfaces, sidewalls, and bottom surfaces of the nanostructures 55. Gate electrodes 102 are over the gate dielectrics 100. Epitaxial source/drain regions 92 are disposed on the fins 66 on opposing sides of the gate dielectrics 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent Figures. refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2-18B and 21A-28C are cross-sectional views of intermediate stages in the manufacturing of nano-FETs, in accordance with some embodiments. FIGS. 2 through 5, 6A, 13A, 14A, 15A, 16A, 17A, 18A, 21A, 22, 23, 24, 25A, 26A, 27A, and 28A illustrate reference cross-section A-A' illustrated in FIG. 1. FIGS. 6B, 7B, 8B, 9B, 10B, 11B, 11C, 12B, 12D, 13B, 14B, 15B, 16B, 17B, 18B, 21B, 25B, 26B, 27B, and 28B illustrate reference cross-section B-B' illustrated in FIG. 1. FIGS. 7A, 8A, 9A, 10A, 11A, 12A, 12C, 13C, 26C, 27C, and 28C illustrate reference cross-section C-C' illustrated in FIG. 1.

Figure 2:
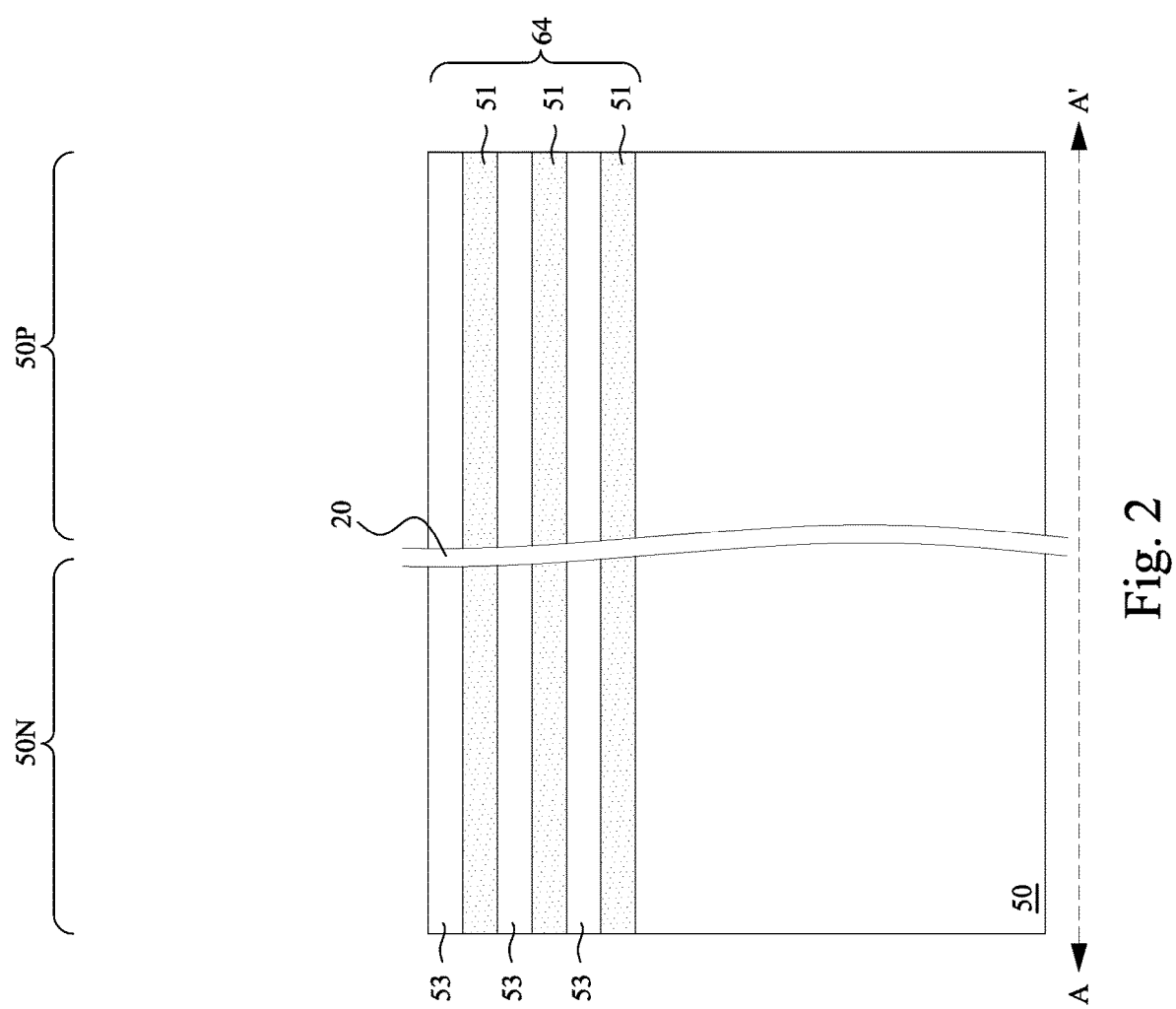

In FIG. 2, a substrate 50 is provided. The substrate 50 may be a semiconductor substrate, such as a bulk semiconductor, a semiconductor-on-insulator (SOI) substrate, or the like, which may be doped (e.g., with a P-type or an N-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an N-type region 50N and a P-type region 50P. The N-type region 50N can be for forming N-type devices, such as NMOS transistors, e.g., N-type nano-FETs, and the P-type region 50P can be for forming P-type devices, such as PMOS transistors, e.g., P-type nano-FETs. The N-type region 50N may be physically separated from the P-type region 50P (as illustrated by divider 20), and any number of device features (e.g., other active devices, doped regions, isolation structures, etc.) may be disposed between the N-type region 50N and the P-type region 50P. Although one N-type region 50N and one P-type region 50P are illustrated, any number of N-type regions 50N and P-type regions 50P may be provided.

Further in FIG. 2, a multi-layer stack 64 is formed over the substrate 50. The multi-layer stack 64 includes alternating layers of first semiconductor layers 51 and second semiconductor layers 53. For purposes of illustration and as discussed in greater detail below, the second semiconductor layers 53 will be removed and the first semiconductor layers 51 will be patterned to form channel regions of nano-FETs in the P-type region 50P. Also, the first semiconductor layers 51 will be removed and the second semiconductor layers 53 will be patterned to form channel regions of nano-FETs in the N-type regions 50N. Nevertheless, in some embodiments the first semiconductor layers 51 may be removed and the second semiconductor layers 53 may be patterned to form channel regions of nano-FETs in the N-type region 50N, and the second semiconductor layers 53 may be removed and the first semiconductor layers 51 may be patterned to form channel regions of nano-FETs in the P-type regions 50P.

Figure 26A:
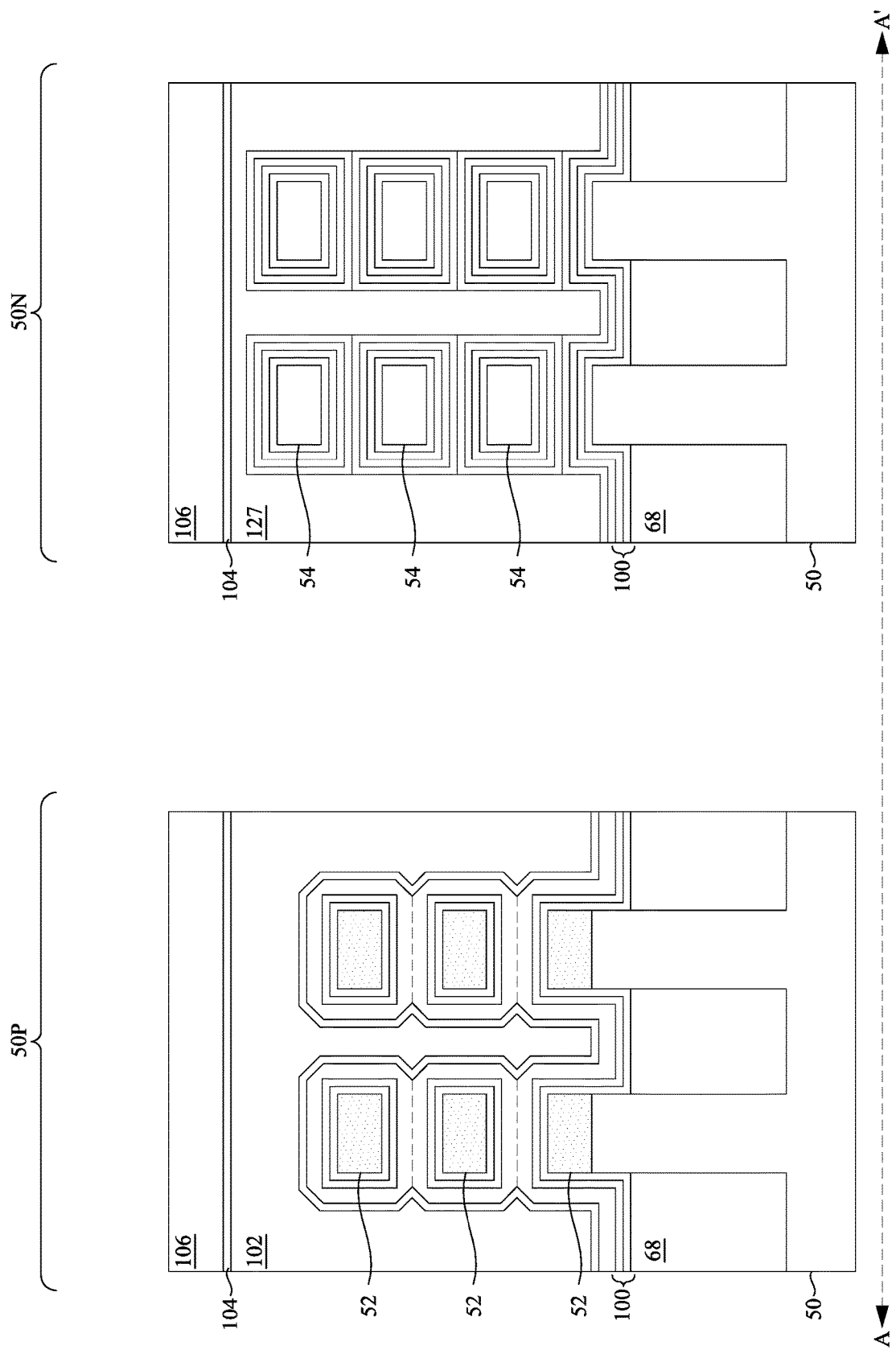
Figure 26B:
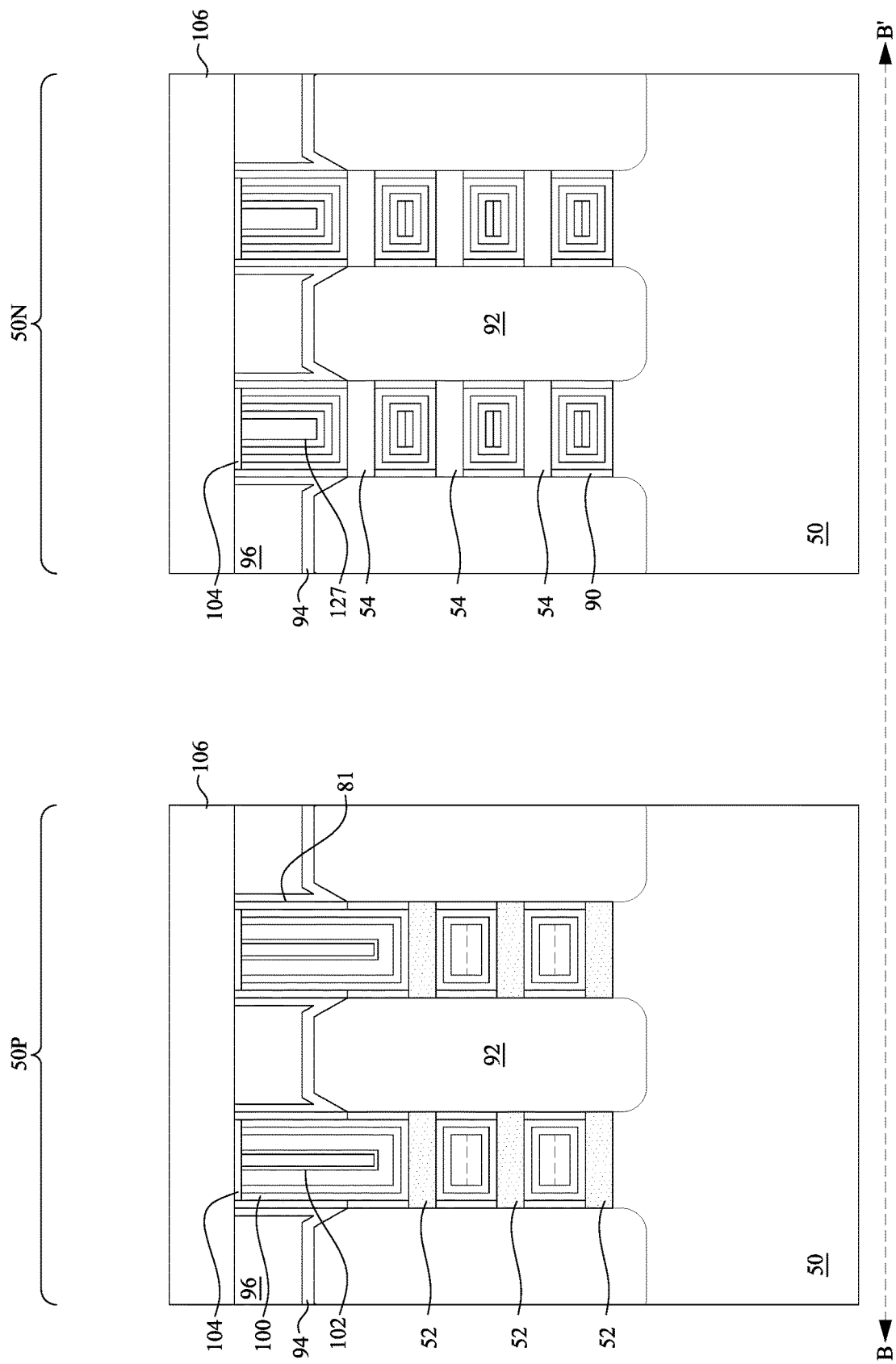
Figure 26C:
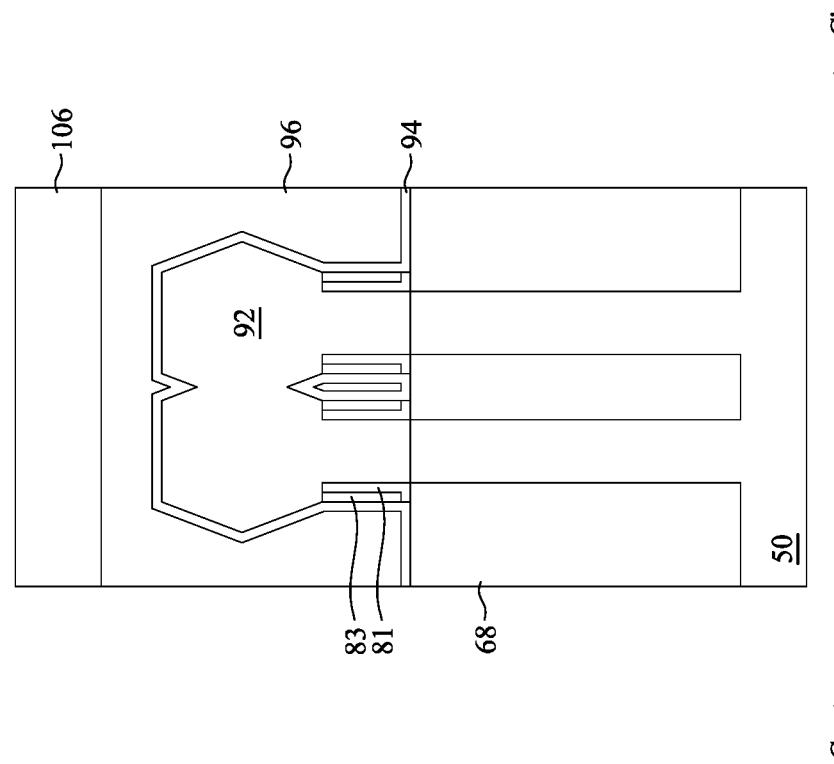

In still other embodiments, the first semiconductor layers 51 may be removed and the second semiconductor layers 53 may be patterned to form channel regions of nano-FETS in both the N-type region 50N and the P-type region 50P. In other embodiments, the second semiconductor layers 53 may be removed and the first semiconductor layers 51 may be patterned to form channel regions of non-FETs in both the N-type region 50N and the P-type region 50P. In such embodiments, the channel regions in both the N-type region 50N and the P-type region 50P may have a same material composition (e.g., silicon, or the like) and be formed simultaneously. FIGS. 26A, 26B, and 26C illustrate a structure resulting from such embodiments where the channel regions in both the P-type region 50P and the N-type region 50N include silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for P-type nano-FETs, such as silicon germanium, or the like, and the second semiconductor layers 53 may be formed of a second semiconductor material suitable for N-type nano-FETs, such as silicon, silicon carbon, or the like. The multi-layer stack 64 is illustrated as having a bottommost semiconductor layer suitable for P-type nano-FETs for illustrative purposes. In some embodiments, the multi-layer stack 64 may be formed such that the bottommost layer is a semiconductor layer suitable for N-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the N-type region 50N, thereby allowing the second semiconductor layers 53 to be patterned to form channel regions of N-type NSFETS. Similarly, the second semiconductor layers 53 of the second semiconductor material may be removed without significantly removing the first semiconductor layers 51 of the first semiconductor material in the P-type region 50P, thereby allowing the first semiconductor layers 51 to be patterned to form channel regions of P-type NSFETS. In other embodiments, the channel regions in the N-type region 50N and the P-type region 50P may be formed simultaneously and have a same material composition, such as silicon, silicon germanium, or the like.

Figure 3:
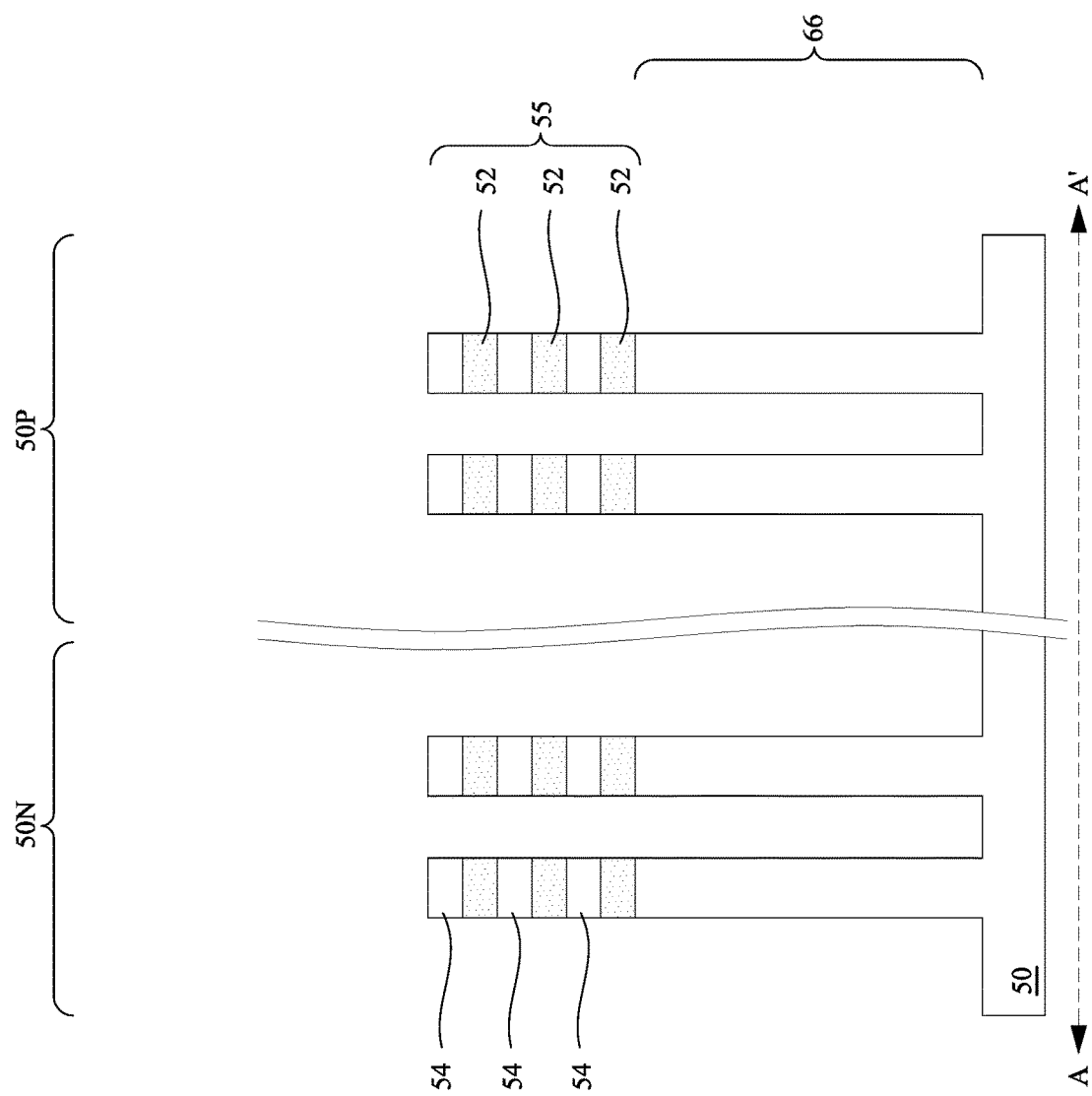

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52 from the first semiconductor layers 51 and define second nanostructures 54 from the second semiconductor layers 53. The first nanostructures 52 and the second nanostructures 54 may further be collectively referred to as the nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the N-type region 50N and the P-type region 50P as having substantially equal widths for illustrative purposes. In some embodiments, widths of the fins 66 in the N-type region 50N may be greater or thinner than the fins 66 in the P-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
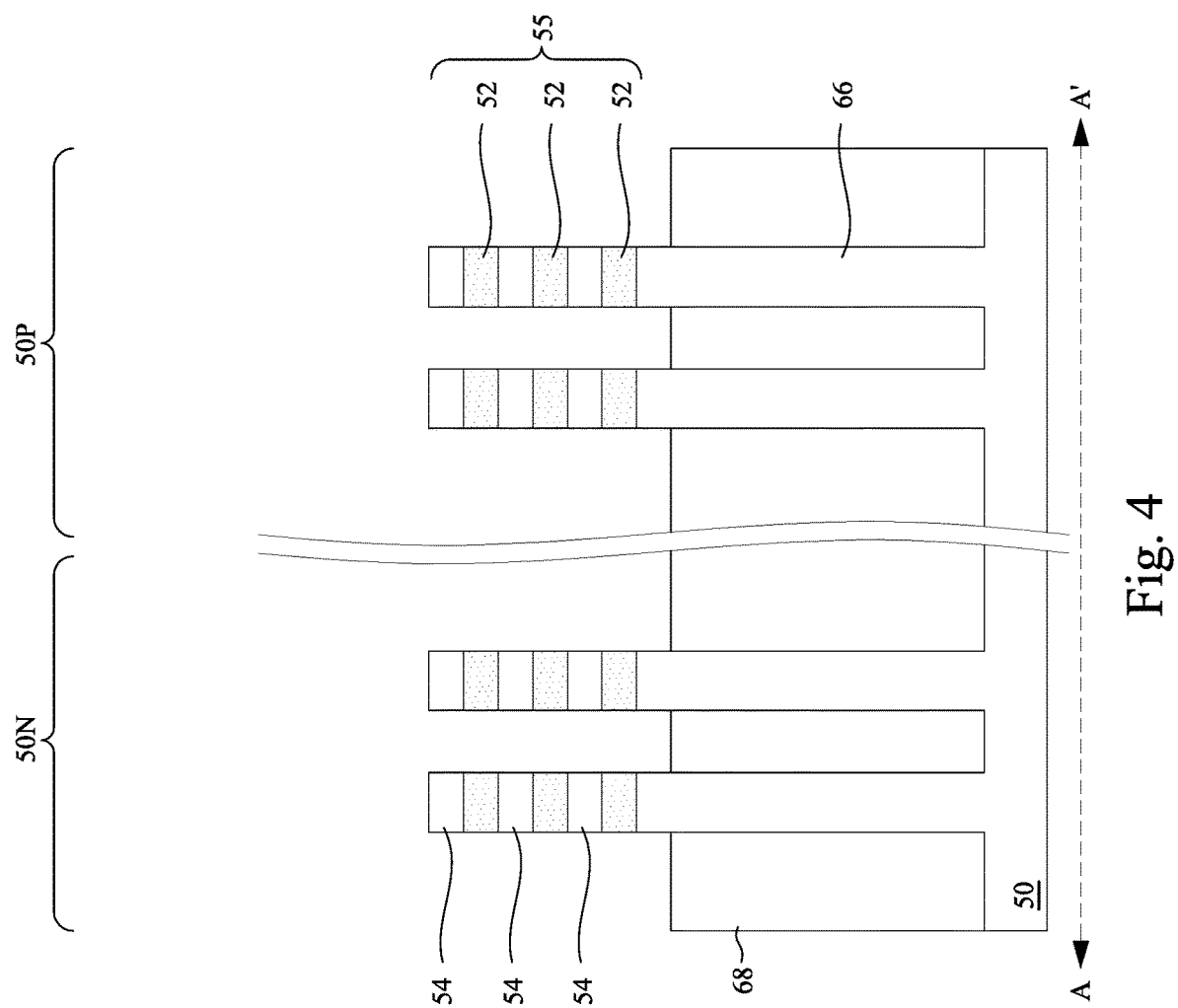

In FIG. 4, isolation regions 68 such as shallow trench isolation (STI) regions 68 are formed adjacent the fins 66. The isolation regions 68 may be formed by depositing an insulation material over the substrate 50, the fins 66, and the nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above, may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the Isolation regions 68. The insulation material is recessed such that upper portions of the fins 66 in the regions 50N and 50P protrude from between neighboring Isolation regions 68. Further, the top surfaces of the Isolation regions 68 may have a flat surface as illustrated, a convex surface, a concave surface (such as dishing), or a combination thereof. The top surfaces of the Isolation regions 68 may be formed flat, convex, and/or concave by an appropriate etch. The Isolation regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

Additionally, the first semiconductor layers 51 (and resulting first nanostructures 52) and the second semiconductor layers 53 (and resulting second nanostructures 54) are illustrated and discussed herein as including the same materials in the P-type region 50P and the N-type region 50N for illustrative purposes only. As such, in some embodiments one or both of the first semiconductor layers 51 and the second semiconductor layers 53 may be different materials or formed in a different order in the P-type region 50P and the N-type region 50N.

Further in FIG. 4, appropriate wells (not separately illustrated) may be formed in the fins 66, the nanostructures 55, and/or the Isolation regions 68. In embodiments with different well types, different implant steps for the N-type region 50N and the P-type region 50P may be achieved using a photoresist or other masks (not separately illustrated). For example, a photoresist may be formed over the fins 66 and the Isolation regions 68 in the N-type region 50N and the P-type region 50P. The photoresist is patterned to expose the P-type region 50P. The photoresist can be formed by using a spin-on technique and can be patterned using acceptable photolithography techniques. Once the photoresist is patterned, an N-type impurity implant is performed in the P-type region 50P, and the photoresist may act as a mask to substantially prevent N-type impurities from being implanted into the N-type region 50N. The N-type impurities may be phosphorus, arsenic, antimony, or the like. After the implant, the photoresist is removed, such as by an acceptable ashing process.

Following or prior to the implanting of the P-type region 50P, a photoresist or other masks (not separately illustrated) is formed over the fins 66, the nanostructures 55, and the Isolation regions 68 in the P-type region 50P and the N-type region 50N. The photoresist is patterned to expose the N-type region 50N. The photoresist can be formed by using a spin-on technique and can be patterned using acceptable photolithography techniques. Once the photoresist is patterned, a P-type impurity implant may be performed in the N-type region 50N, and the photoresist may act as a mask to substantially prevent P-type impurities from being implanted into the P-type region 50P. The P-type impurities may be boron, boron fluoride, indium, or the like. After the implant, the photoresist may be removed, such as by an acceptable ashing process.

After the implants of the N-type region 50N and the P-type region 50P, an anneal may be performed to repair implant damage and to activate the P-type and/or N-type impurities that were implanted. In some embodiments, the grown materials of epitaxial fins may be in situ doped during growth, which may obviate the implantations, although in situ and implantation doping may be used together.

Figure 5:
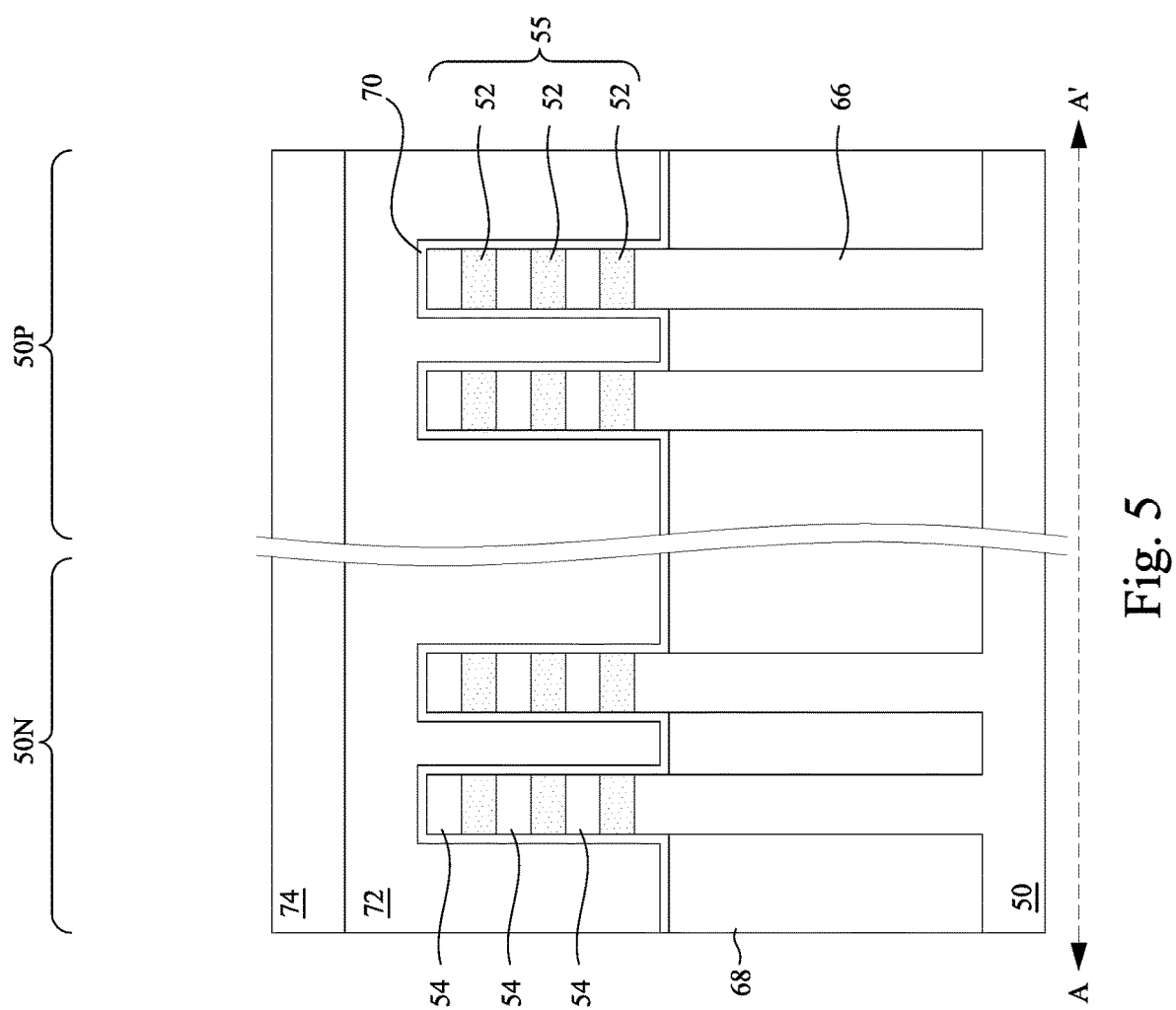

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the N-type region 50N and the P-type region 50P.

Figure 6A:
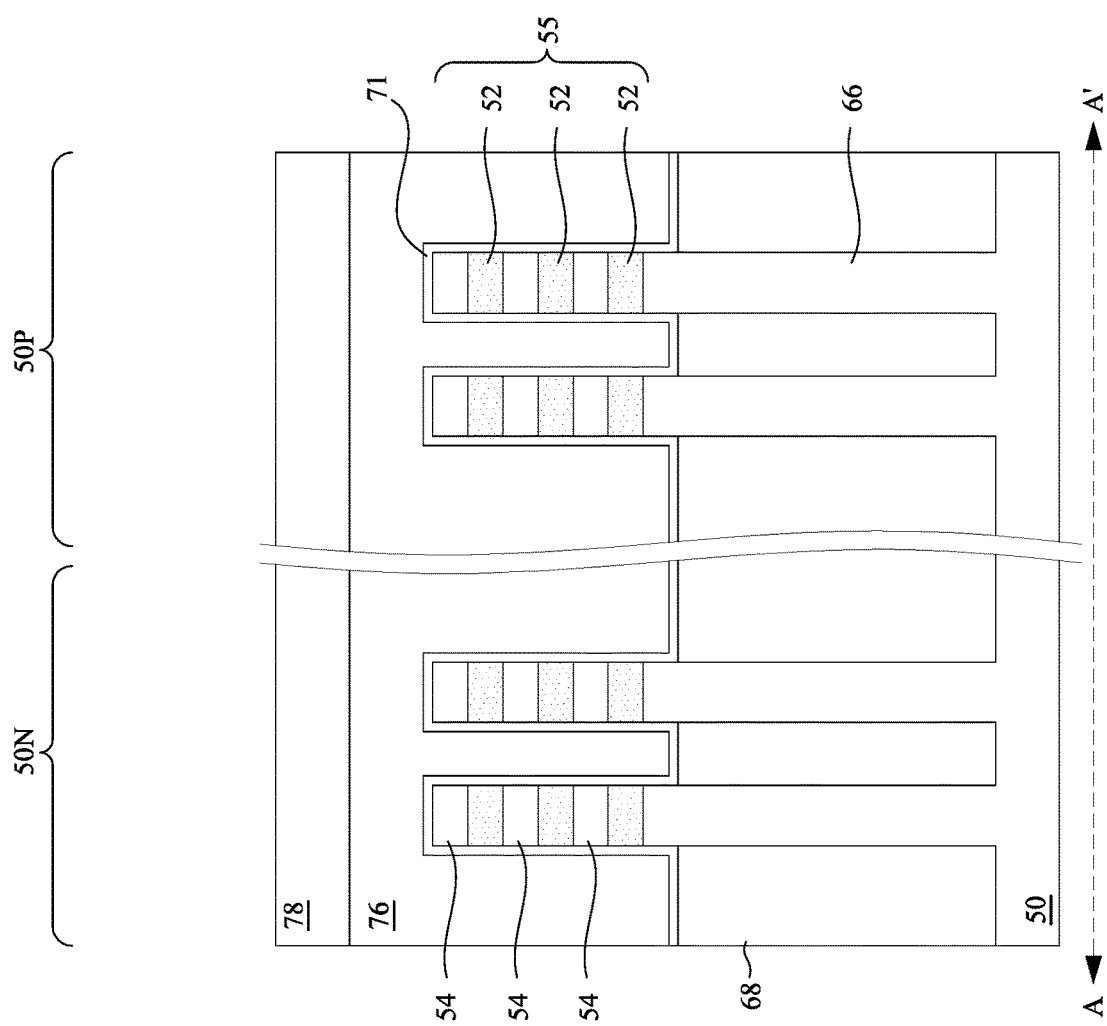
Figure 6B:
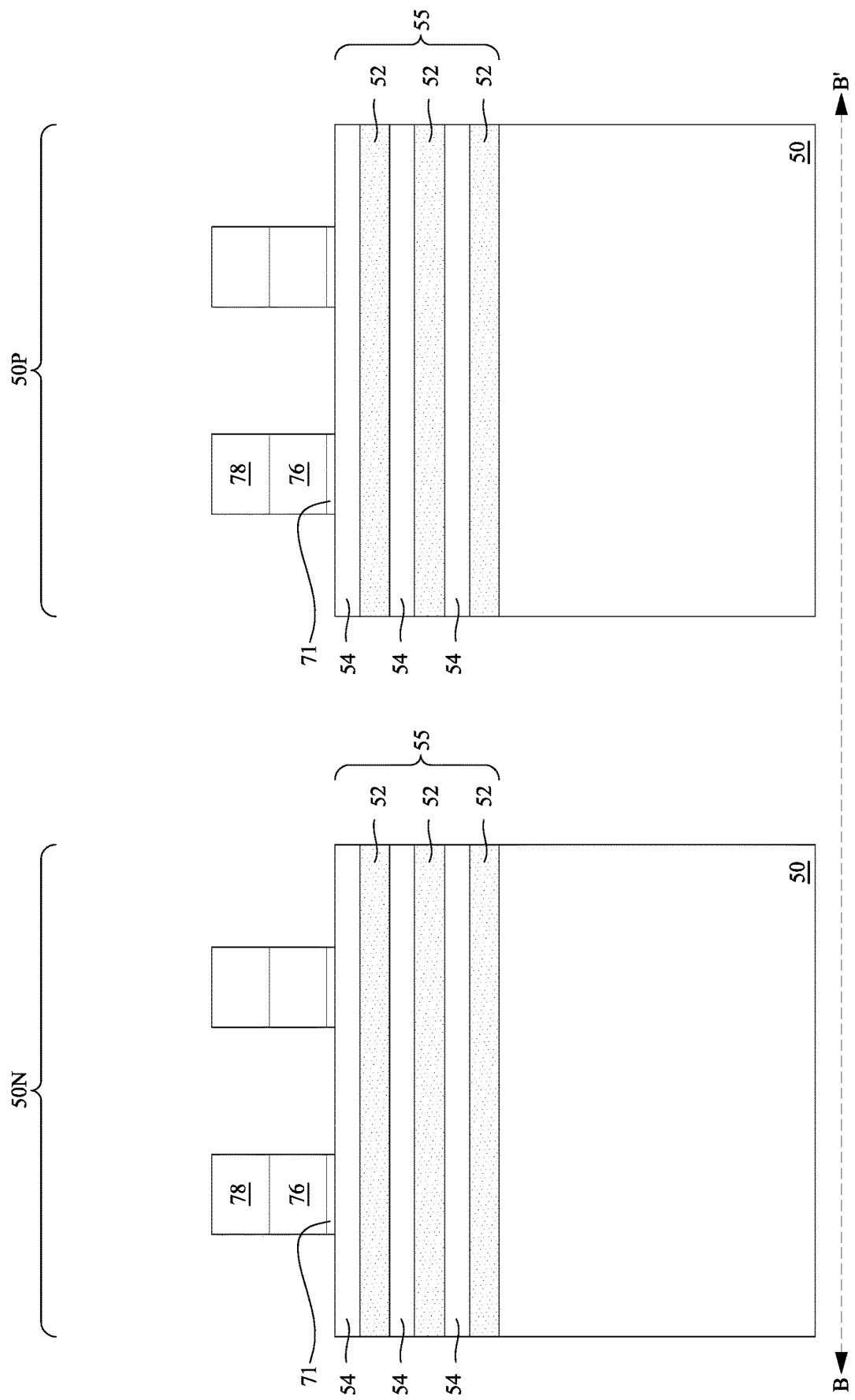

FIGS. 6A through 18B illustrate various additional steps in the manufacturing of embodiment devices. FIGS. 6A, 7A, 8A, 9A, 10A, 11A, 12A, 12C, 13A, 13C, 14A, 15A, and 18B illustrate features in either the regions 50N or the regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 (see FIG. 5) and to the dummy dielectric layer 70 (see FIG. 5) to form dummy gates 76 and dummy dielectric layer 70, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
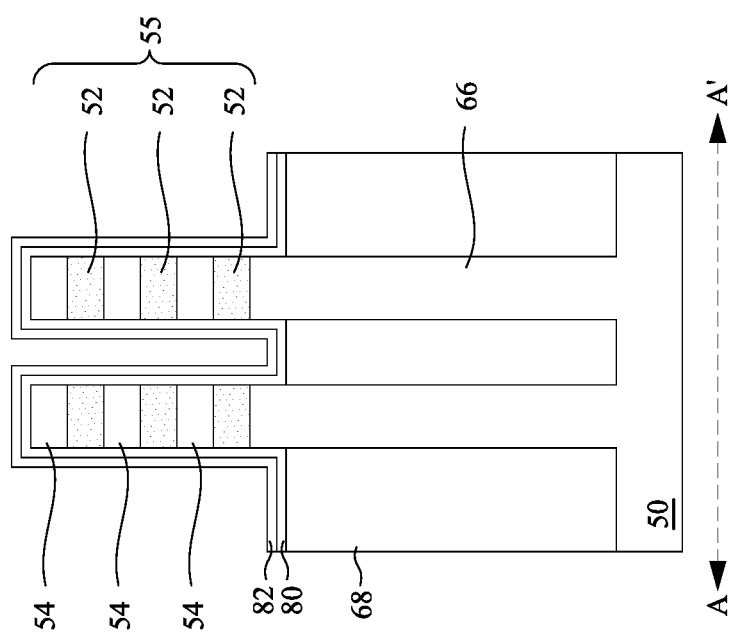
Figure 7B:
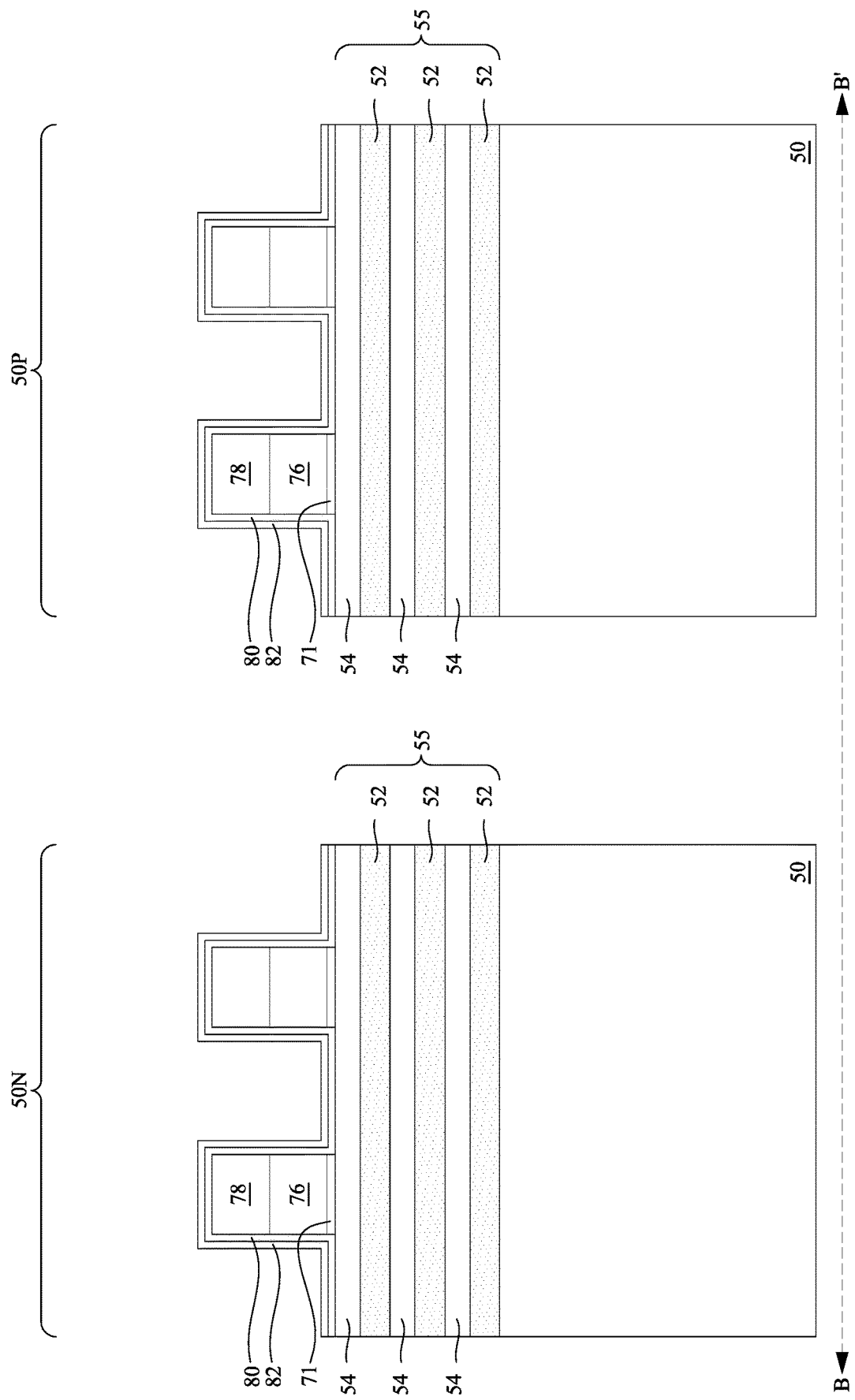

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the Isolation regions 68; top surfaces and sidewalls of the fins 66, the nanostructures 55, and the masks 78; and sidewalls of the dummy gates 76 and the dummy gate dielectrics 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the N-type region 50N, while exposing the P-type region 50P, and appropriate type (e.g., P-type) impurities may be implanted into the exposed fins 66 and nanostructures 55 in the P-type region 50P. The mask may then be removed. Subsequently, a mask, such as a photoresist, may be formed over the P-type region 50P while exposing the N-type region 50N, and appropriate type impurities (e.g., N-type) may be implanted into the exposed fins 66 and nanostructures 55 in the N-type region 50N. The mask may then be removed. The N-type impurities may be any of the N-type impurities previously discussed, and the P-type impurities may be any of the P-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8A:
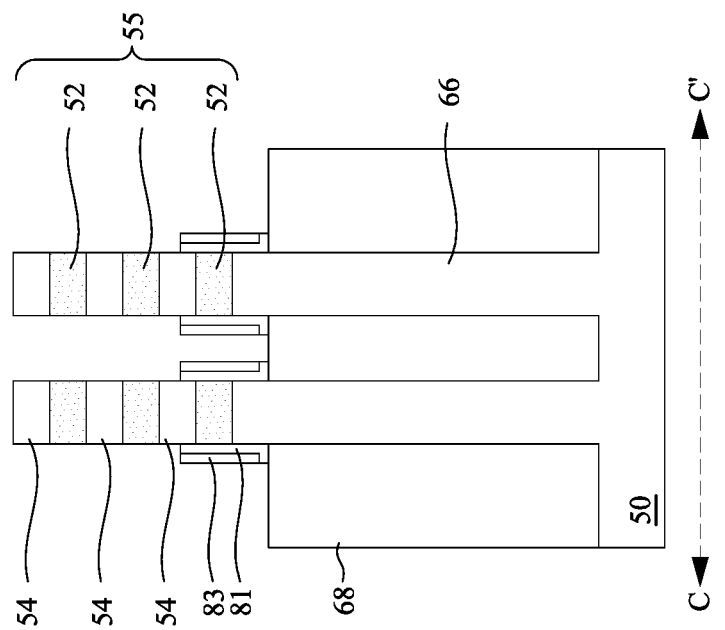
Figure 8B:
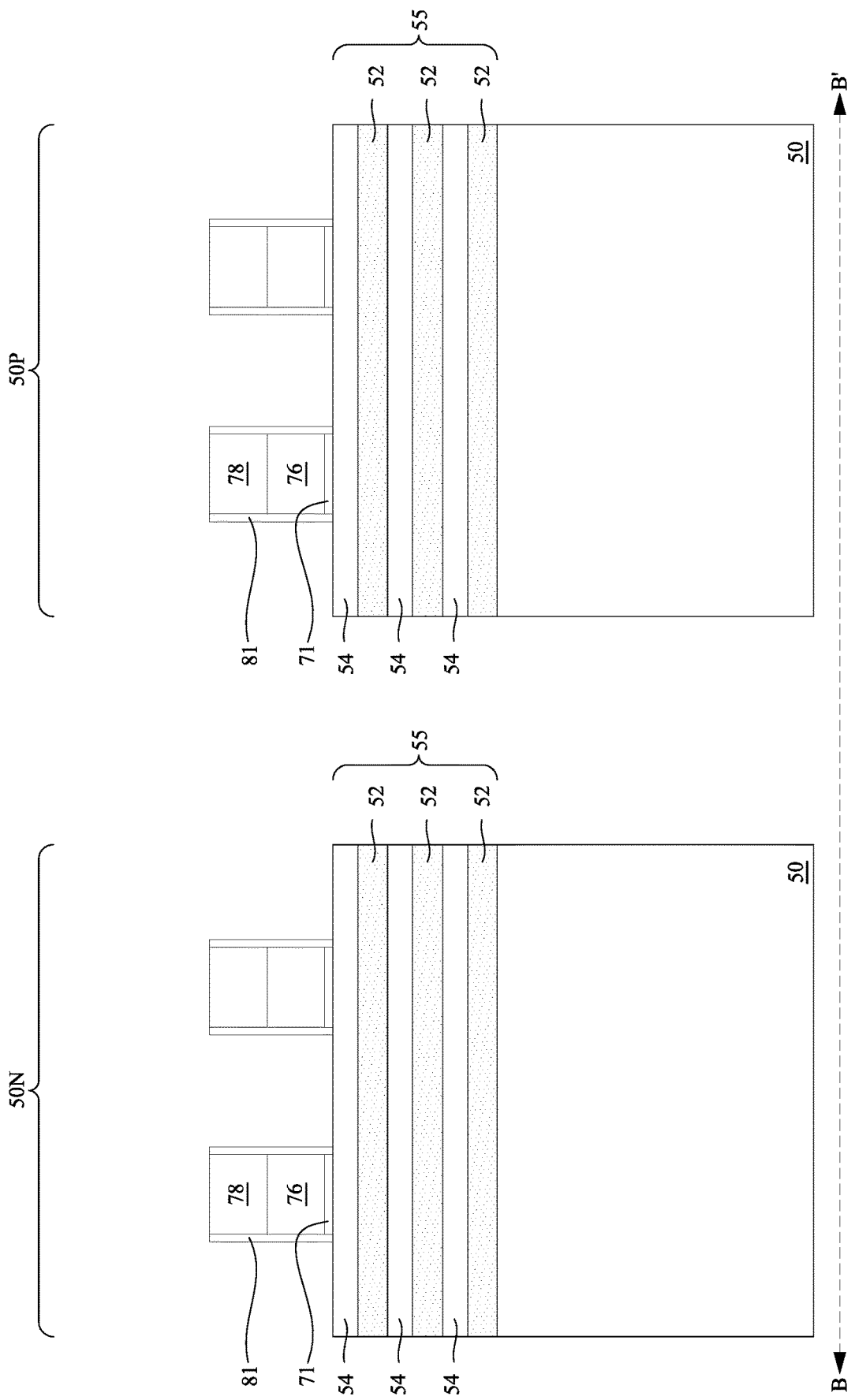

In FIGS. 8A and 8B, the first spacer layer 80 (see FIG. 7A) and the second spacer layer 82 (see FIG. 7A) are etched to form first spacers 81 and second spacers 83. As will be discussed in greater detail below, the first spacers 81 and the second spacers 83 act to self-align subsequently formed source/drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 act as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or the nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the N-type and P-type devices may be formed using different structures and steps.

Figure 9B:
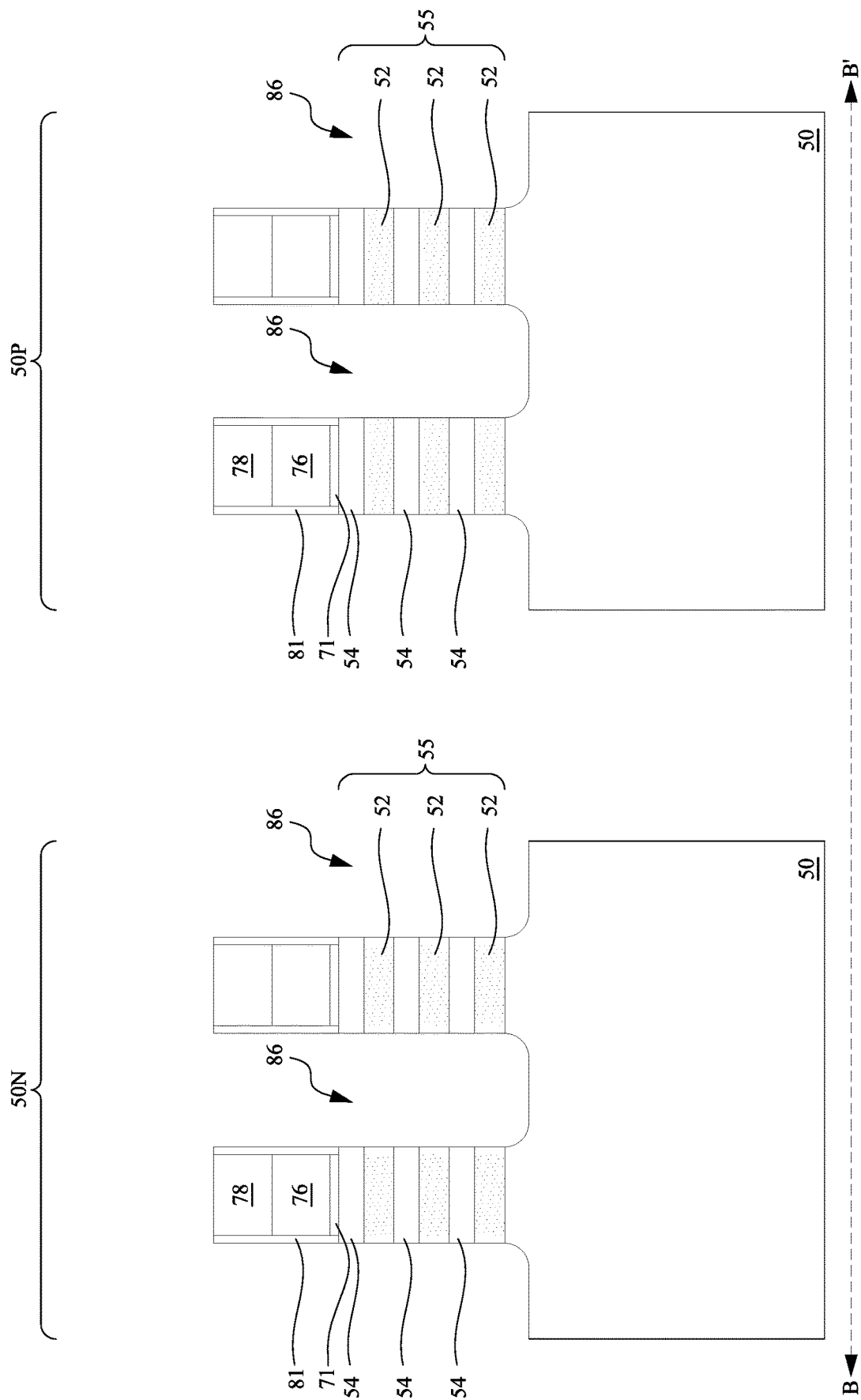

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the Isolation regions 68 may be level with bottom surfaces of the first recesses 86. In various embodiments, the fins 66 may be etched such that bottom surfaces of the first recesses 86 are disposed below the top surfaces of the Isolation regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
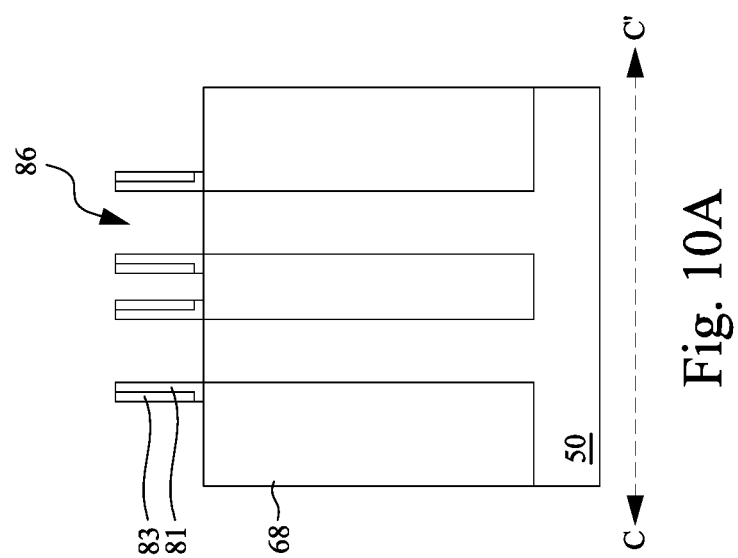
Figure 10B:
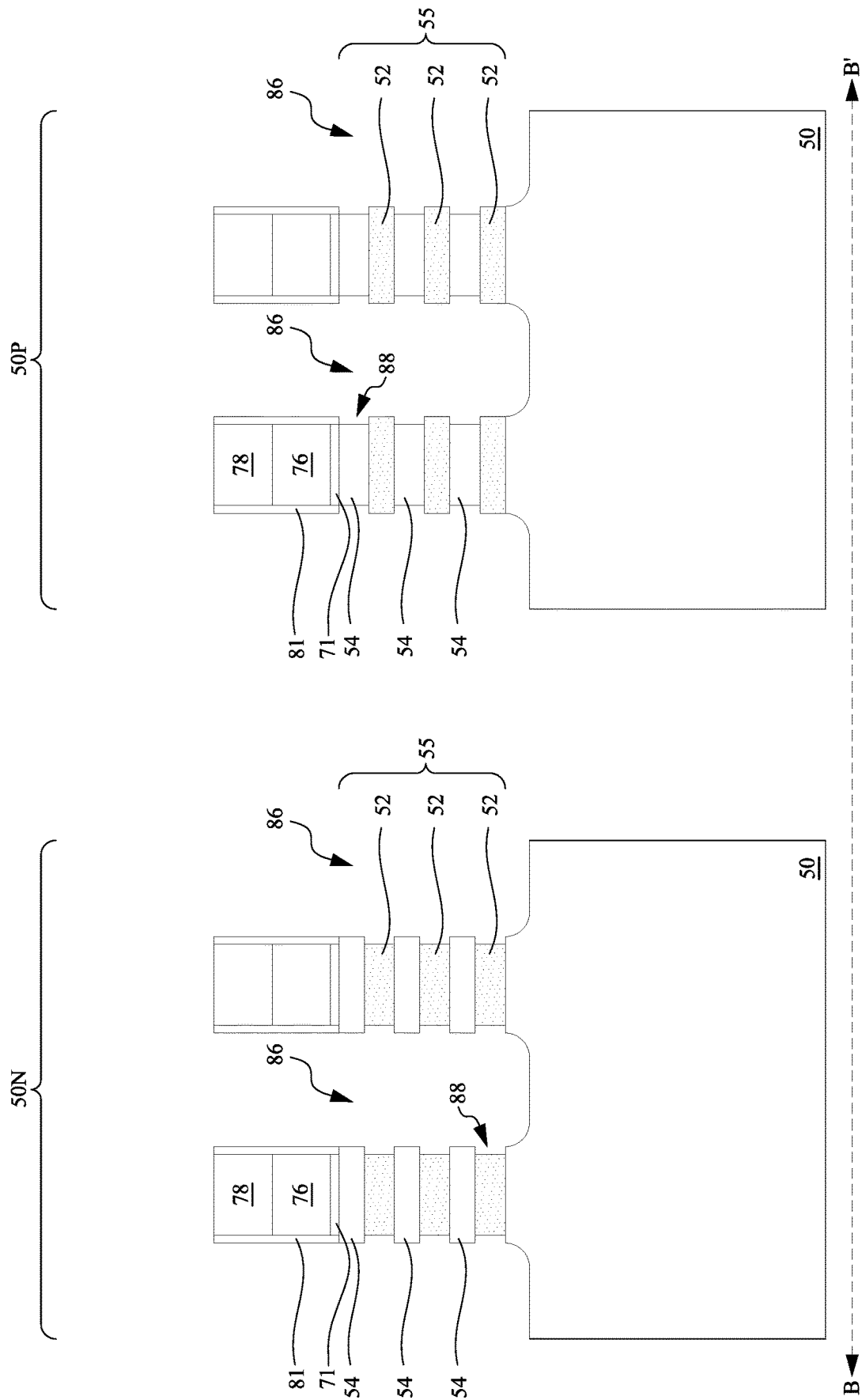

In FIGS. 10A and 10B, portions of sidewalls of the layers of the nanostructures 55 formed of the first semiconductor materials (e.g., the first nanostructures 52) exposed by the first recesses 86 are etched to form sidewall recesses 88 in the N-type region 50N, and portions of sidewalls of the layers of the nanostructures 55 formed of the second semiconductor materials (e.g., the second nanostructures 54) exposed by the first recesses 86 are etched to form sidewall recesses 88 in the P-type region 50P. Although sidewalls of the first nanostructures 52 and the second nanostructures 54 in the recesses 88 are illustrated as being straight in FIG. 10B, the sidewalls may be concave or convex. The sidewalls may be etched using isotropic etching processes, such as wet etching or the like. The P-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the N-type region 50N. Similarly, the N-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the P-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52 in the N-type region 50N, and a dry etch process with hydrogen fluoride, another fluorine-based gas, or the like may be used to etch sidewalls of the second nanostructures 54 in the P-type region 50P.

Figure 11A:
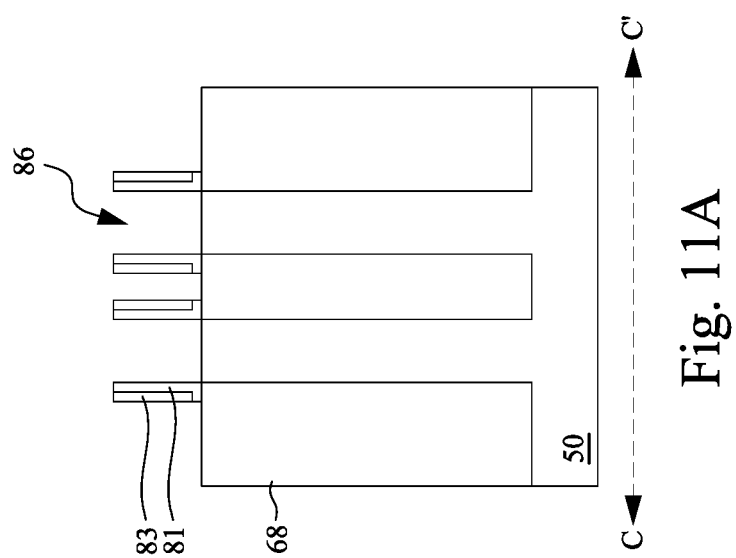
Figure 11B:
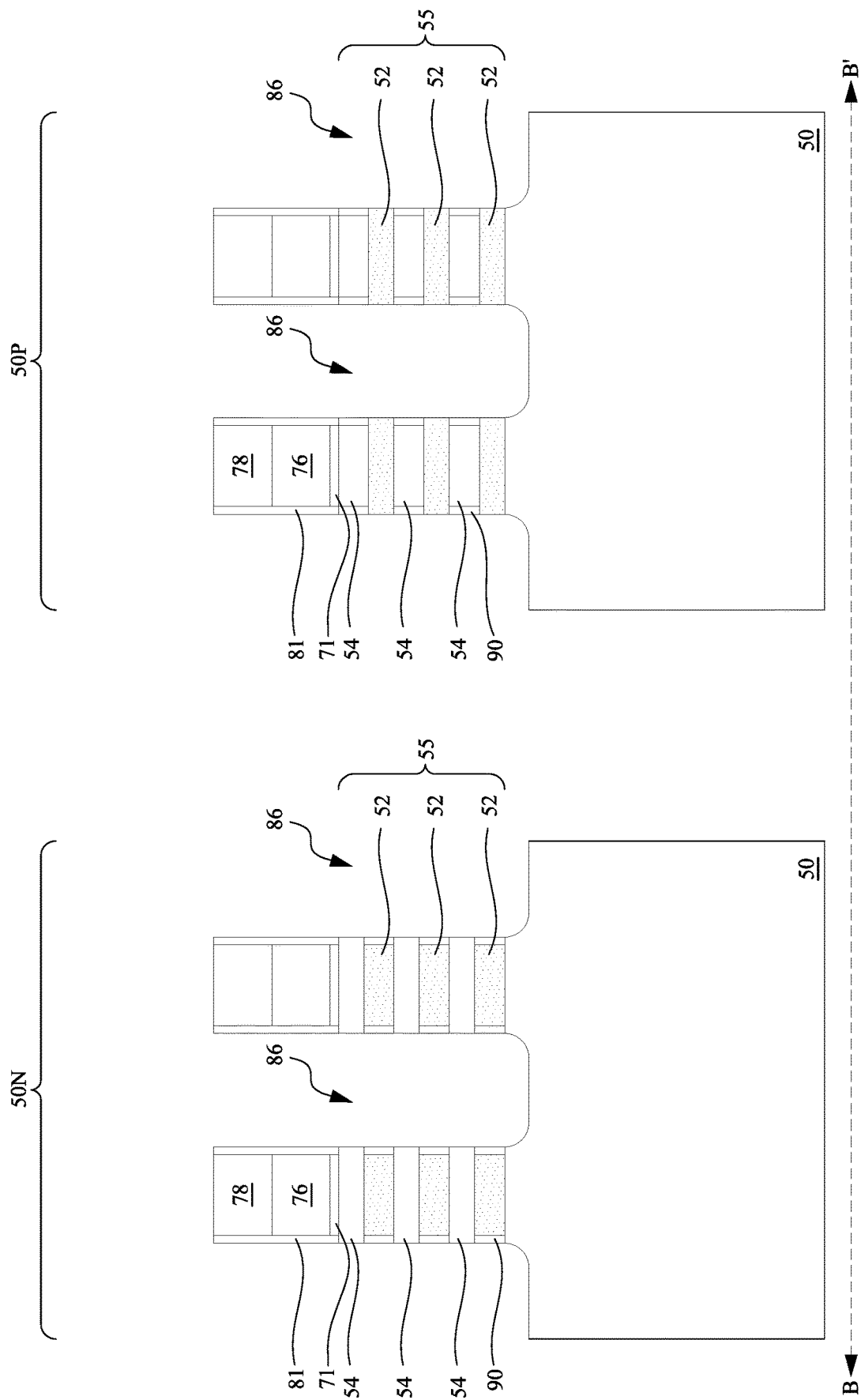
Figure 11C:
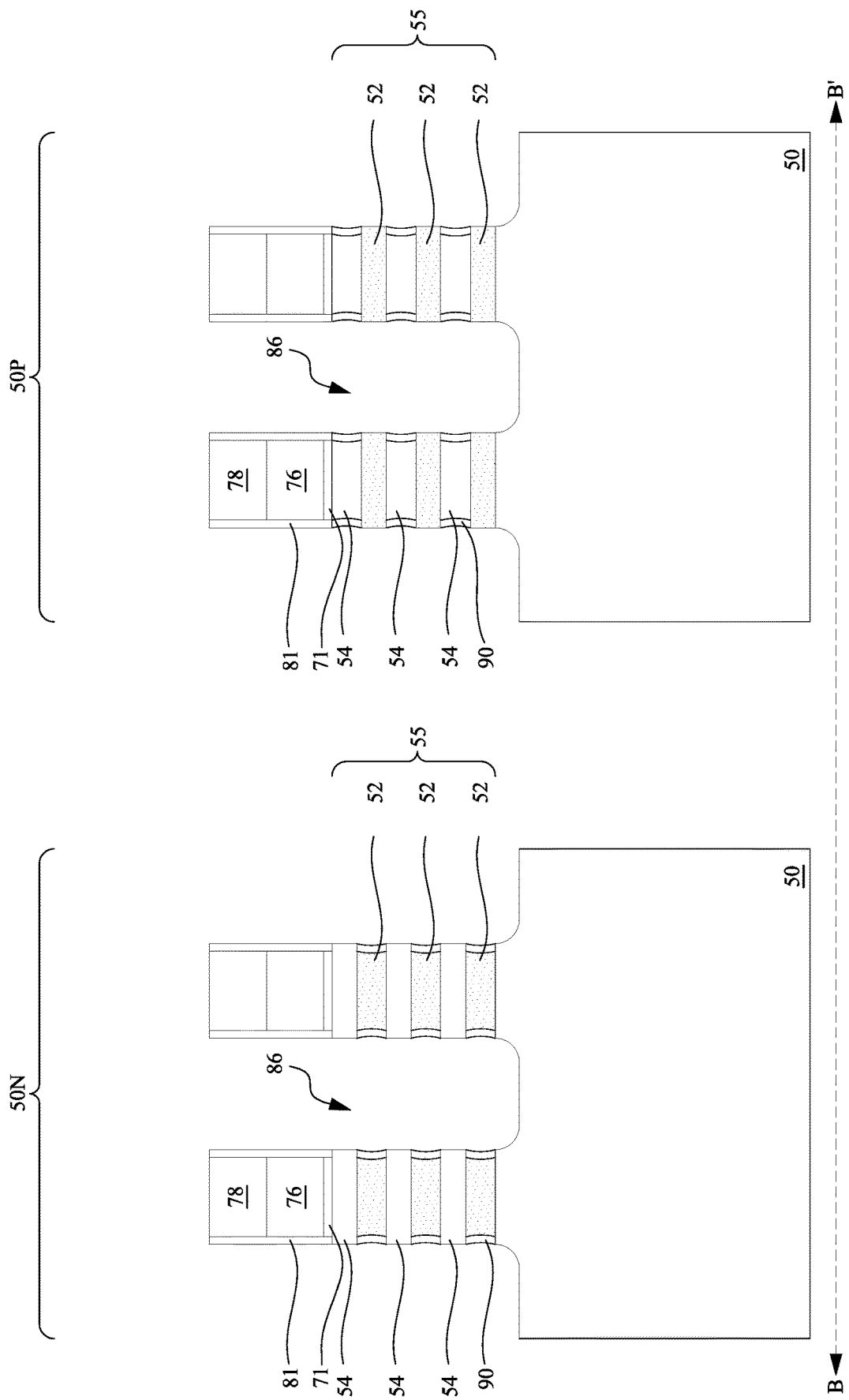

In FIGS. 11A-11C, first inner spacers 90 are formed in the sidewall recesses 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the recesses 86, while the first nanostructures 52 in the N-type region 50N and the second nanostructures 54 in the P-type region 50P will be replaced with corresponding gate structures.

The inner spacer layer may be deposited by a conformal deposition process, such as CVD, ALD, or the like. The inner spacer layer may include a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the N-type region 50N and flush with the sidewalls of the first nanostructures 52 in the P-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers 90 are recessed from sidewalls of the second nanostructures 54 in the N-type region 50N. Also illustrated are embodiments in which sidewalls of the second nanostructures 54 are concave, outer sidewalls of the first inner spacers 90 are concave, and the first inner spacers 90 are recessed from sidewalls of the first nanostructures 52 in the P-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A-12C) by subsequent etching processes, such as etching processes used to form gate structures.

Figure 12B:
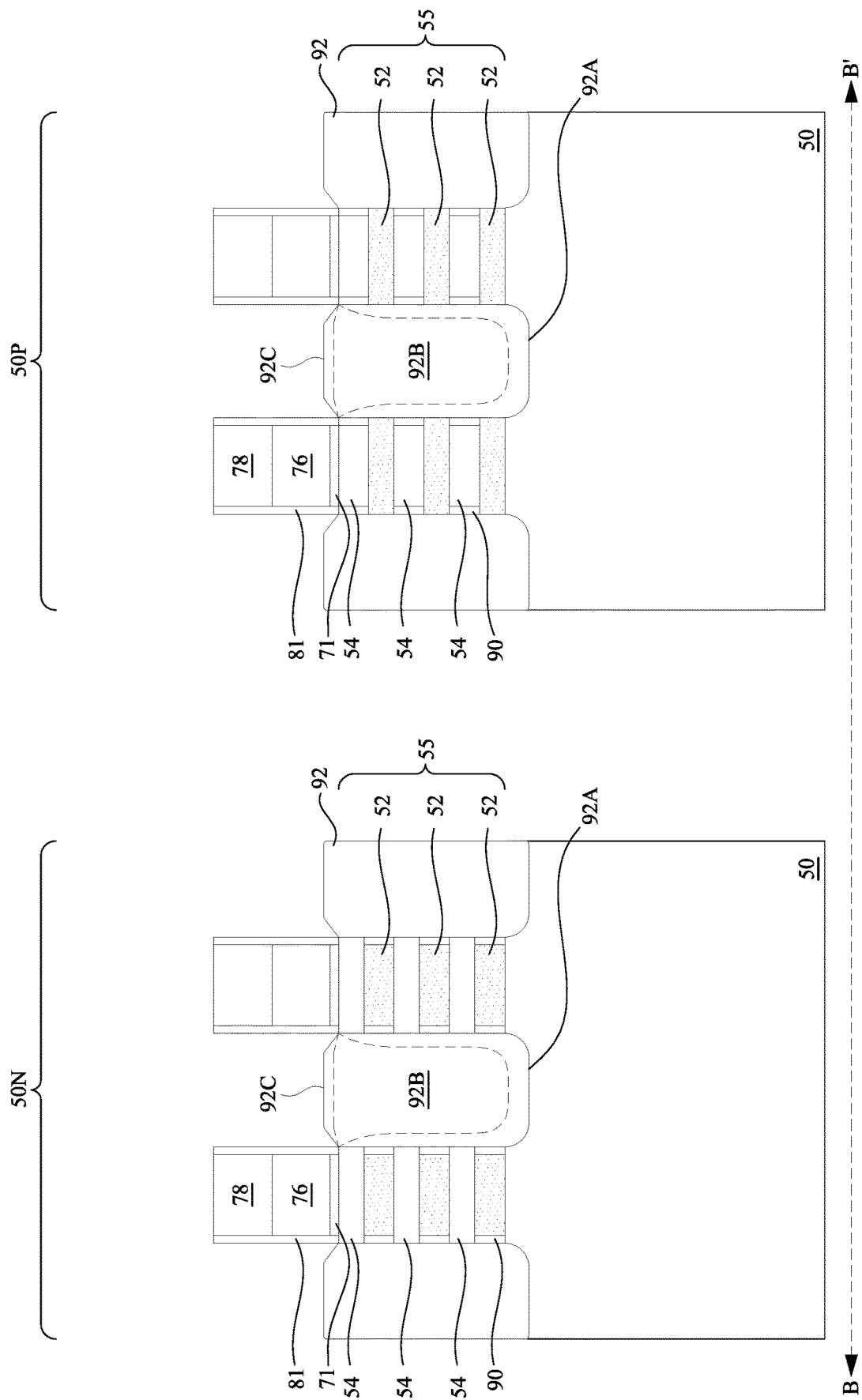

In FIGS. 12A-12C, epitaxial source/drain regions 92 are formed in the first recesses 86 (see FIG. 11B). In some embodiments, the source/drain regions 92 may exert stress on the second nanostructures 54 in the N-type region 50N and on the first nanostructures 52 in the P-type region 50P, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the N-type region 50N, e.g., the NMOS region, may be formed by masking the P-type region 50P, e.g., the PMOS region. Then, the epitaxial source/drain regions 92 are epitaxially grown in the first recesses 86 in the N-type region 50N. The epitaxial source/drain regions 92 may include any acceptable material appropriate for N-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the P-type region 50P, e.g., the PMOS region, may be formed by masking the N-type region 50N, e.g., the NMOS region. Then, the epitaxial source/drain regions 92 are epitaxially grown in the first recesses 86 in the P-type region 50P. The epitaxial source/drain regions 92 may include any acceptable material appropriate for P-type nano-FETs. For example, if the first nanostructures 52 are silicon germanium, the epitaxial source/drain regions 92 may include materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The N-type and/or P-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the N-type region 50N and the P-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same NSFET to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed to a top surface of the Isolation regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may include one or more semiconductor material layers. For example, the epitaxial source/drain regions 92 may include a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 include three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12D:
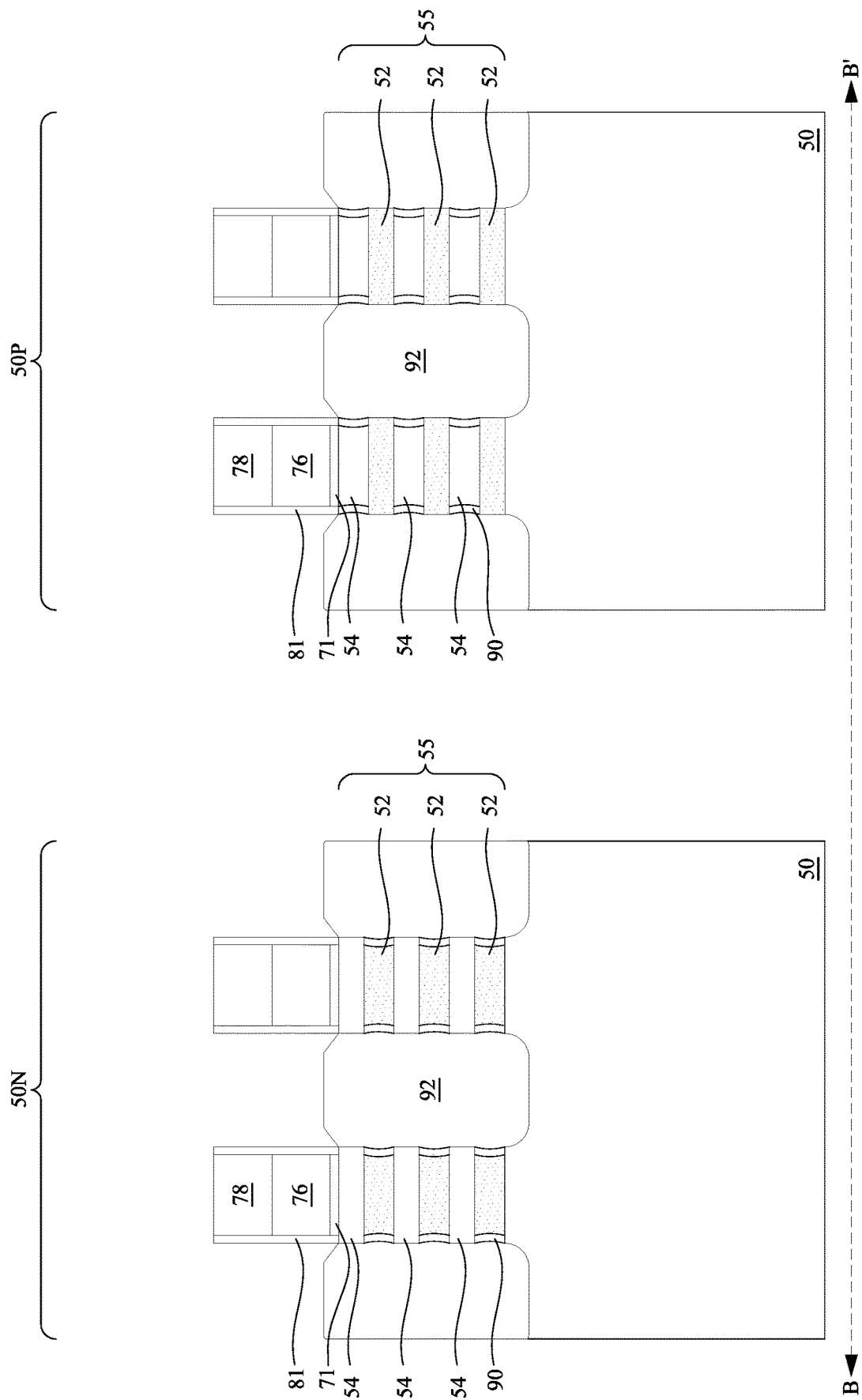

FIG. 12D illustrates an embodiment in which sidewalls of the first nanostructures 52 in the N-type region 50N and sidewalls of the second nanostructures 54 in the P-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 12D, the epitaxial source/drain regions 92 may be formed in contact with the first inner spacers 90 and may extend past sidewalls of the second nano structures 54 in the N-type region 50N and past sidewalls of the first nanostructures 52 in the P-type region 50P.

Figure 13A:
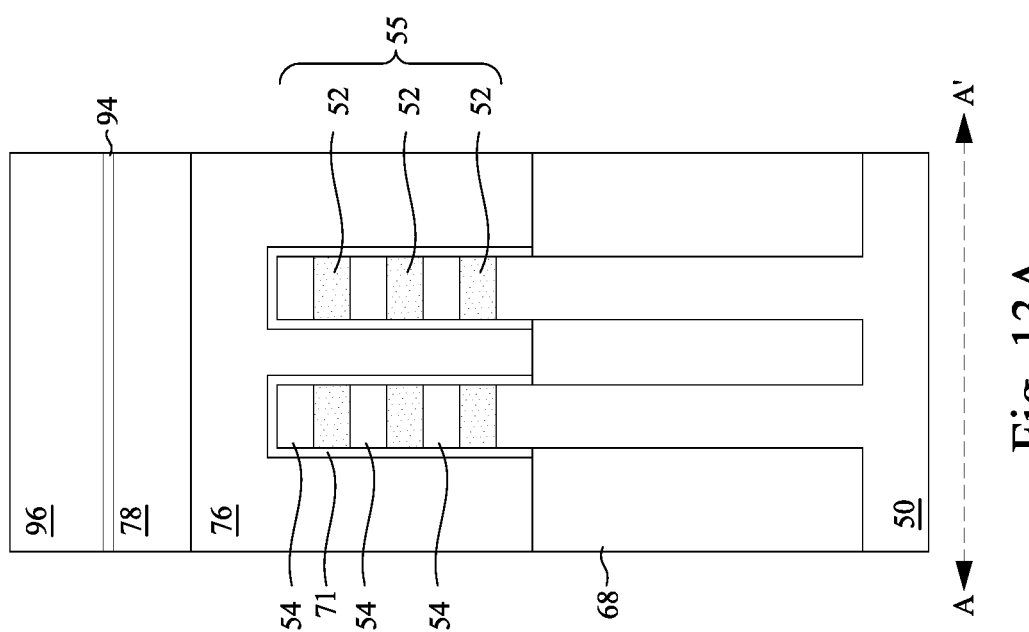
Figure 13B:
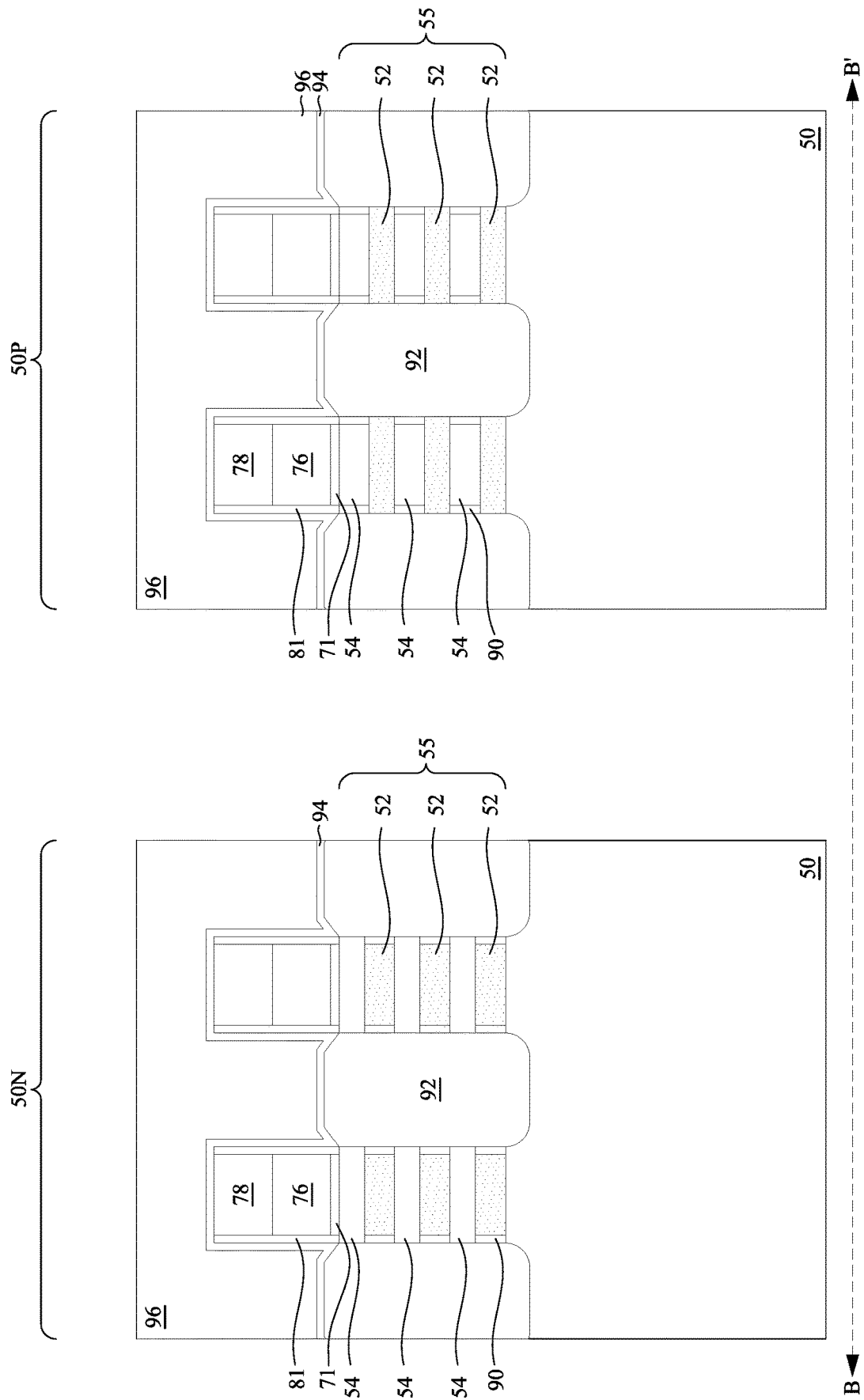
Figure 13C:
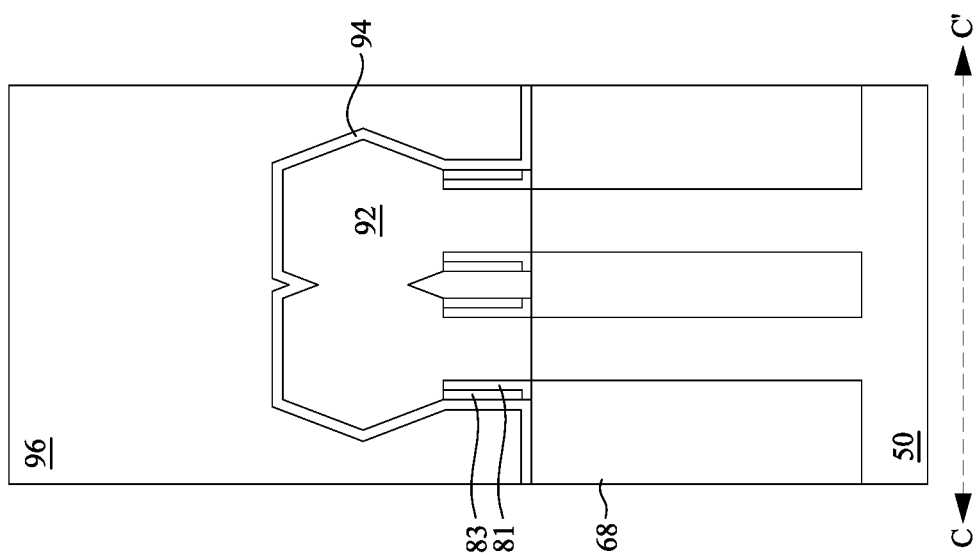

In FIGS. 13A-13C, a first interlayer dielectric (ILD) 96 is deposited over the structure illustrated in FIGS. 6A, 12B, and 12A (the processes of FIGS. 7A-12D do not alter the cross-section illustrated in FIG. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may include a dielectric material, such as silicon nitride, silicon oxide, silicon oxynitride, or the like, having a different etch rate than the material of the overlying first ILD 96.

Figure 14A:
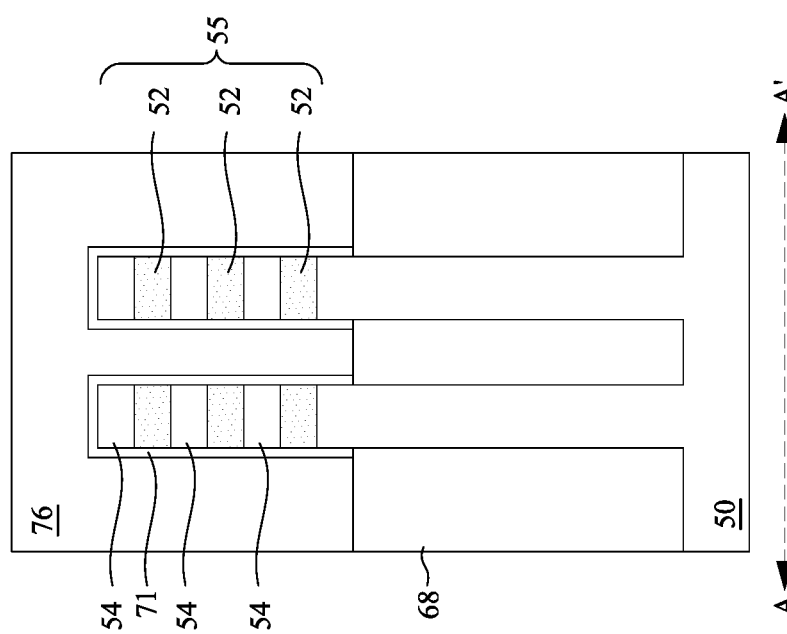
Figure 14B:
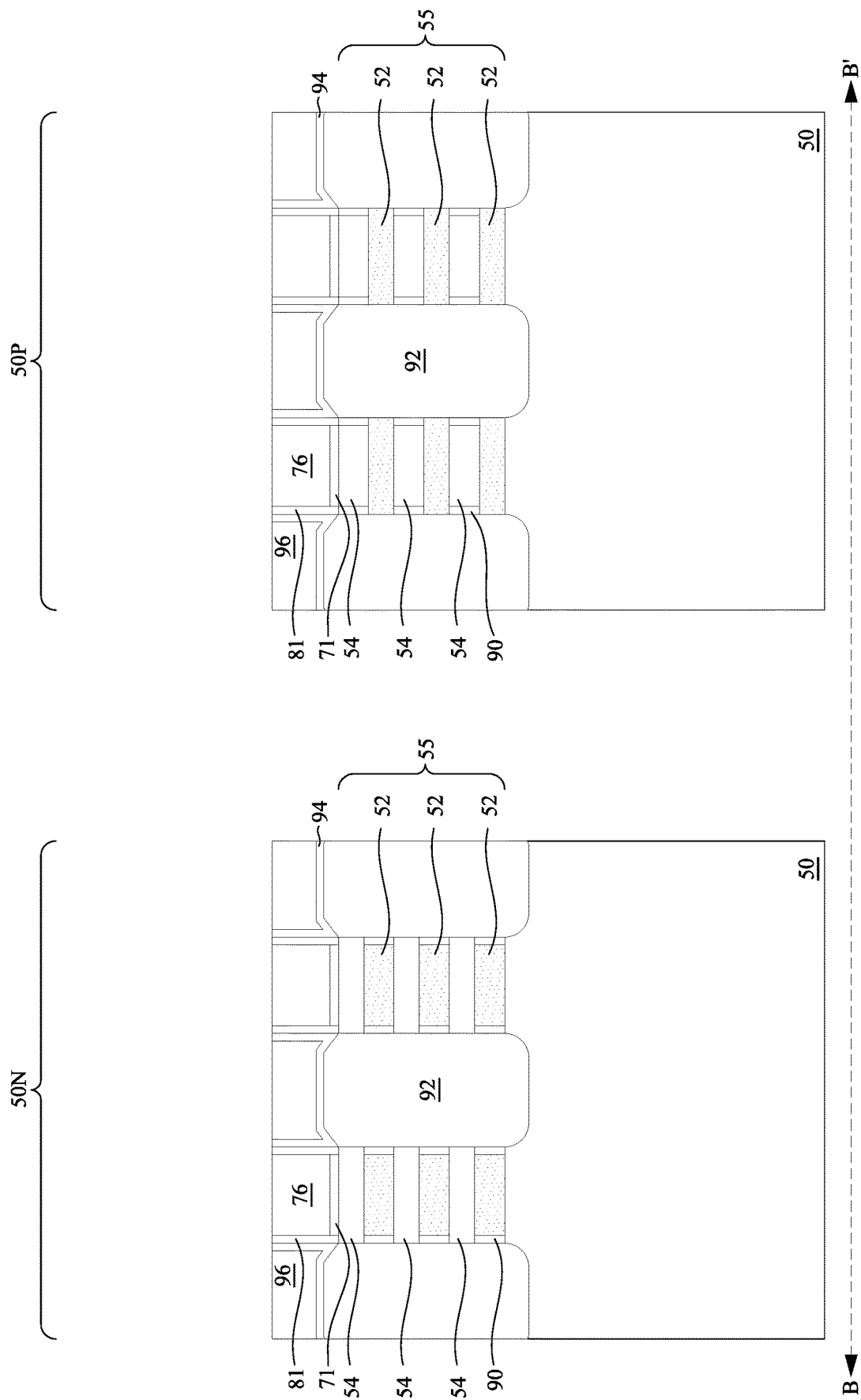

In FIGS. 14A-14B, a planarization process, such as a CMP, may be performed to level the top surface of the first ILD 96 with the top surfaces of the dummy gates 76 or the masks 78 (see FIG. 13B). The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with the top surface of the masks 78 and the first spacers 81.

Figure 15A:
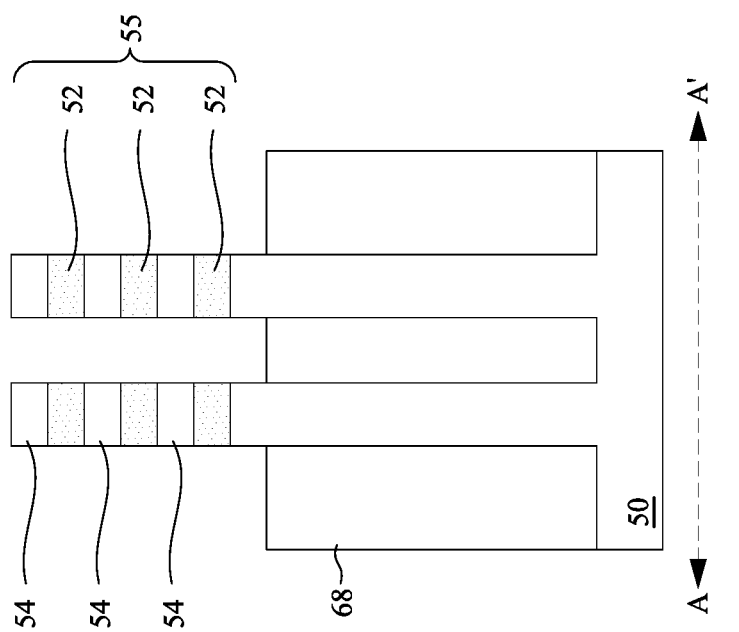
Figure 15B:
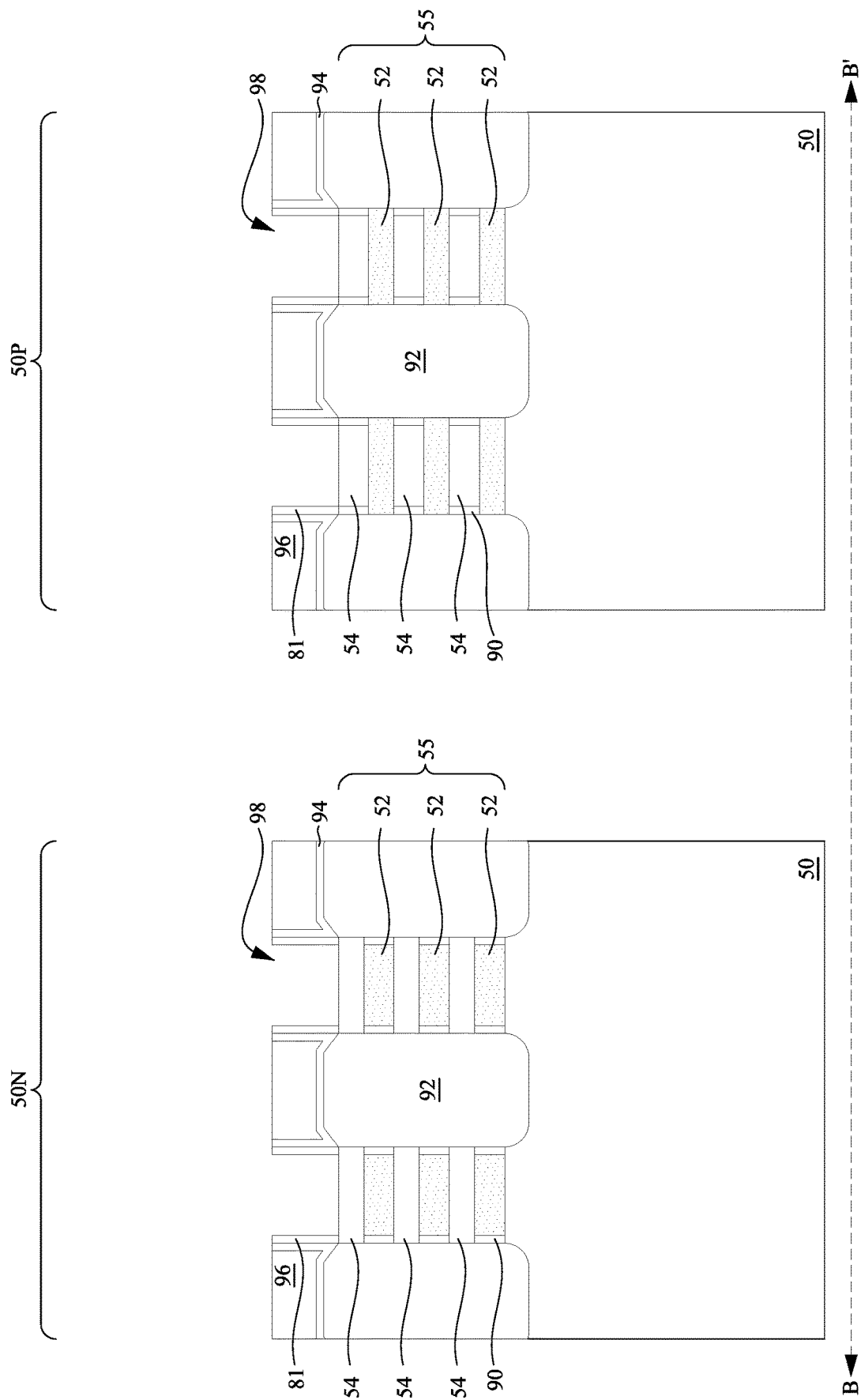

In FIGS. 15A and 15B, the dummy gates 76 (see FIG. 14B), and the masks 78 if present, are removed in one or more etching steps, so that second recesses 98 are formed. Portions of the dummy gate dielectrics 71 (see FIG. 14B) in the second recesses 98 are also removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of the nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

In FIGS. 16A through 21B, nanostructures are defined in the P-type region 50P and the N-type region 50N, and gate dielectrics and gate electrodes are formed for replacement gates according to some embodiments. The formation of the gate dielectrics in the N-type region 50N and the P-type region 50P may occur simultaneously such that the gate dielectrics in each region are formed from the same materials, and the formation of the gate electrodes may occur simultaneously such that the gate electrodes in each region are formed from the same materials. In some embodiments, the gate dielectrics in each region may be formed by distinct processes, such that the gate dielectrics may be different materials and/or have a different number of layers, and/or the gate electrodes in each region may be formed by distinct processes, such that the gate electrodes may be different materials and/or have a different number of layers. Various masking steps may be used to mask and expose appropriate regions when using distinct processes. In the following description, the gate electrodes of the N-type region 50N and the gate electrodes of the P-type region 50P are formed separately.

In FIGS. 16A and 16B, the second nanostructures 54 in the P-type region 50P may be removed by forming a mask (not shown) over the N-type region 50N and performing an isotropic etching process such as wet etching or the like using etchants which are selective to the materials of the second nanostructures 54 (see FIG. 15A), while the first nanostructures 52, the substrate 50, and the Isolation regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based gas, or the like may be used to remove the second nanostructures 54 in the P-type region 50P.

As illustrated in FIG. 16A, the first nanostructures 52 may have a height H1 and a width W1, and a ratio of the height H1 to the width W1 may be in a range of about 0.05 to about 4. In some embodiments, the ratio is sufficient to avoid affecting $I_{on}$ of the device while still being controllable during the deposition process. For example, it has been observed that when the ratio of the height H1 to the width W1 is greater than 4, the channel region of the nano-FET may be too thick and negatively affect $I_{on}$ of the resulting device. It has been observed when the ratio of the height H1 to the width W1 is greater than 4, the channel region may be too thin to be controlled during deposition due to a physical limitation of the film deposition process.

Figure 19:
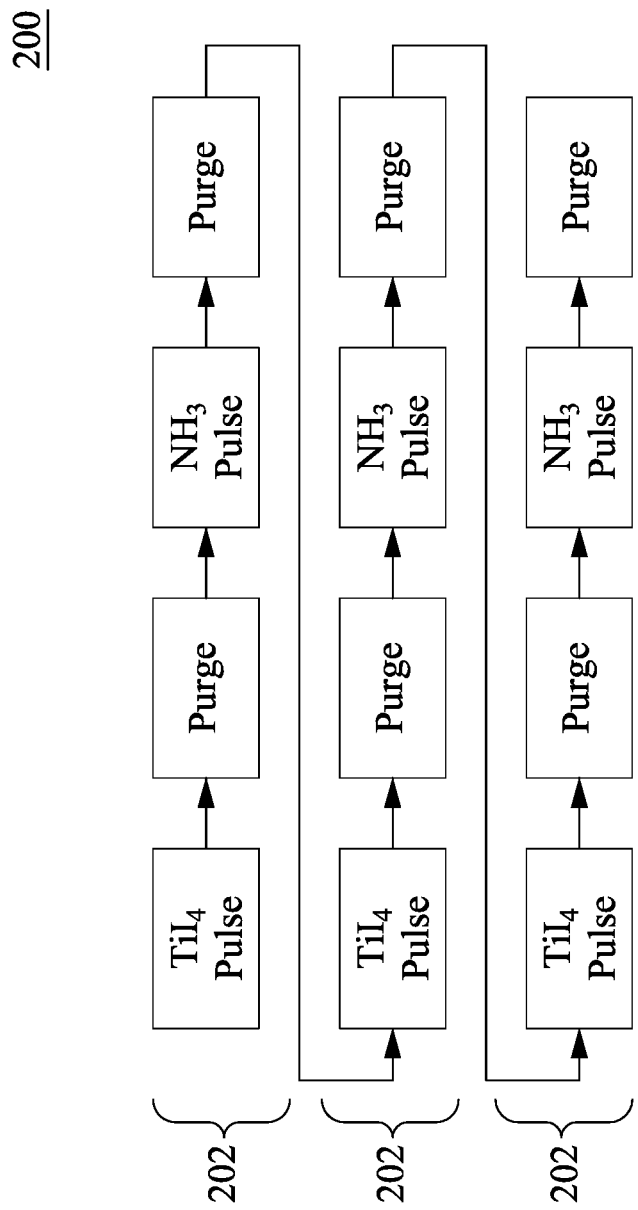
FIG. 19 is a process flow of an ALD process of forming the work function metal layer, in accordance with some embodiments.

FIGS. 17A through 19 illustrate forming the gate dielectrics 100 and the gate electrodes 102 in the P-type region 50P, and the N-type region 50N may be masked at least while forming the gate electrodes 102 in the P-type region 50P (e.g., as described below in FIGS. 18A through 19).

In FIGS. 17A and 17B, gate dielectrics 100 are deposited conformally in the second recesses 98 in the P-type region 50P. The gate dielectrics 100 include one or more dielectric layers, such as an oxide, a metal oxide, the like, or combinations thereof. For example, in some embodiments, the gate dielectrics 100 may include a first gate dielectric 101 (e.g., including silicon oxide, or the like) and a second gate dielectric 103 (e.g., including a metal oxide, or the like) over the first gate dielectric 101. In some embodiments, the second gate dielectric 103 includes a high-k dielectric material, and in these embodiments, the second gate dielectric 103 may have a k value greater than about 7.0, and may include a metal oxide or a silicate of hafnium, aluminum, zirconium, lanthanum, manganese, barium, titanium, lead, and combinations thereof. The first gate dielectric 101 may be referred to as an interfacial layer, and the second gate dielectric 103 may be referred to as a high-k gate dielectric in some embodiments.

The structure of the gate dielectrics 100 may be the same or different in the N-type region 50N and the P-type region 50P. For example, the N-type region 50N may be masked or exposed while forming the gate dielectrics 100 in the P-type region 50P. In embodiments where the N-type region 50N is exposed, the gate dielectrics 100 may be simultaneously formed in the N-type regions 50N. The formation methods of the gate dielectrics 100 may include molecular-beam deposition (MBD), ALD, PECVD, and the like.

In FIGS. 18A and 18B, a work function metal (WFM) layer 105 is deposited conformally on the gate dielectrics 100 in the P-type region 50P. In some embodiments, the work function metal layer 105 may be deposited on exposed surfaces of the gate dielectrics 100 to a sufficient thickness such that the work function metal layer 105 merges in regions 501 between adjacent first nanostructures 52. For example, the work function metal layer 105 may be deposited on surfaces of the first nanostructures 52 in the regions 501, and as the work function metal layer 105 increases in thickness during the deposition, separated portions of the work function metal layer 105 may touch and merge along seams 105S. Specifically, deposition of the work function metal layer 105 may continue until a first portion 105A of the work function metal layer 105 merges with a second portion 105B of the work function metal layer 105 in the regions 501. That is, the work function metal layer 105 may extend continuously and completely fill an area between portions of the gate dielectrics 100 on adjacent ones of the first nanostructures 52.

In some embodiments, the work function metal layer 105 is a P-type WFM layer. In some embodiments, the work function metal layer 105 includes titanium nitride and is formed by suitable deposition processes, such as ALD. FIG. 19 illustrates a process flow of an ALD process 200 when the work function metal layer 105 includes titanium nitride. The ALD process 200 may include deposition loops 202, all of which are performed in a single process (e.g., in-situ within a same process chamber and without breaking vacuum). Each of the deposition loops 202 may deposit at a rate in a range of about 0.2 Å/loop to about 8 Å/loop.

Each deposition loop 202 of the ALD process 200 includes depositing one or more monolayers of a titanium nitride. Each deposition loop 202 includes pulsing a titanium-including precursor into the ALD chamber, purging the ALD chamber, pulsing a nitrogen-including precursor into the ALD chamber, and purging the ALD chamber. The titanium-including precursor reacts with the nitrogen-including precursor to deposit a monolayer of titanium nitride on exposed surfaces of the gate dielectrics 100. Each deposition loop 202 deposits a single monolayer of titanium nitride, and any number of deposition loops 202 may be performed to deposit a desired quantity of titanium nitride monolayers.

In some embodiments, the titanium-including precursor includes titanium tetraiodide ($TiI_4$) or the like, and the nitrogen-including precursor includes ammonia ($NH_3$) or the like. Using $TiI_4$ or the like as the titanium-including precursor can induce more oxygen content into the work function metal layer 105.

Additionally, using $TiI_4$ or the like as the titanium-including precursor can reduce the deposition temperature of the work function metal layer 105. The dissociation energy of $TiI_4$ is small, and thus the deposition temperature of the work function metal layer 105 can be reduced when the work function metal layer 105 is deposited using $TiI_4$ or the like as the titanium-including precursor. In some embodiments, the deposition temperature of the work function metal layer 105 is lower than about 550° C. when the work function metal layer 105 is deposited using $TiI_4$ or the like as the titanium-including precursor. In some embodiments, the deposition temperature of the work function metal layer 105 is in a range from about 200° C. to about 500° C. when the work function metal layer 105 is deposited using $TiI_4$ or the like as the titanium-including precursor. In some embodiments, the deposition temperature of the work function metal layer 105 is in a range from about 200° C. to about 350° C. when the work function metal layer 105 is deposited using $TiI_4$ or the like as the titanium-including precursor. In some embodiments, the work function metal layer 105 is deposited at a deposition pressure in a range from about 0.5 to about 40 torr when the work function metal layer 105 is deposited using $TiI_4$ or the like as the titanium-including precursor.

In some embodiments, in each of the deposition loop 202 of the ALD process 200, the deposition temperature of pulsing the $TiI_4$ or the like precursor in a range from about 150° C. to about 475° C. In some embodiments, in each of the deposition loop 202 of the ALD process 200, the deposition pressure of pulsing the $TiI_4$ or the like precursor in a range from about 0.5 torr to about 35 torr. In some embodiments, in each of the deposition loop 202 of the ALD process 200, the gases utilized in the step of pulsing the $TiI_4$ or the like precursor include $TiI_4$ and Ar, and the gas flow thereof is in a range from about 500 sccm to about 4000 sccm. In some embodiments, in each of the deposition loop 202 of the ALD process 200, the deposition time of pulsing the $TiI_4$ or the like precursor in a range from about 0.1 sec to about 10 sec. If the process parameters are above these ranges, might cause chamber particles; If the process parameters are below these ranges, might lead to discontinuous film.

In some embodiments, in each of the deposition loop 202 of the ALD process 200, the deposition temperature of pulsing the $NH_3$ or the like precursor in a range from about 150° C. to about 475° C. In some embodiments, in each of the deposition loop 202 of the ALD process 200, the deposition pressure of pulsing the $NH_3$ or the like precursor in a range from about 0.5 torr to about 35 torr. In some embodiments, in each of the deposition loop 202 of the ALD process 200, the gases utilized in the step of pulsing the $NH_3$ or the like precursor include $NH_3$ and Ar, and the gas flow of thereof is in a range from about 500 sccm to about 4000 sccm. In some embodiments, in each of the deposition loop 202 of the ALD process 200, the deposition time of pulsing the $NH_3$ or the like precursor in a range from about 0.1 sec to about 10 sec. If the process parameters are above these ranges, might cause chamber particles; If the process parameters are below these ranges, might lead to discontinuous film.

Figure 20:
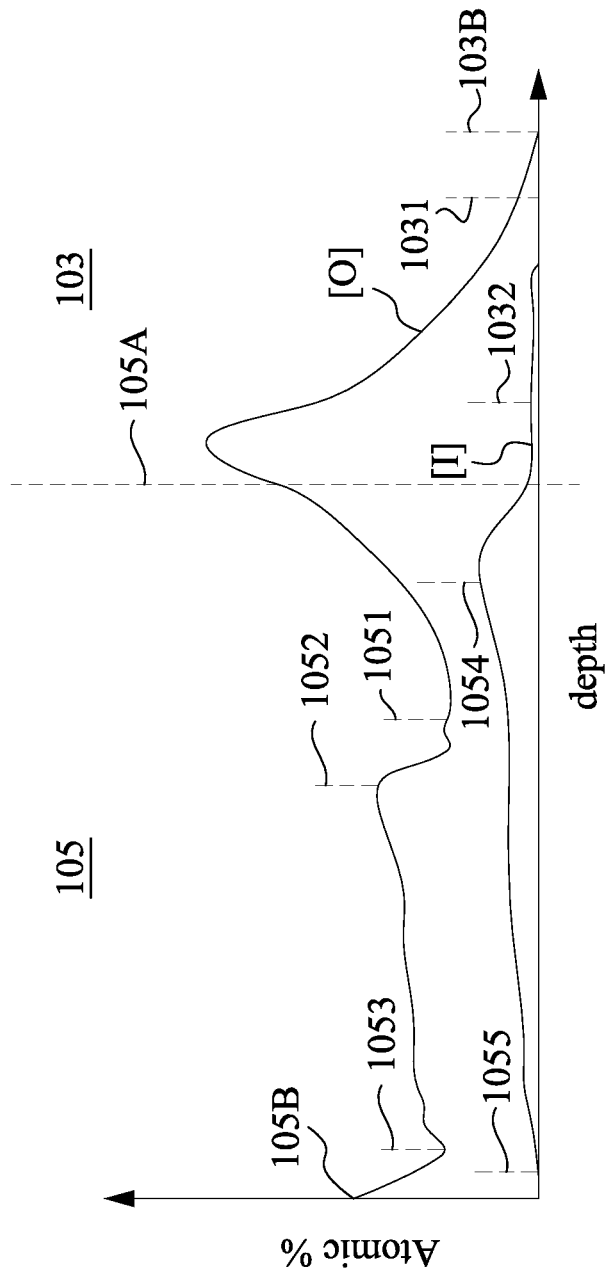
FIG. 20 shows iodine and oxygen concentrations of a nano-FET, in accordance with some embodiments.

As a result, as illustrated in FIG. 20, the work function metal layer 105 formed by using $TiI_4$ or the like as the titanium-including precursor has an oxygen concentration greater than about 10 at % throughout the work function metal layer 105. In some embodiments, the oxygen concentration of the work function metal layer 105 is in a range from about 10 at % to about 30 at % throughout the work function metal layer 105 and has a highest concentration at an interface 105A between the work function metal layer 105 and the second gate dielectric 103. The work function metal layer 105 has first, second, and third portions 1051, 1052, and 1053 arranged along a direction from the interface 105A between the work function metal layer 105 and the second gate dielectric 103 to an outer surface 105B of the work function metal layer 105 that faces away from the second gate dielectric 103. The oxygen concentration of the work function metal layer 105 decreases from the interface 105A between the work function metal layer 105 and the second gate dielectric 103 to the first portion 1051 of the work function metal layer 105. The oxygen concentration of the work function metal layer 105 increases from the first portion 1051 of the work function metal layer 105 to the second portion 1052 of the work function metal layer 105. The oxygen concentration of the work function metal layer 105 decreases from the second portion 1052 of the work function metal layer 105 to the third portion 1053 of the work function metal layer 105. The oxygen concentration of the work function metal layer 105 increases from the third portion 1053 of the work function metal layer 105 to the outer surface 105B of the work function metal layer 105. By introducing more oxygen into the work function metal layer 105, a work function of the gate electrode can be more precisely tuned.

Also, iodine is present in the work function metal layer 105, and the work function metal layer 105 has an iodine concentration in a range from about 0.5 at % to about 5 at % throughout the work function metal layer 105. The work function metal layer 105 has fourth and fifth portions 1054, 1055 arranged along a direction from the interface 105A between the work function metal layer 105 and the second gate dielectric 103 to the outer surface 105B of the work function metal layer 105 that faces away from the second gate dielectric 103. The iodine concentration of the work function metal layer 105 increases from the interface 105A between the work function metal layer 105 and the second gate dielectric 103 to the fourth portion 1054 of the work function metal layer 105. The iodine concentration of the work function metal layer 105 decreases from the fourth portion 1054 of the work function metal layer 105 to the fifth portion 1055 of the work function metal layer 105. In some embodiments, the fifth portion 1055 of the work function metal layer 105 is immediately adjacent to the outer surface 105B of the work function metal layer 105 and is free of iodine. The fourth portion 1054 of the work function metal layer 105 is closer to the second gate dielectric 103 than the fifth portion 1055 of the work function metal layer 105 is to the second gate dielectric 103, and an iodine concentration of the fourth portion 1054 of the work function metal layer 105 is higher than an iodine concentration of the fifth portion 1055 of the work function metal layer 105.

In some embodiments, depositing the work function metal layer 105 is performed such that iodine diffuses into the second gate dielectric 103. In some embodiments, the second gate dielectric 103 has an iodine concentration in a range from about 0.05 at % to about 10 at % and has the highest concentration at the interface 105A between the work function metal layer 105 and the second gate dielectric 103. The iodine concentration of the second gate dielectric 103 decreases from the interface 105A between the work function metal layer 105 and the second gate dielectric 103 to an inner portion 1031 of the second gate dielectric 103. In some embodiments, the inner portion 1031 of the second gate dielectric 103 is immediately adjacent to an inner surface 103B of the second gate dielectric 103 and is free of iodine. The inner surface 103B of the second gate dielectric 103 faces away from the work function metal layer 105. An outer portion 1032 of the second gate dielectric 103 is closer to the work function metal layer 105 than the inner portion 1031 of the second gate dielectric 103 is to the work function metal layer 105, and an iodine concentration of the outer portion 1032 of the second gate dielectric 103 is higher than an iodine concentration of the inner portion 1031 of the second gate dielectric 103.

Figure 21B:
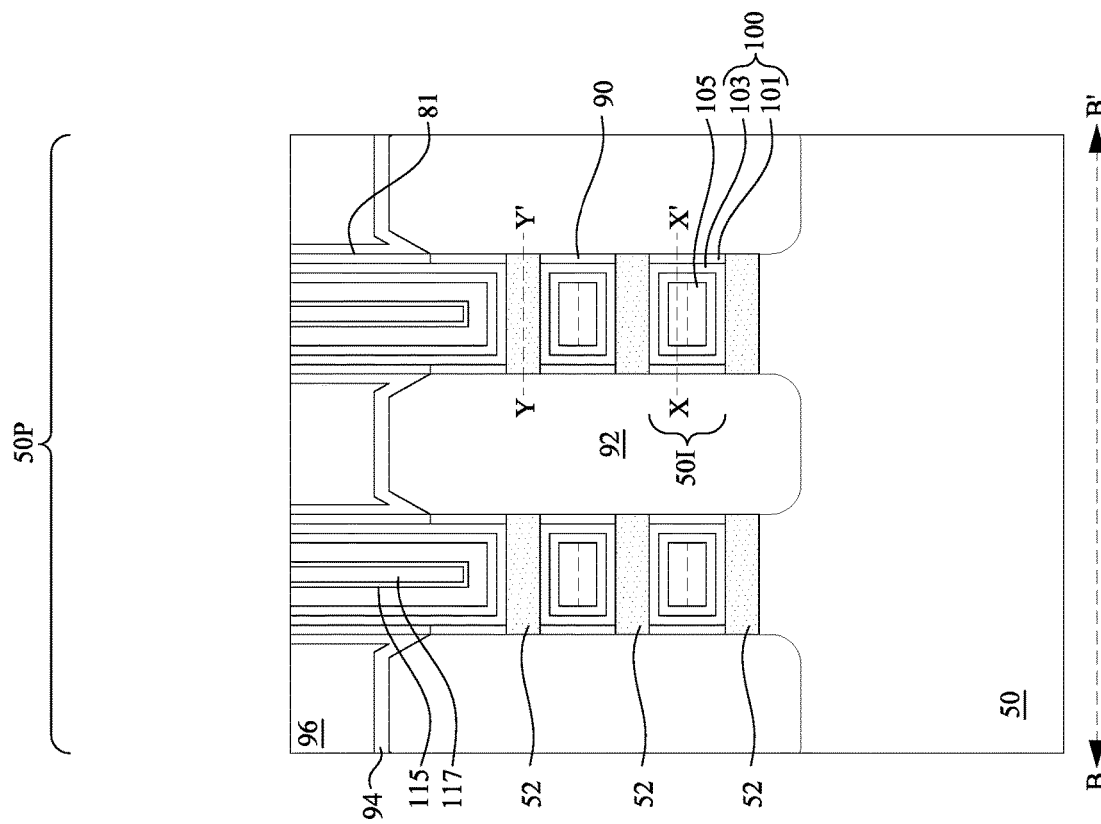
Figure 21A:
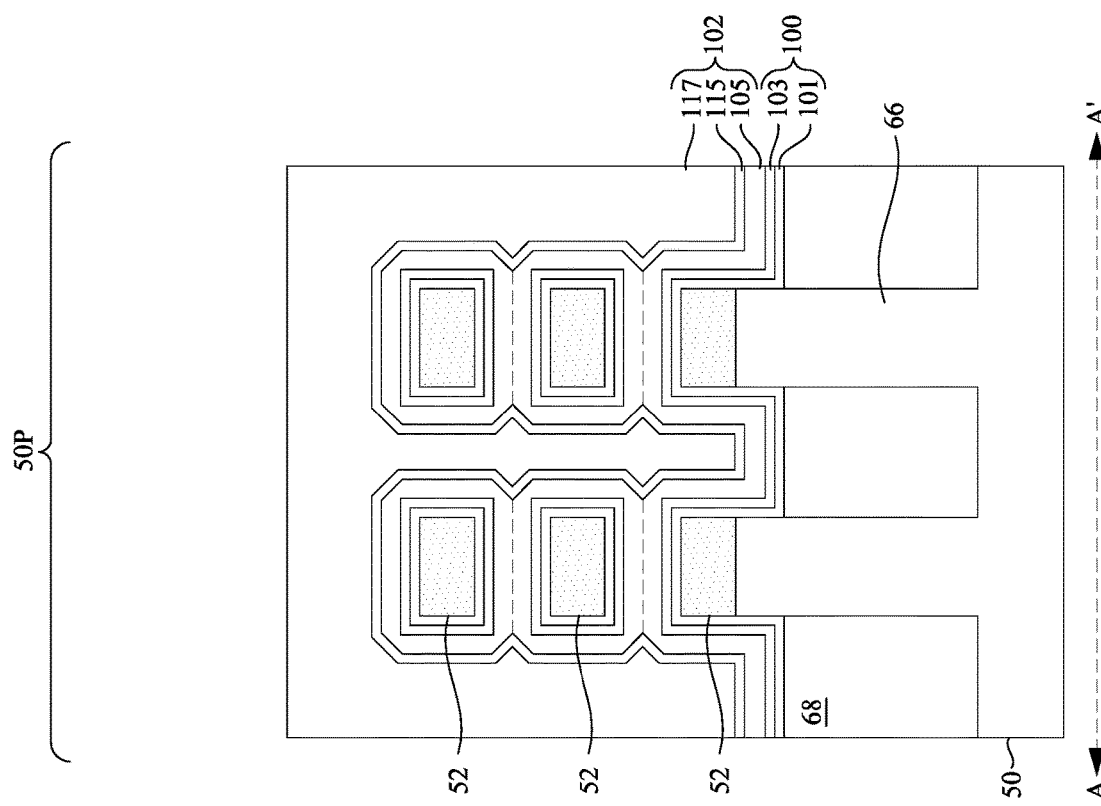
Figure 21D:
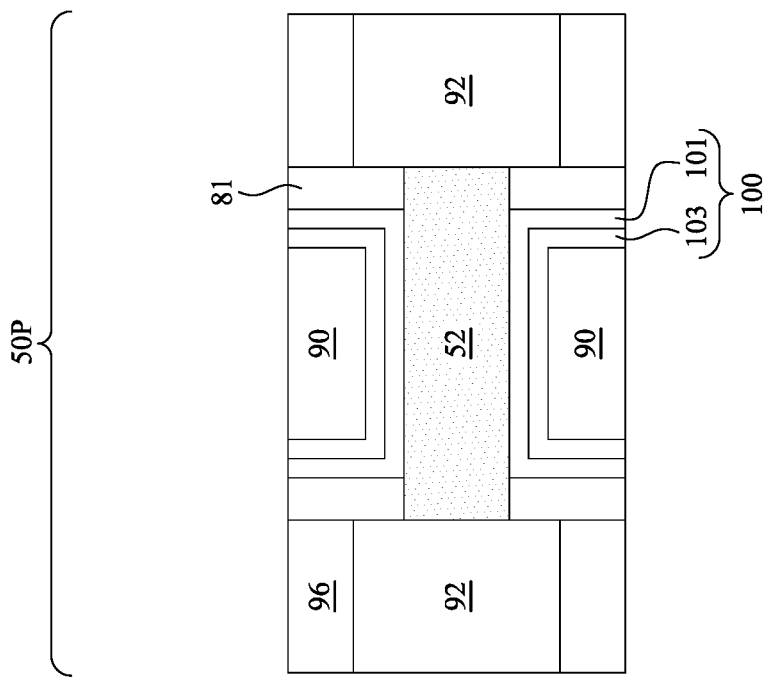
Figure 21C:
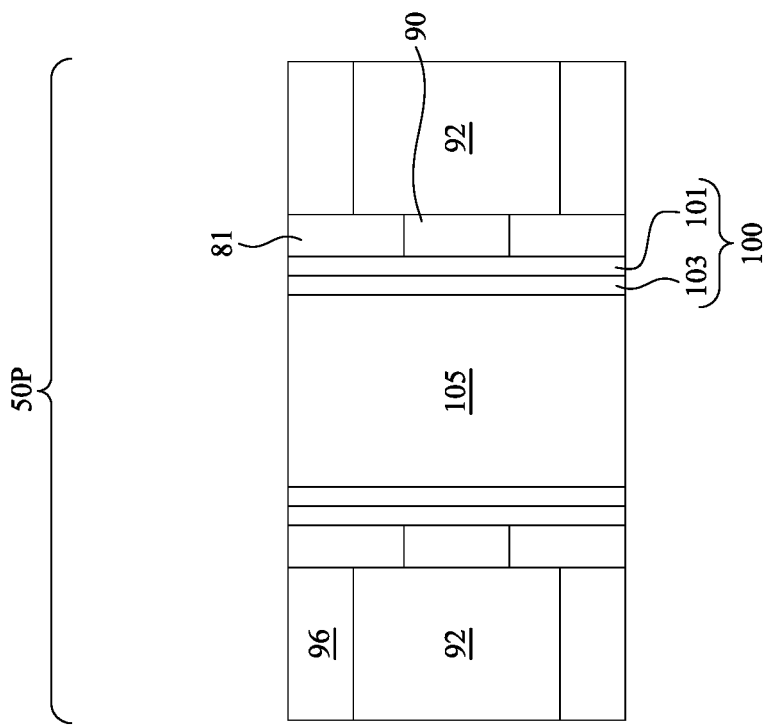

In FIGS. 21A, 21B, 21C, and 21D, remaining portions of the gate electrodes 102 are deposited to fill the remaining portions of the second recesses 98 (see FIG. 18B). For example, an adhesion layer 115 and a fill metal 117 may be deposited over the work function metal layer 105. The resulting gate electrodes 102 are formed for replacement gates and may include the work function metal layer 105, the adhesion layer 115, and the fill metal 117. FIG. 21C illustrates a top down view along line X-X' of FIG. 21B (e.g., in the regions 501) while FIG. 21D illustrates a top down view along line Y-Y' of FIG. 21B (e.g., through the first nanostructures 52).

In some embodiments, the adhesion layer 115 is deposited conformally on the work function metal layer 105 in the P-type region 50P. In some embodiments, the adhesion layer 115 includes titanium nitride, tantalum nitride, or the like. The adhesion layer 115 may be deposited by CVD, ALD, PECVD, PVD, or the like. The adhesion layer 115 may alternately be referred to as a glue layer and improves adhesion between the work function metal layer 105 and the overlying fill metal 117, for example.

In some embodiments, the adhesion layer 115 is a titanium-including layer such as TiN. The adhesion layer 115 can be deposited by using $TiCl_4$ or the like as the titanium-including precursor, and the adhesion layer 115 is free of iodine. In some other embodiments, the adhesion layer 115 can be deposited by using $TiI_4$ or the like as the titanium-including precursor, and the adhesion layer 115 includes iodine.

The fill metal 117 may then be deposited over the adhesion layer 115. In some embodiments, the fill metal 117 includes cobalt, ruthenium, aluminum, tungsten, combinations thereof, or the like, which is deposited by CVD, ALD, PECVD, PVD, or the like. In some embodiments, the fill metal 117 may include tungsten deposited using a CVD process. It has been observed that CVD provides an improved deposition rate for the fill metal 117. In some embodiments, the CVD process to deposit the fill metal 117 may include supplying a first precursor (e.g., $WF_6$, or the like) and a second precursor (e.g., $SiH_4$, or the like) in the CVD process chamber. In some embodiments, the first precursor and the second precursor may be supplied simultaneously during the CVD process for the fill metal 117.

In the P-type region 50P, the gate dielectrics 100, the work function metal layer 105, the adhesion layer 115, and the fill metal 117 may each be formed on top surfaces, sidewalls, and bottom surfaces of the first nanostructures 52. The gate dielectrics 100, the work function metal layer 105, the adhesion layer 115, and the fill metal 117 may also be deposited on top surfaces of the first ILD 96, the CESL 94, the first spacers 81, and the Isolation regions 68. After the filling of the second recesses 98, a planarization process, such as a CMP, may be performed to remove the excess portions of the gate dielectrics 100, the work function metal layer 105, the adhesion layer 115, and the fill metal 117, which excess portions are over the top surface of the first ILD 96. The remaining portions of material of the gate electrodes 102 and the gate dielectrics 100 thus form replacement gate structures of the resulting nano-FETs. The gate electrodes 102 and the gate dielectrics 100 may be collectively referred to as "gate structures."

Figure 22:
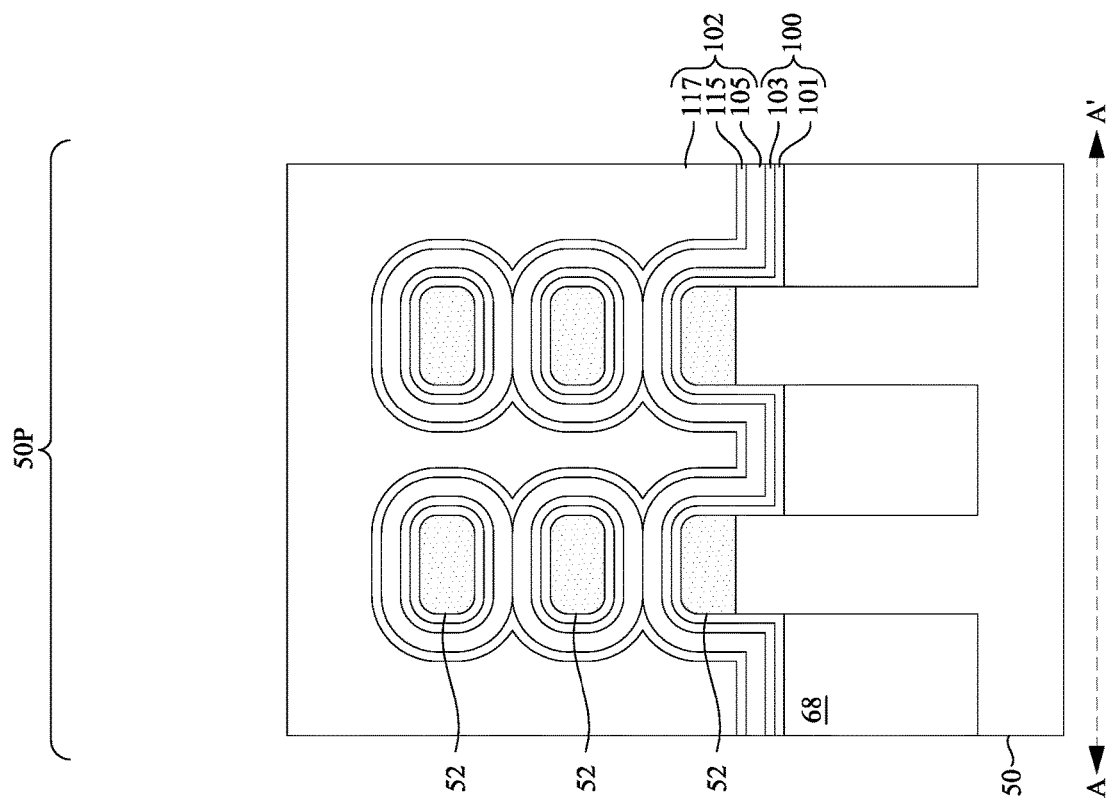
FIG. 22 is a cross-sectional view of a nano-FET, in accordance with some embodiments.

Although FIGS. 21A and 21B illustrate the gate dielectrics 100 and the gate electrodes 102 as having straight sidewalls and squared corners, the gate dielectrics 100 and the gate electrodes 102 may have a different configuration. For example, FIG. 22 illustrates a cross-sectional view of the gate dielectrics 100 and the gate electrodes 102 according to another embodiment. In FIG. 22, like reference numerals indicate like elements as FIGS. 21A and 21B formed using like processes. However, in FIG. 22, due to the first nanostructures 52 having rounded corners, the gate dielectrics 100 and the gate electrodes 102 may likewise have rounded corners.

Figure 23:
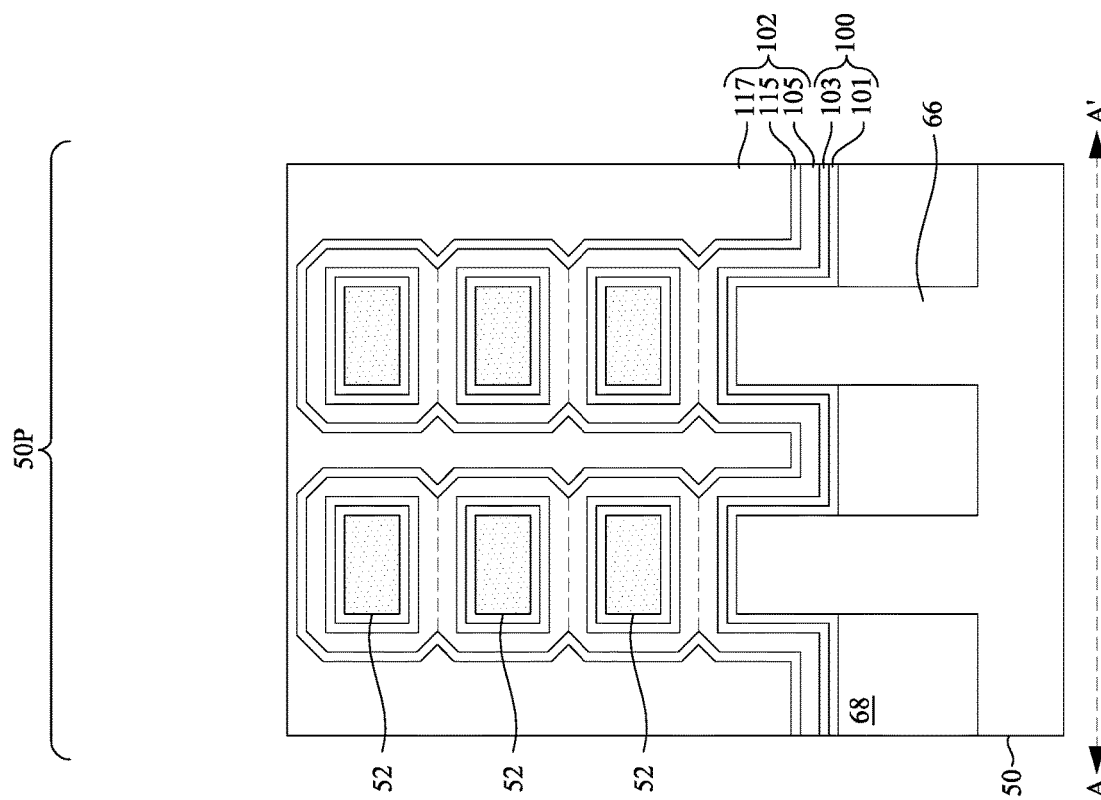
FIG. 23 is a cross-sectional view of a nano-FET, in accordance with some embodiments.

Further, although FIGS. 21A and 21B illustrate a bottom-most one of the first nanostructures 52 touching an underlying fin 66, the bottommost one of the first nanostructures 52 (e.g., the first nanostructure 52A) may be separated from the underlying fin 66 as illustrated by FIG. 23. In FIG. 23, like reference numerals indicate like elements as FIGS. 21A and 21B formed using like processes. The structure of FIG. 23 may be formed, for example, by disposing a second nanostructure 54 between the first nanostructure 52 and the fin 66, and then subsequently removing the second nanostructure 54 as described above. As a result, portions of the gate dielectrics 100 and the work function metal layer 105 may be disposed between a bottommost one of the first nanostructures 52 and the fin 66.

Figure 24:
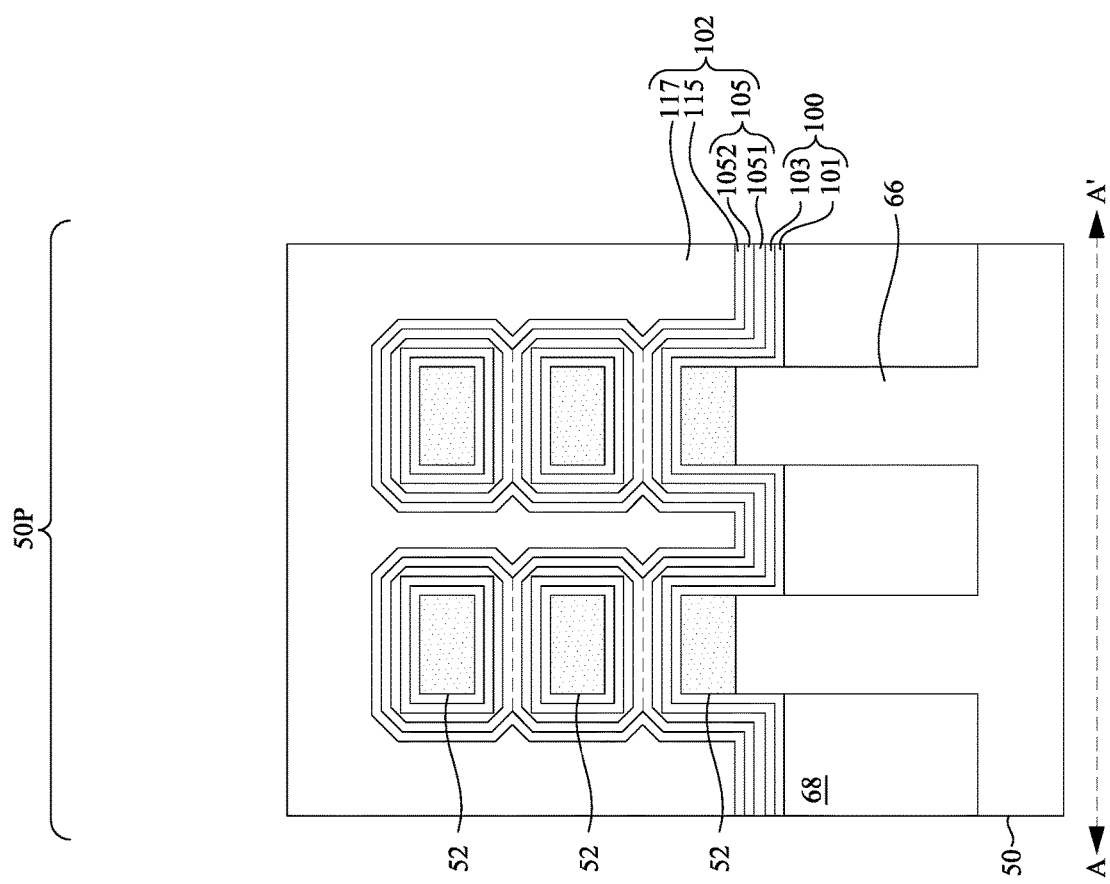
FIG. 24 is a cross-sectional view of a nano-FET, in accordance with some embodiments.

Furthermore, although FIGS. 21A and 21B illustrate that the work function metal layer 105 has a single-layer structure including TiN, the work function metal layer 105 can have a bilayer structure that includes a first sublayer 1051 and a second sublayer 1052 as illustrated in FIG. 24. In FIG. 24, like reference numerals denote like elements. In some embodiments, the work function metal layer 105 includes the first sublayer 1051 and the second sublayer 1052, in which the first sublayer 1051 can be also referred to as an inner sublayer, and the second sublayer 1052 can be also referred to as an outer sublayer. That is, the first sublayer 1051 is deposited prior to deposition of the second sublayer 1052, such that the first sublayer 1051 is disposed between the second sublayer 1052 and the gate dielectrics 100. The spaces between the first nanostructures 52 are filled by the work function metal layer 105, and the adjacent work function metal layer 105 is merged at the interfaces between the second sublayers 1052.

In some embodiments, the thickness of the first sublayer 1051 and the second sublayer 1052 can be the same or different from each other. In some embodiments, the first sublayer 1051 can be thicker than the second sublayer 1052. In some other embodiments, the first sublayer 1051 can be thinner than the second sublayer 1052. In some embodiments, the second sublayer 1052 includes composition that is different from the first sublayer 1051. For example, the first sublayer 1051 can include TiN, and the second sublayer 1052 can include TaN. The first sublayer 1051 including TiN can be formed by the deposition process using $TiI_4$ or the like as the titanium-including precursor, which is described in FIG. 19, such that the first sublayer 1051 has an oxygen concentration in a range from about 10 at % to about 30 at % throughout the first sublayer 1051 and has a highest concentration at a portion adjacent to the interface between the first sublayer 1051 and the gate dielectrics 100. Also, iodine is present in the first sublayer 1051 of the work function metal layer 105, and the iodine concentration in the first sublayer 1051 of the work function metal layer 105 is in a range from about 0.5 at % to about 5 at % throughout the first sublayer 1051. In some embodiments, the adhesion layer 115 is a titanium-including layer such as TiN, and the adhesion layer 115 can be free of iodine or include iodine.

FIGS. 25A and 25B illustrate a gate stack in the N-type region 50N. Forming the gate stack in the N-type region 50N may include first removing the first nanostructures 52 in the N-type region 50N. The first nanostructures 52 may be removed by forming a mask (not shown) over the P-type region 50P and performing an isotropic etching process such as wet etching or the like using etchants which are selective to the materials of the first nanostructures 52, while the second nanostructures 54, the substrate 50, and the isolation regions 68 remain relatively unetched as compared to the first nanostructures 52. In embodiments in which the first nanostructures 52 include, e.g., SiGe, and the second nanostructures 54 include, e.g., Si or SiC, tetramethylammonium hydroxide (TMAH), ammonium hydroxide (NH$_4$OH) or the like may be used to remove the first nanostructures 52 in the N-type region 50N.

The gate stack is then formed over and around the second nanostructures 54 in the N-type region 50N. The gate stack includes the gate dielectrics 100 and gate electrodes 127. In some embodiments, the gate dielectrics 100 in the N-type region 50N and the P-type region 50P may be formed simultaneously. Further, at least portions of the gate electrodes 127 may be formed either before or after forming the gate electrodes 102 (see FIGS. 21A and 21B), and at least portions of the gate electrodes 127 may be formed while the P-type region 50P is masked. As such, the gate electrodes 127 may include different materials than the gate electrodes 102. For example, the gate electrodes 127 may include a conductive layer 121, a barrier layer 123, and a fill metal 125. The conductive layer 121 may be an N-type work function metal (WFM) layer including an N-type metal, such as, titanium aluminum, titanium aluminum carbide, tantalum aluminum, tantalum carbide, combinations thereof, or the like. The conductive layer 121 may be deposited by CVD, ALD, PECVD, PVD, or the like. The barrier layer 123 may include titanium nitride, tantalum nitride, tungsten carbide, combinations thereof, or the like, and the barrier layer 123 may further function as an adhesion layer. The barrier layer 123 may be deposited by CVD, ALD, PECVD, PVD, or the like. The fill metal 125 may include cobalt, ruthenium, aluminum, tungsten, combinations thereof, or the like, which is deposited by CVD, ALD, PECVD, PVD, or the like. The fill metal 125 may or may not have a same material composition and be deposited concurrently with the fill metal 117.

A planarization process, such as a CMP, may be performed to remove the excess portions of the gate dielectrics 100 and the gate electrodes 127, which excess portions are over the top surface of the first ILD 96. The remaining portions of material of the gate electrodes 127 and the gate dielectrics 100 thus form replacement gate structures of the resulting nano-FETs of the N-type region 50N. The CMP processes to remove excess materials of the gate electrodes 102 in the P-type region 50P and to remove excess materials of the gate electrodes 127 in the N-type region 50N may be performed concurrently or separately.

In FIGS. 26A-26C, the gate structure (including the gate dielectrics 100, the gate electrodes 102, and the gate electrodes 127) is recessed, so that a recess is formed directly over the gate structure and between opposing portions of first spacers 81. A gate mask 104 including one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 27A and 27B) penetrate through the gate mask 104 to contact the top surface of the recessed gate electrodes 102 and 127.

As further illustrated by FIGS. 26A-26C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

In FIGS. 26A-26C, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 27B illustrates the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts.

After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions including silicide and germanide). In an embodiment, the silicide region 110 includes TiSi, and has a thickness in a range between about 2 nm and about 10 nm.

Figure 27A:
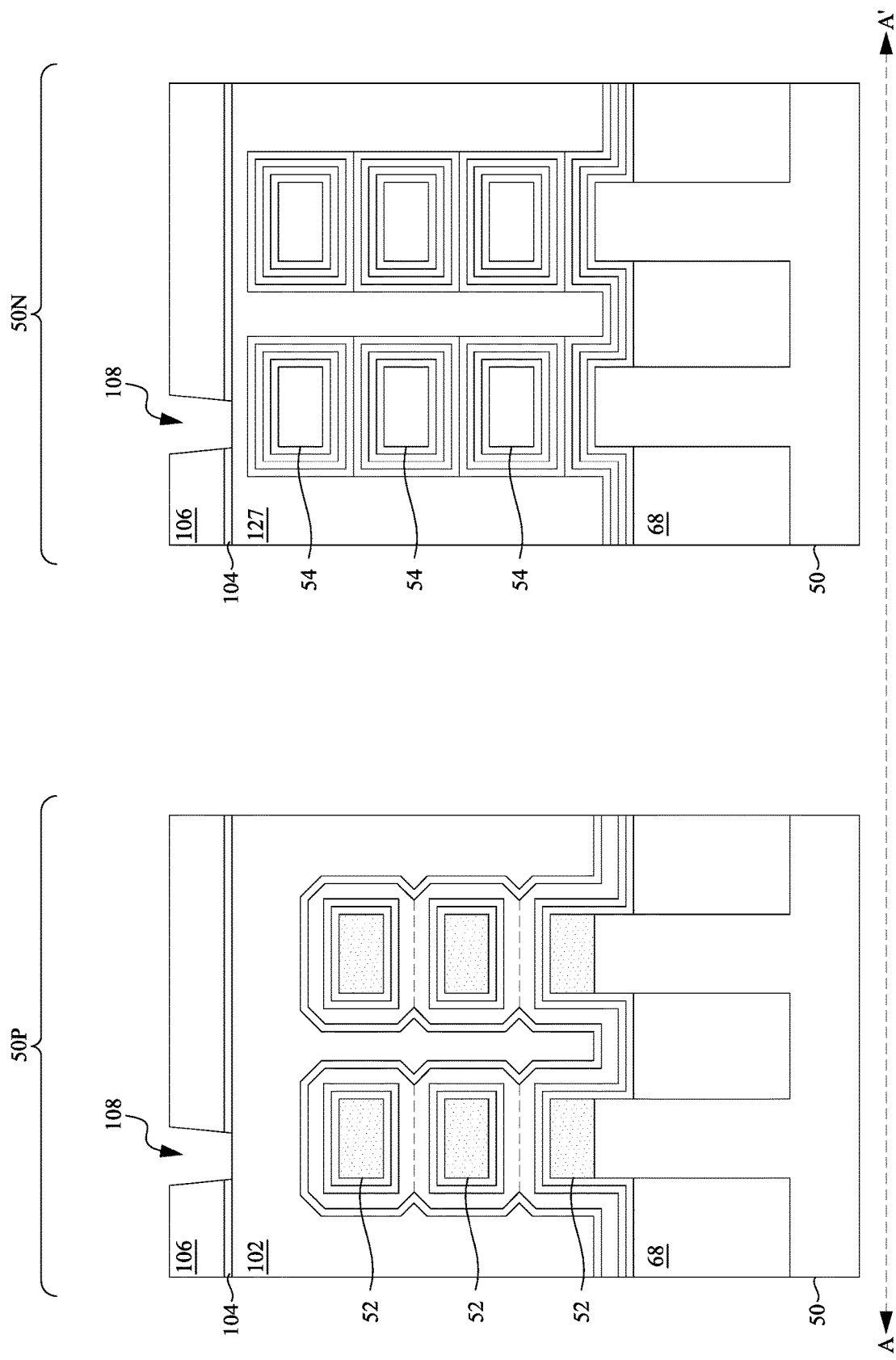
Figure 27B:
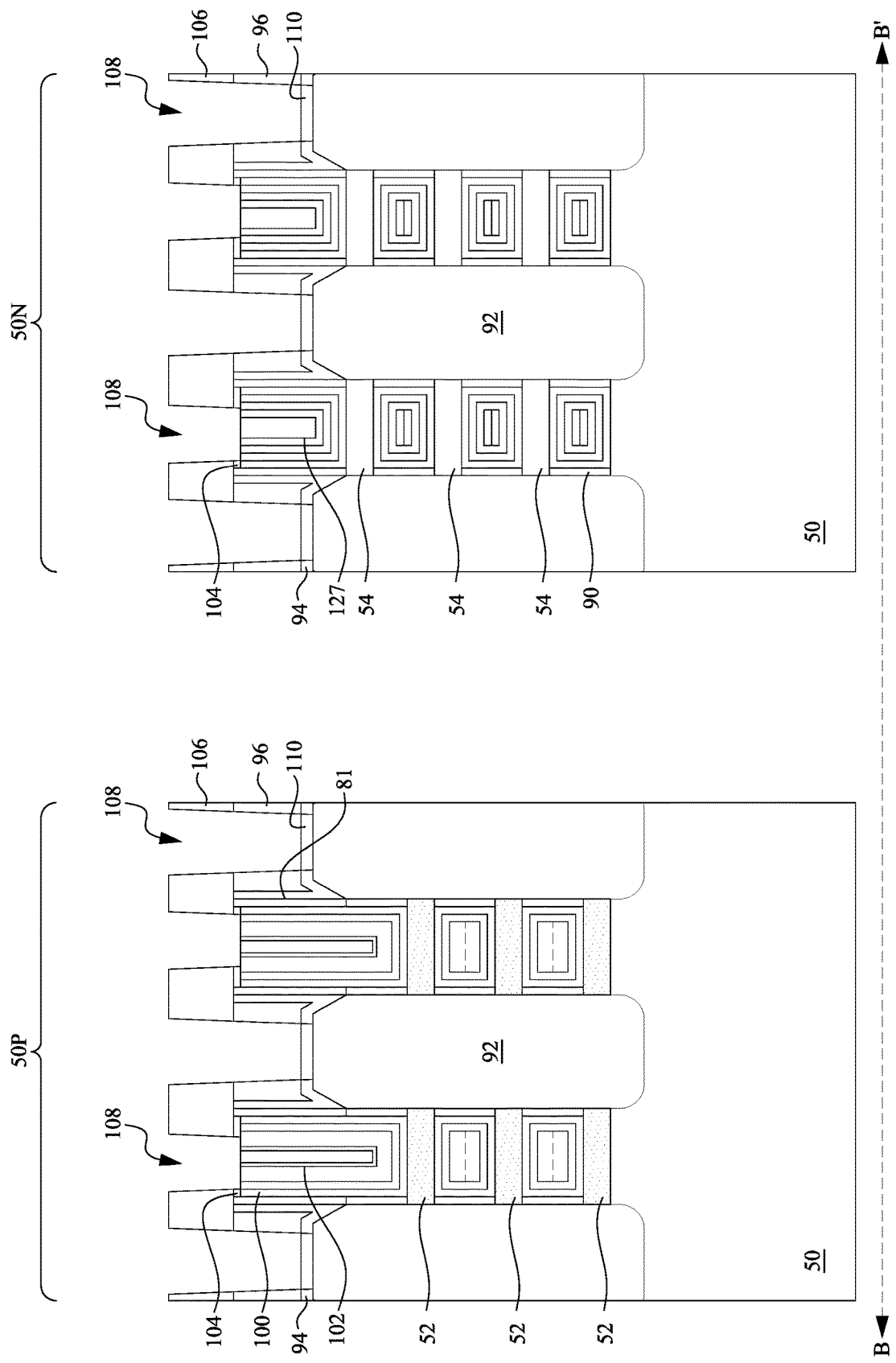
Figure 27C:
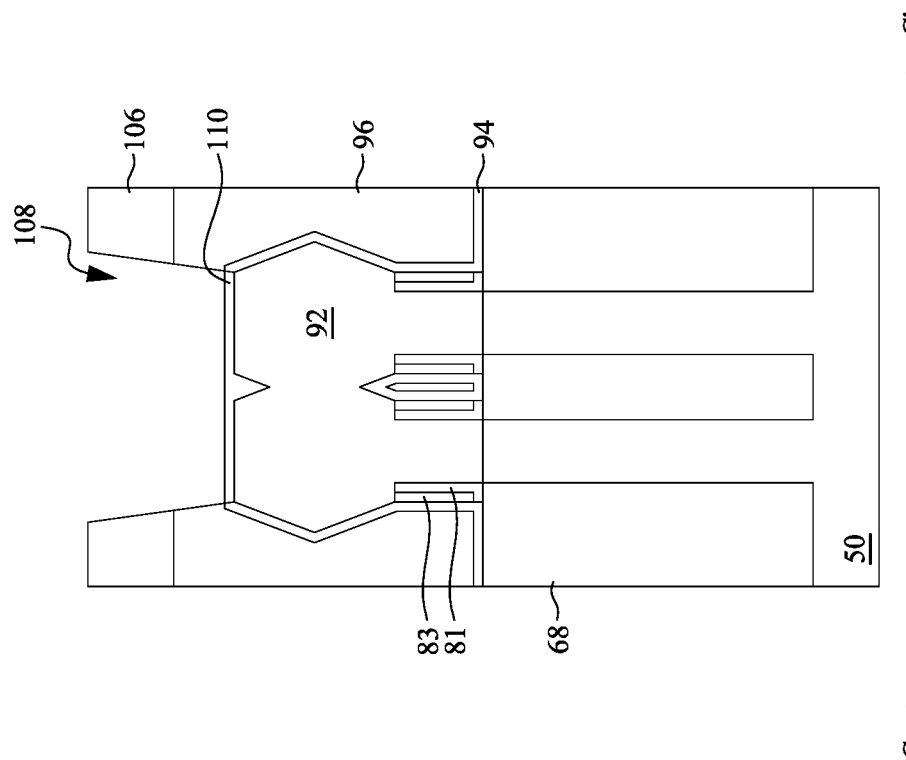
Figure 28A:
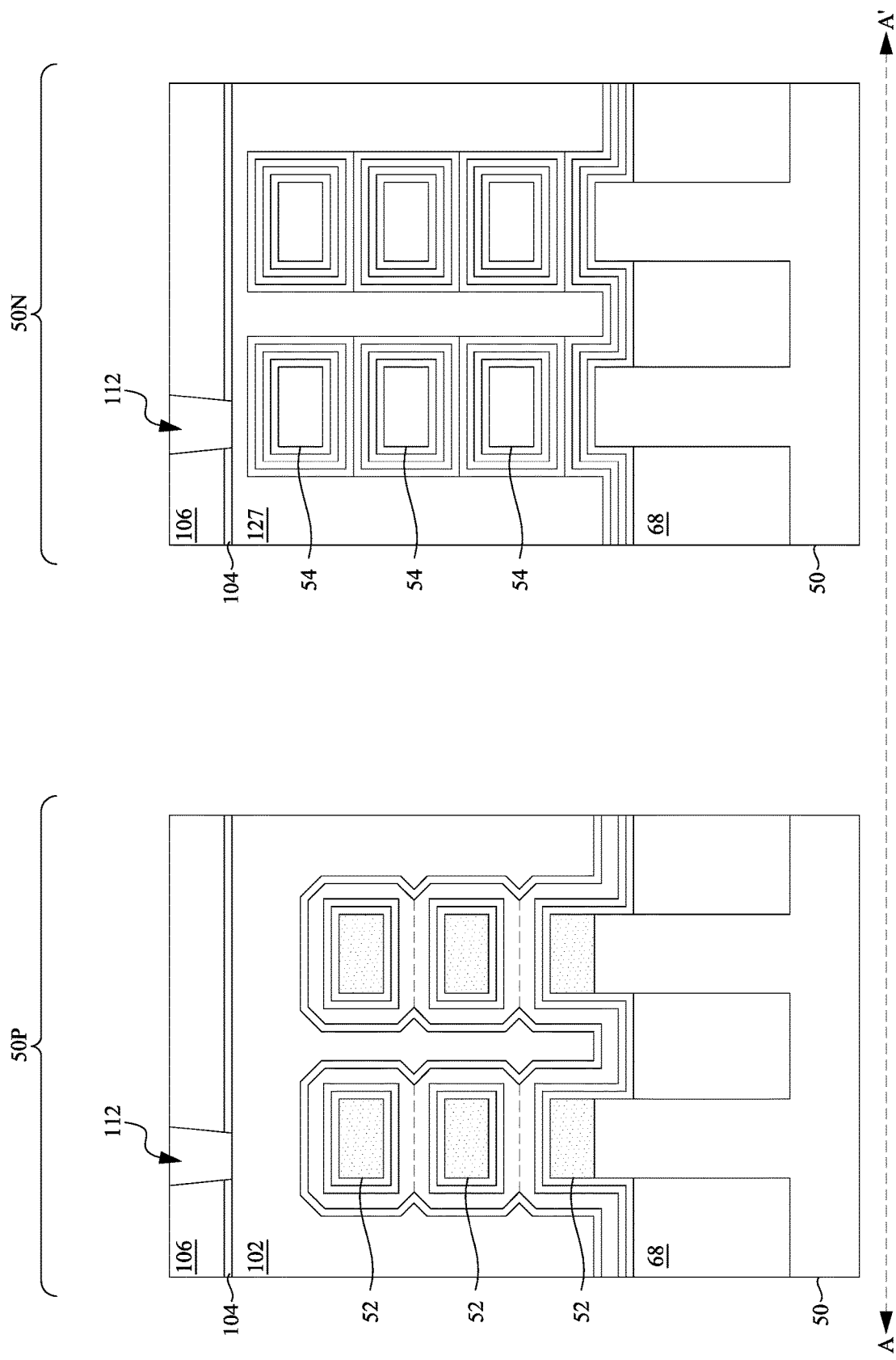
FIGS. 28A, 28B, and 28C are cross-sectional views of a nano-FET, in accordance with some embodiments.
Figure 28B:
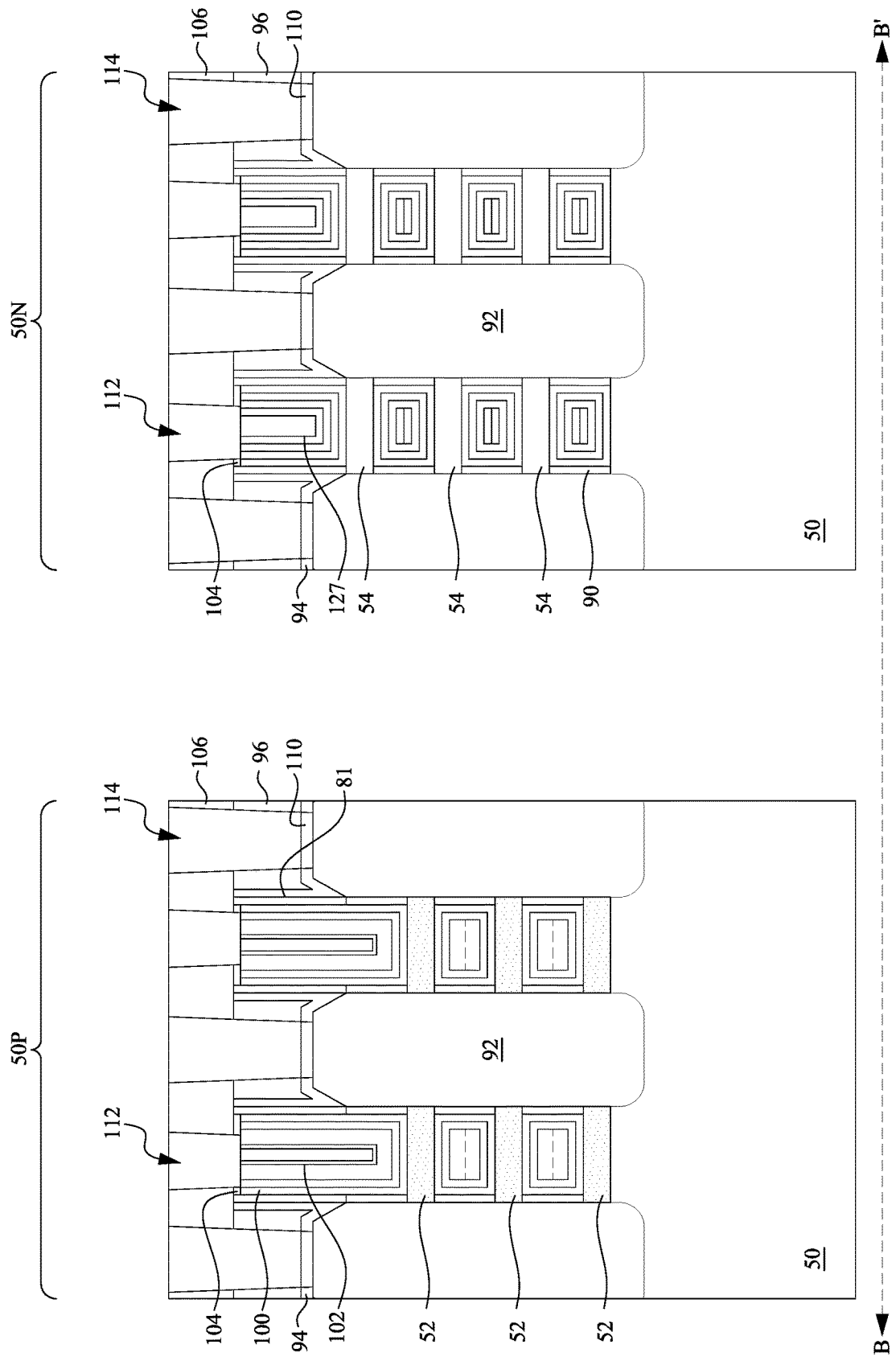
Figure 28C:
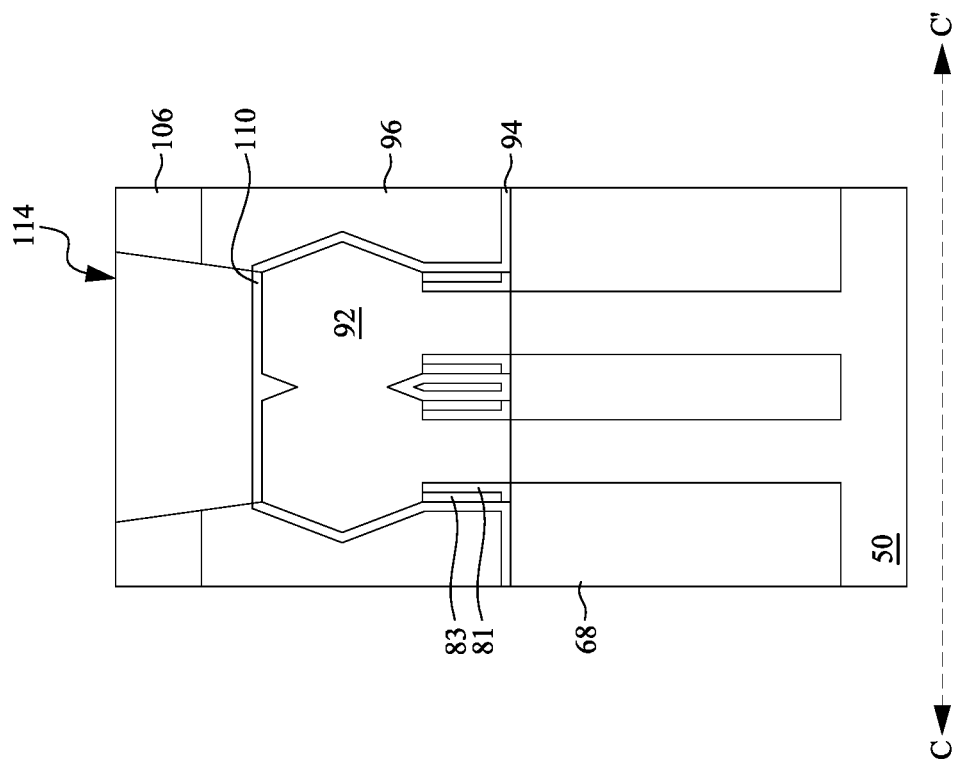

Next, in FIGS. 28A-28C, contacts 112 and 114 (may also be referred to as contact plugs) are formed in the third recesses 108 (see FIGS. 27A-27C). The contacts 112 and 114 may each include one or more layers, such as barrier layers, diffusion layers, and fill materials. For example, in some embodiments, each of the contacts 112 and 114 includes a barrier layer and a conductive material, and is electrically coupled to the underlying conductive feature (e.g., the gate electrodes 102, the gate electrodes 127, and/or silicide region 110 in the illustrated embodiment). The contacts 114 are electrically coupled to the gate electrodes 102 and 127 and may be referred to as gate contacts, and the contacts 112 are electrically coupled to the silicide regions 110 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

Figure 29:
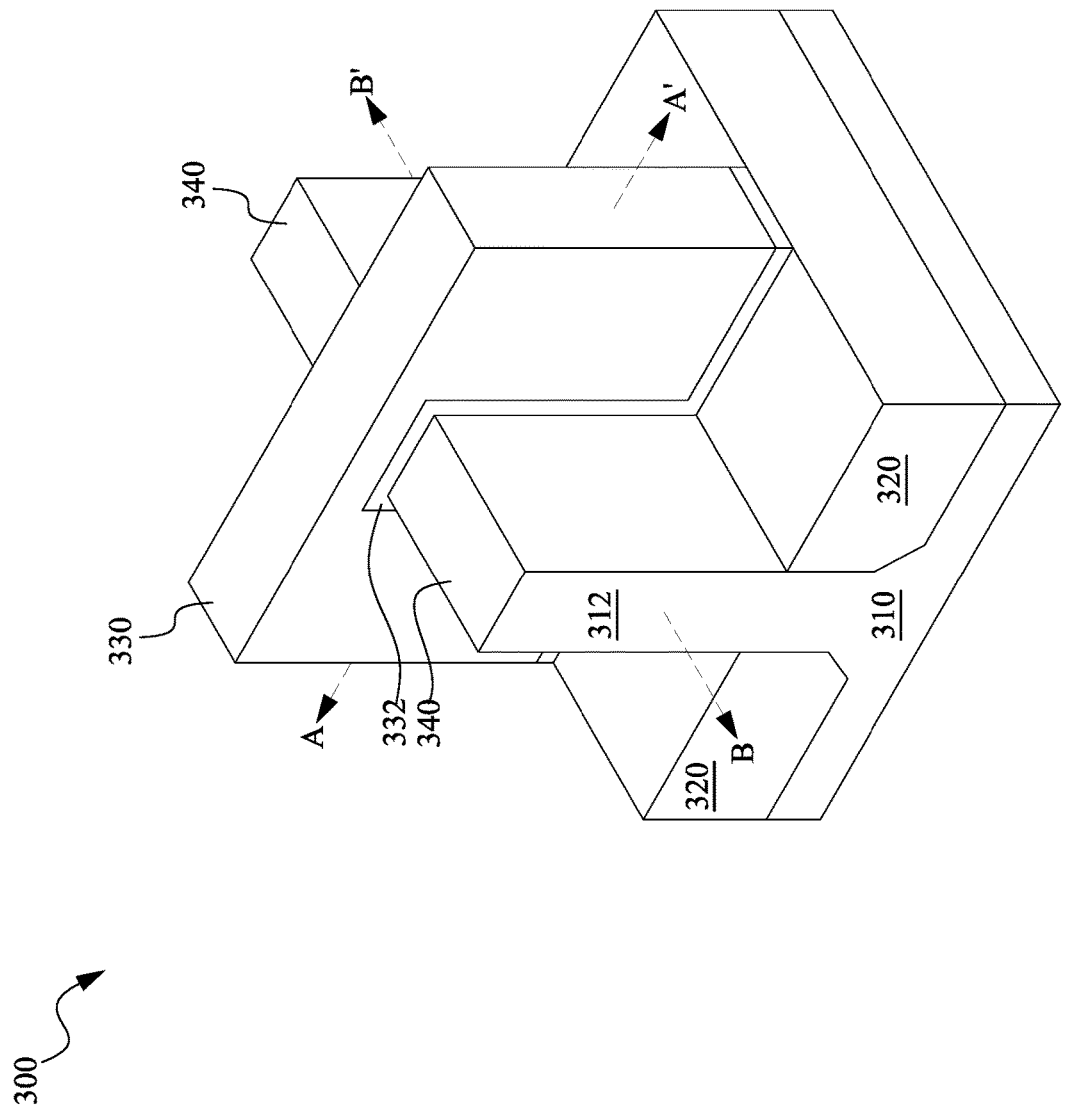
FIG. 29 illustrates an example of a fin field-effect transistor (FinFET) in a three-dimensional view, in accordance with some embodiments.

The method of depositing work function metal layer using $TiI_4$ or the like as the titanium-including precursor can be also utilized in the method of forming a FinFET device. As illustrated in FIG. 29, FIG. 29 is an example of a FinFET in a three-dimensional view, in accordance with some embodiments. The FinFET 300 includes a fin 312 on a substrate 310 (e.g., a semiconductor substrate). Isolation regions 320 are disposed in the substrate 310, and the fin 312 protrudes above and from between neighboring isolation regions 320. Although the isolation regions 320 are described/illustrated as being separate from the substrate 310, as used herein the term "substrate" may be used to refer to just the semiconductor substrate or a semiconductor substrate inclusive of isolation regions. Additionally, although the fin 312 is illustrated as a single, continuous material as the substrate 310, the fin 312 and/or the substrate 310 may include a single material or a plurality of materials. In this context, the fin 312 refers to the portion extending between the neighboring isolation regions 320.

A gate dielectric 332 is along sidewalls and over a top surface of the fin 312, and a gate electrode 330 is over the gate dielectric 332. Source/drain regions 340 are disposed in opposite sides of the fin 312 with respect to the gate dielectric 332 and gate electrode 330. FIG. 1 further illustrates reference cross-sections that are used in later figures. Cross-section A-A' is along a longitudinal axis of the gate electrode 330 and in a direction, for example, perpendicular to the direction of current flow between the source/drain regions 340 of the FinFET. Cross-section B-B' is perpendicular to cross-section A-A' and is along a longitudinal axis of the fin 312 and in a direction of, for example, a current flow between the source/drain regions 340 of the FinFET.

Figure 30B:
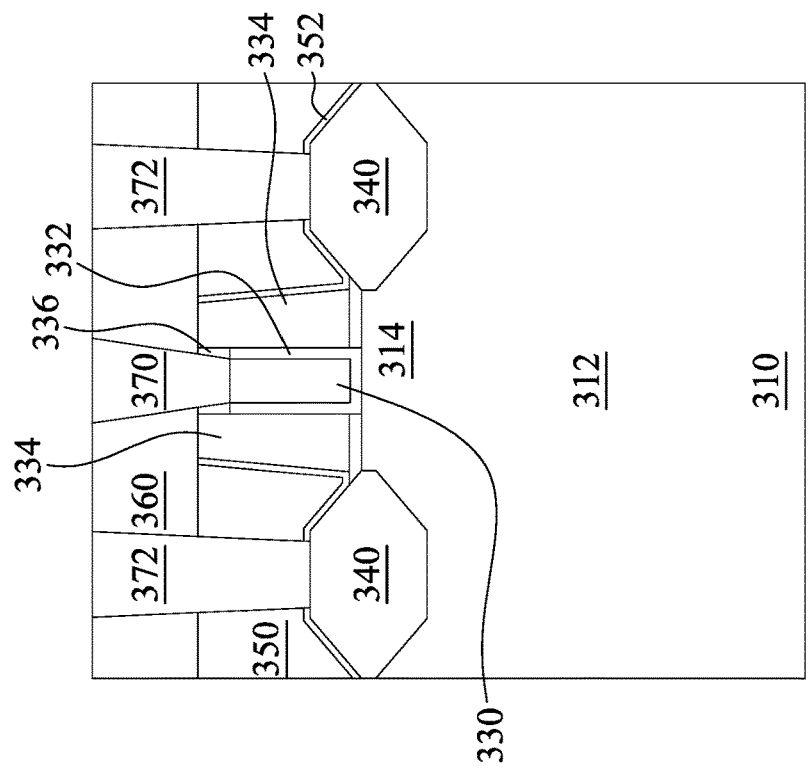
FIGS. 30A and 30B are cross-sectional views of a FinFET, in accordance with some embodiments.
Figure 30A:
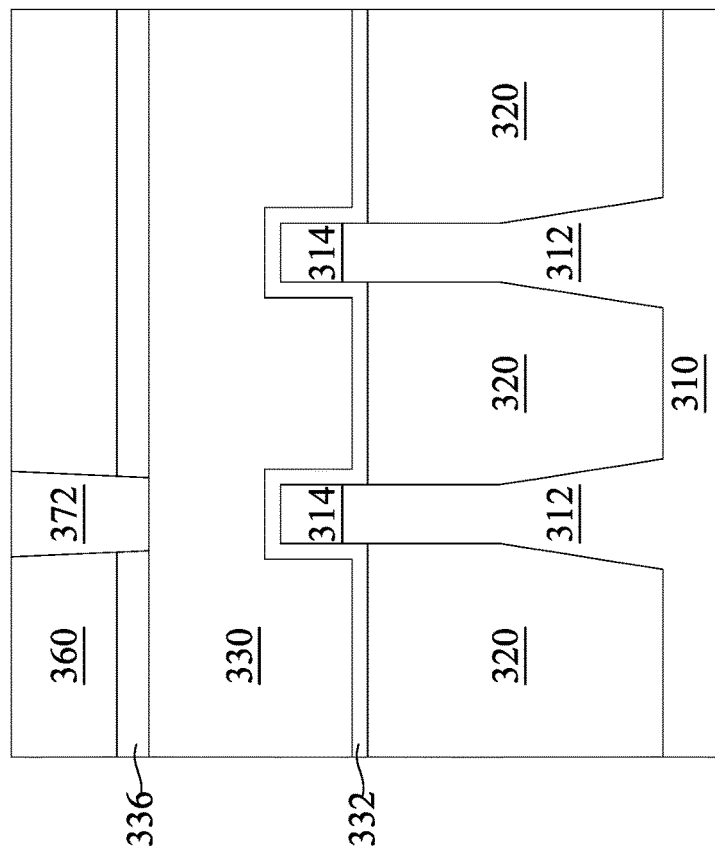

FIGS. 30A and 30B are cross-sectional views of the FinFETs, in accordance with some embodiments, in which FIG. 30A is illustrated along a similar cross-section A-A' illustrated in FIG. 29, except for multiple fins/FinFETs, and FIG. 30B is illustrated along a similar cross-section B-B' illustrated in FIG. 29, except for multiple fins/FinFETs. A gate dielectric 332 and a gate electrode 330 are formed over the fins 312 and wrap the channel regions 314 of the fins 312. Epitaxial source/drain regions 340 are formed in the fins 312. The epitaxial source/drain regions 340 are formed in the fins 312 such that each gate electrode 330 is disposed between respective neighboring pairs of the epitaxial source/drain regions 340. Gate spacers 334 are disposed on opposite sidewalls of the gate electrode 330. The gate spacers 334 may be includes one or more dielectric layer and can be formed of silicon oxide, silicon nitride, silicon oxynitride, or the like. A first interlayer dielectric (ILD) 350 is deposited over the epitaxial source/drain regions 340 and the gate electrode 330. The first ILD 350 may be formed of a dielectric material, and may be deposited by any suitable method. In some embodiments, a contact etch stop layer (CESL) 352 is disposed between the first ILD 350 and the epitaxial source/drain regions 340. The CESL 352 may include a dielectric material, such as, silicon nitride, silicon oxide, silicon oxynitride, or the like, having a lower etch rate than the material of the overlying first ILD 350.

A gate mask 336 is formed over the gate stack (including a gate dielectric 332 and a corresponding gate electrode 330), and the gate mask 336 may be disposed between opposing portions of the gate spacers 334. A second ILD 360 is deposited over the first ILD 350. In some embodiments, the second ILD 360 is a flowable film formed by a flowable CVD method. Gate contacts 370 and source/drain contacts 372 are formed through the second ILD 360 and the first ILD 350 in accordance with some embodiments. An anneal process may be performed to form a silicide at the interface between the epitaxial source/drain regions 340 and the source/drain contacts 372. The source/drain contacts 372 are physically and electrically coupled to the epitaxial source/drain regions 340, and the gate contacts 370 are physically and electrically coupled to the gate electrodes 336. The source/drain contacts 372 and gate contacts 370 may be formed in different processes, or may be formed in the same process. Although shown as being formed in the same cross-sections, it should be appreciated that each of the source/drain contacts 372 and gate contacts 370 may be formed in different cross-sections, which may avoid shorting of the contacts.

Reference is made to FIGS. 31A-31D, which are cross-sectional views of forming the gate electrode 330 according to some embodiments. For ease of illustration, both the P-type region 330P and the N-type region 300N are illustrated in FIGS. 31A-31D.

Figure 31A:
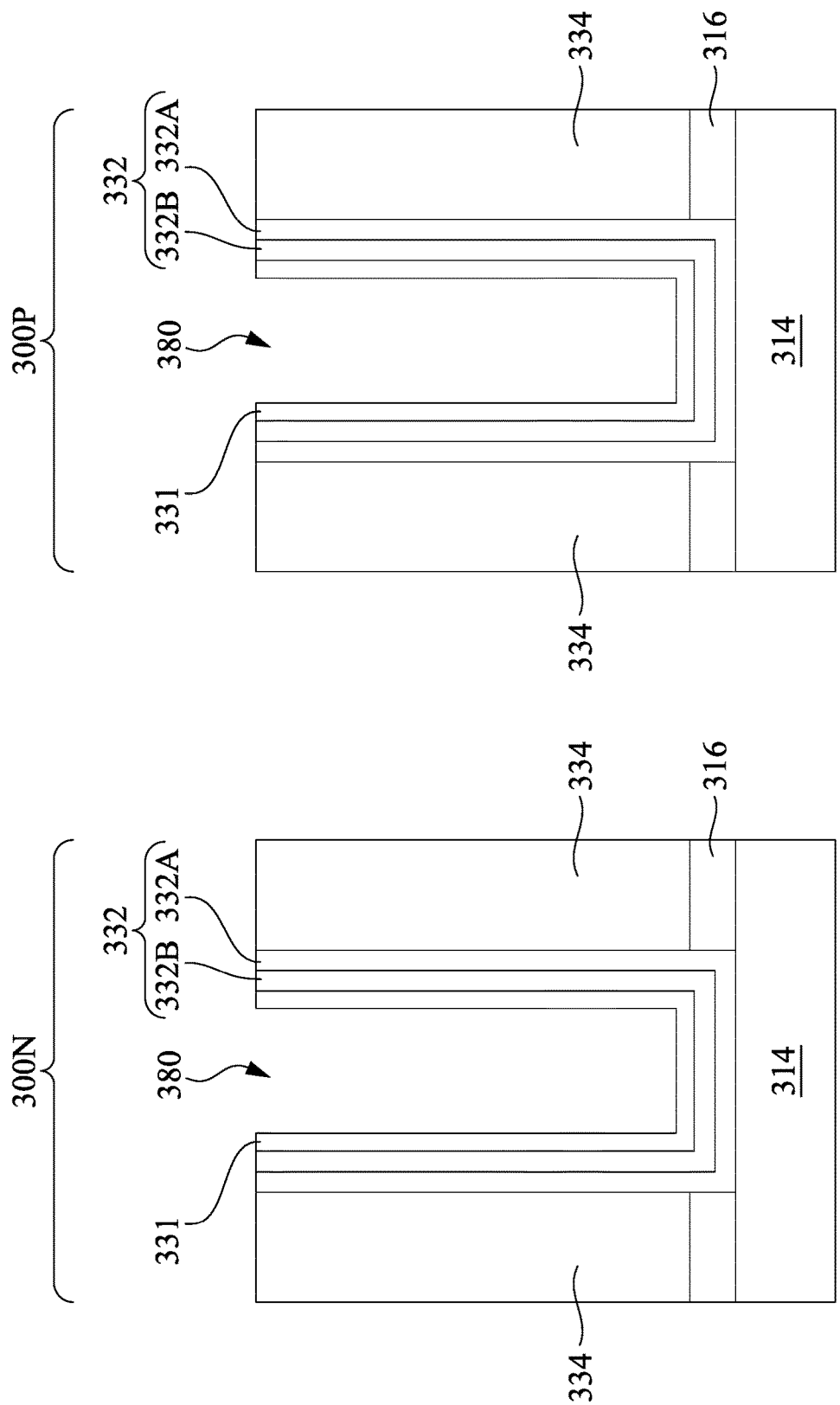
FIGS. 31A, 31B, 31C, and 31D are cross-sectional down views of intermediate stages in the manufacturing of FinFETs, in accordance with some embodiments.

In FIG. 31A, recesses 380 are formed between the gate spacers 334 in the P-type region 300P and the N-type region 300N by removing the dummy gate electrode and portions of the dummy gate dielectric. In some embodiments, portions of the dummy gate dielectric 316 are not removed and are remained between the channel regions 314 and the gate spacers 334. The gate dielectrics 332 are formed on sidewalls of the recesses 380 and include one or more dielectric layers, such as one or more layers of silicon oxide, silicon nitride, metal oxide, metal silicate, or the like. For example, in some embodiments, the gate dielectrics 332 include an interfacial layer 332A, e.g., of silicon oxide formed by thermal or chemical oxidation, and an overlying high-k dielectric material 332B, such as a metal oxide or a silicate of hafnium, aluminum, zirconium, lanthanum, manganese, barium, titanium, lead, and combinations thereof.

P-type work function metal layer 331 is deposited in the recesses 380 in the P-type region 300P and the N-type region 300N. In some embodiments, the P-type work function metal layer 331 comprises titanium nitride (TiN), which is formed using an ALD process. The P-type work function metal layer 331 can be formed by the ALD process 200 using $TiI_4$ or the like as the titanium-including precursor, which is described in FIG. 19, such that the P-type work function metal layer 331 has an oxygen concentration in a range from about 10 at % to about 30 at % throughout the P-type work function metal layer 331 and has a highest concentration at a portion adjacent the interface adjacent the gate dielectrics 332. Also, iodine is present in the P-type work function metal layer 331, and the iodine concentration of the P-type work function metal layer 331 is in a range from about 0.5 at % to about 5 at % throughout the P-type work function metal layer 331. In some embodiments, depositing the P-type work function metal layer 331 is performed such that at least a portion of the iodine diffuses into the gate dielectrics 332.

Further, although only one P-type work function metal layer 331 is illustrated, it should be understood that in some embodiments, the P-type work function metal layer 331 may include a first sublayer comprising TiN and a second sublayer comprising TaN, in which the first sublayer is disposed between the second sublayer and the gate dielectrics 332 and includes iodine.

Figure 31B:
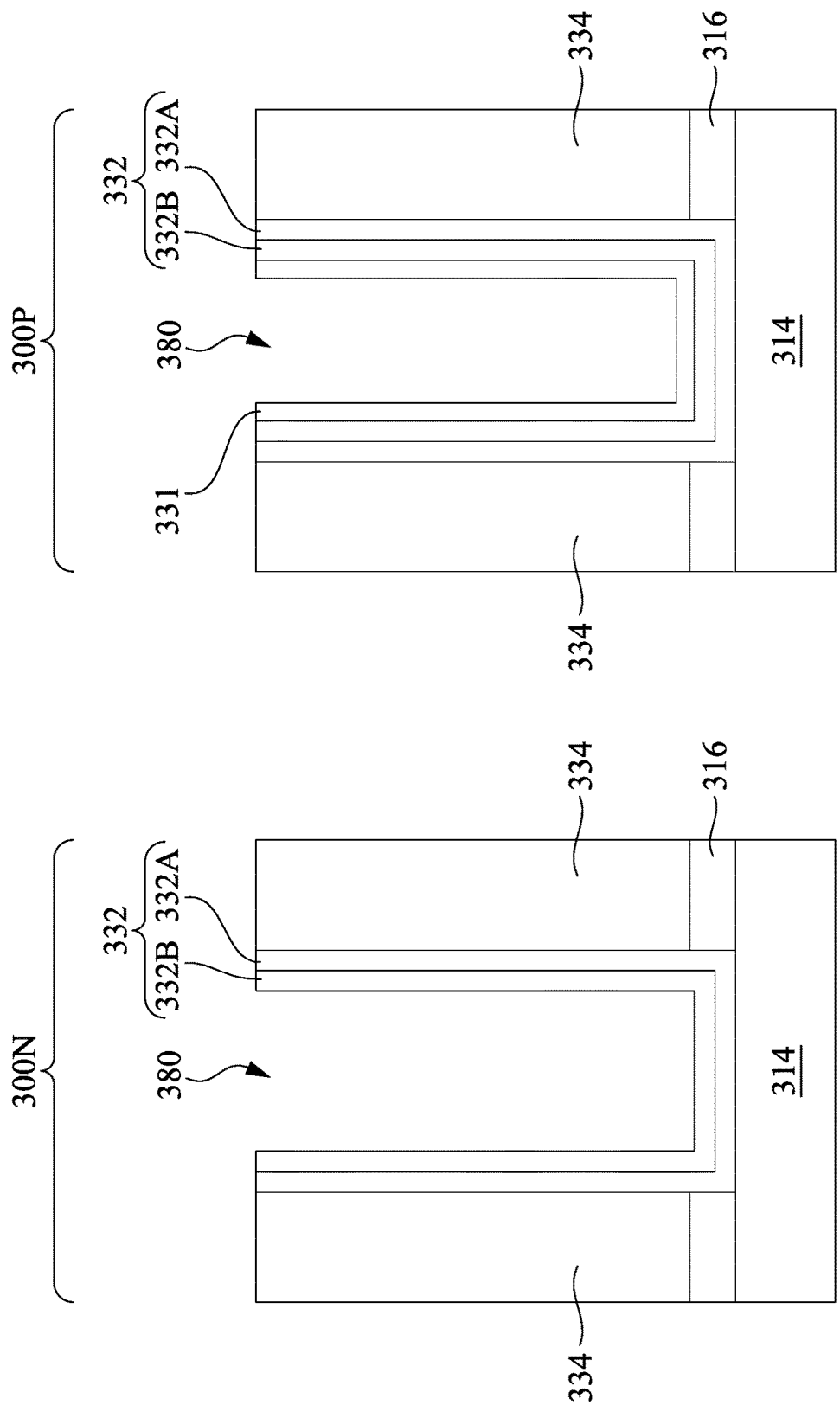

Referring to FIG. 31B, the processing may continue by removing the P-type work function metal layer 331 from the recesses 380 in the N-type region 300N while leaving the P-type work function metal layer 331 in the recesses 380 in the P-type region 300P. In some embodiments, the selective removal of the P-type work function metal layer 331 from the N-type regions 300N may be achieved by masking the P-type work function metal layer 331 in the P-type region 300P. For example, a mask (e.g., a back side anti-reflective (BARC) layer) may be deposited in the recesses 380 in the P-type region 30P to cover the P-type work function metal layer 331 while an etching process is performed to remove the P-type work function metal layer 331 from the N-type region 300N. After the etching process, the mask may then be removed.

Figure 31C:
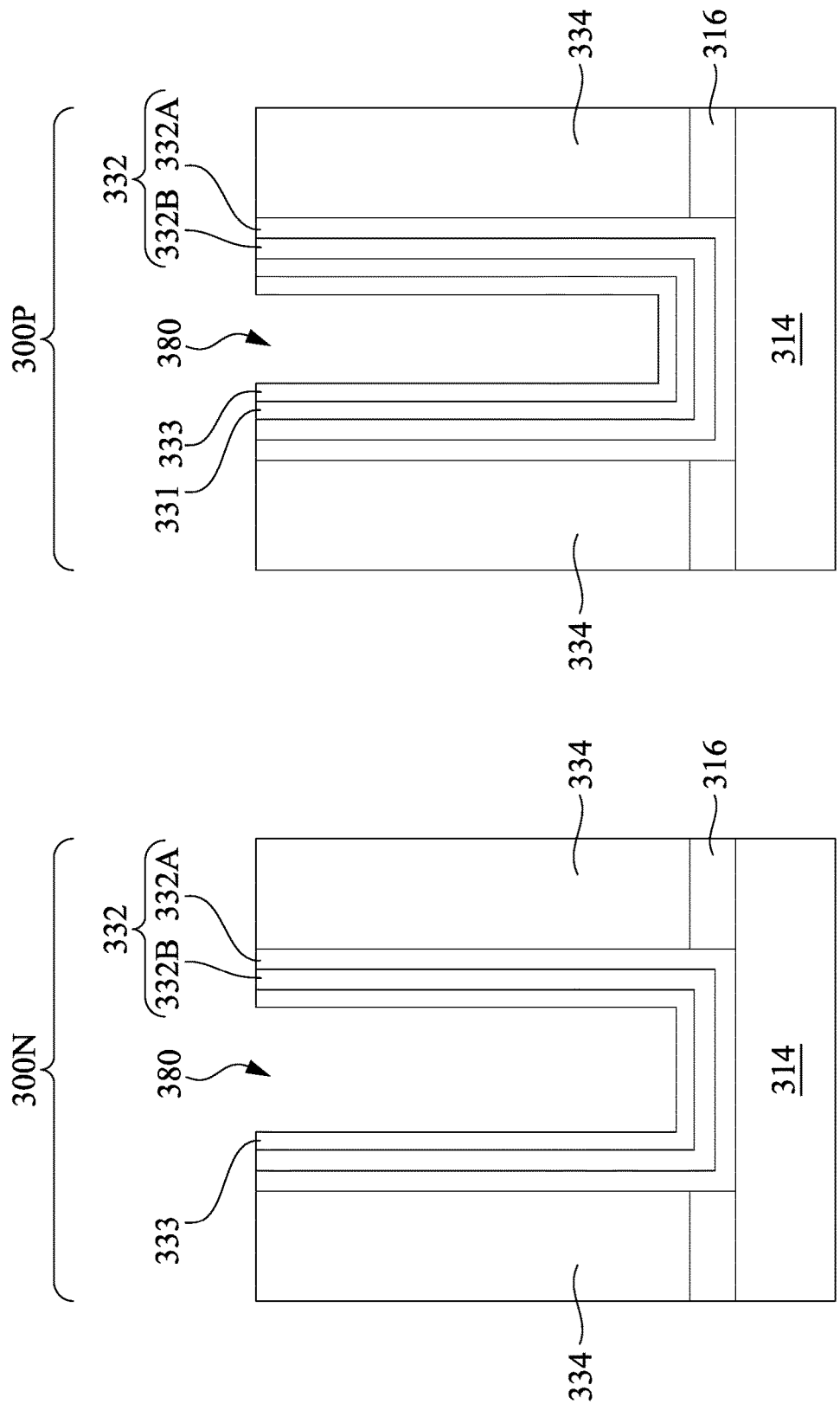

In FIG. 31C, an N-type work function metal layer 333 is then formed conformally in the recesses 380 in the N-type region 300N and the P-type region 300P. Further, the N-type work function metal layer 333 may be deposited over the P-type work function metal layer 331 in the P-type region 300P. The N-type work function metal layer 333 may be any acceptable material to tune a work function of a device to a desired amount given the application of the device to be formed, and may be deposited using any acceptable deposition process. In some embodiments, the N-type work function metal layer 333 may comprise aluminum (Al), aluminum nitride (AlN), titanium aluminum (TiAl), tantalum aluminum (TaAl), or the like deposited by ALD, CVD, PVD, or the like.

Figure 31D:
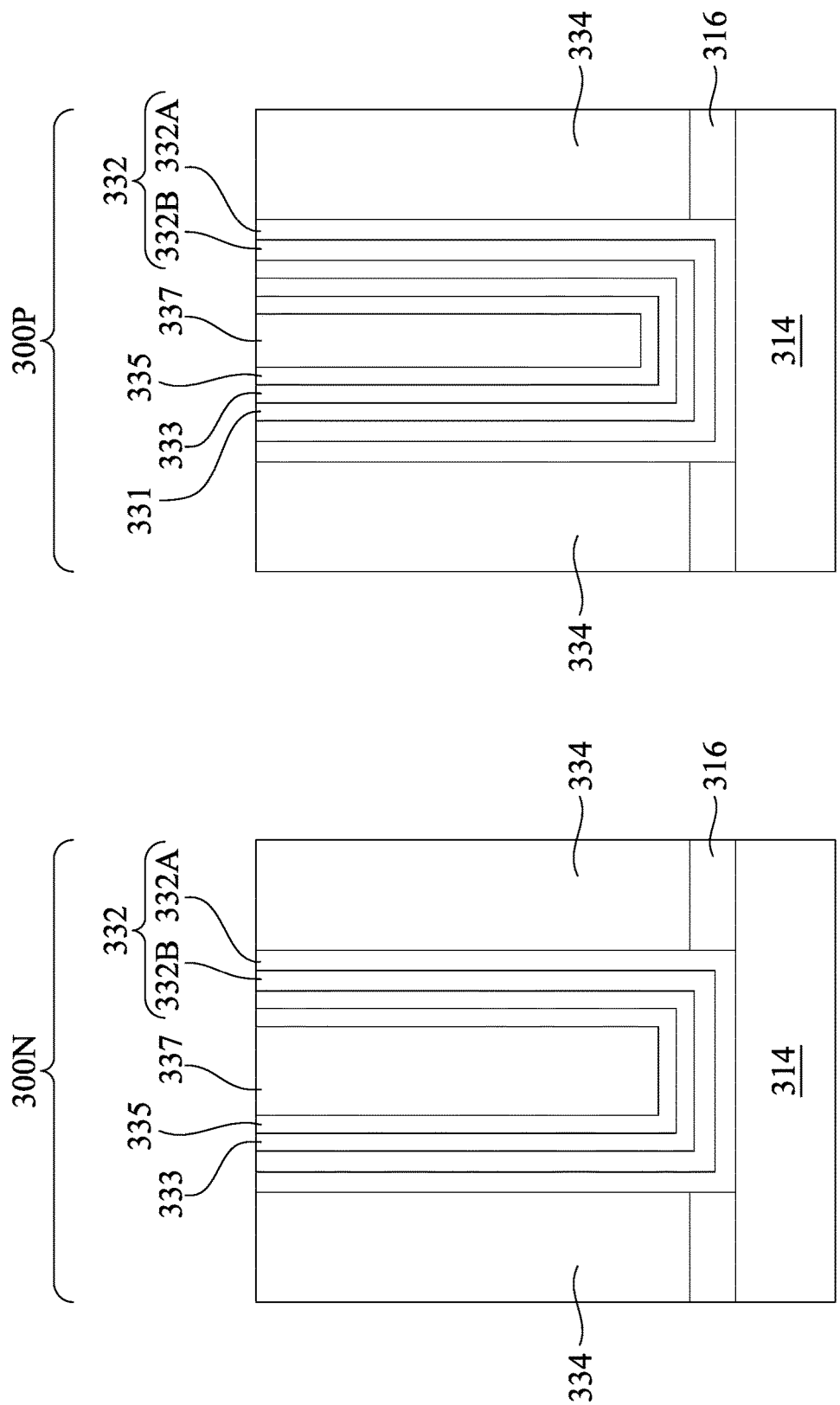

In FIG. 31D, an adhesion layer 335 is formed conformally on the N-type work function metal layer 333 in the N-type region 300N and the P-type region 300P. The adhesion layer 335 may include titanium nitride (TiN) or the like deposited by ALD or the like. The adhesion layer 335 can be free of iodine or include iodine. Also in FIG. 31D, a conductive material 337 is deposited on the adhesion layer 335. The conductive material can include a metal, such as tungsten (W), aluminum (Al), cobalt (Co), ruthenium (Ru), combinations thereof or the like. The conductive material 337 can be deposited using CVD, PVD, the like, or a combination thereof. The conductive material 337 fills the remaining portions of the recesses 380.

After the conductive material 337 is deposited, a planarization process, such as a CMP, may be performed to remove the excess portions of gate dielectrics 332, the P-type work function metal layer 331, the N-type work function metal layer 333, the adhesion layer 335, and the conductive material 337 to form the gate dielectrics 332 and gate electrodes 330 (see FIG. 30A).

An ALD process using titanium-including precursor including iodine to form the work function metal layer is disclosed. The dissociation energy of Ti—I is smaller than the dissociation energy of Ti—Cl, and thus a lower deposition temperature can be expected.

In some embodiments, a semiconductor device includes source and drain regions, a channel region between the source and drain regions, and a gate structure over the channel region. The gate structure includes a gate dielectric over the channel region, a work function metal layer over the gate dielectric and comprising iodine, and a fill metal over the work function metal layer.

In some embodiments, a semiconductor device includes source and drain regions, a channel region between the source and drain regions, and a gate structure over the channel region. The gate structure includes a gate dielectric over the channel region and including iodine, a first work function metal layer over the gate dielectric, and a fill metal over the first work function metal layer.

In some embodiments, a method includes a depositing a gate dielectric over a channel region, depositing a P-type work function metal layer over the gate dielectric, and depositing a fill metal over the P-type work function metal layer. Depositing the P-type work function metal layer is performed using a precursor, and the precursor includes iodine.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin over a substrate;
   depositing a gate structure crossing the fin, wherein depositing the gate structure comprises:
      forming a gate dielectric layer over the fin;
      forming a work function metal layer over the gate dielectric layer,
      wherein the work function metal layer is in contact with the gate dielectric layer,
      wherein the work function metal layer comprises iodine atoms and oxygen atoms; and
      forming a fill metal layer on the work function metal layer.

2. The method of claim 1, wherein forming the work function metal layer comprises performing one or more deposition loops, one of the one or more deposition loops comprising:
   pulsing a $TiI_4$ to the dielectric layer; and
   pulsing an $NH_3$ to react with the $TiI_4$ to deposit a monolayer of titanium nitride on the gate dielectric layer.

3. The method of claim 1, wherein the work function metal layer is formed at a temperature in a range from about 200° C. to about 500° C.

4. The method of claim 1, wherein the work function metal layer comprises a highest oxygen concentration at an interface between the work function metal layer and the gate dielectric layer.

5. The method of claim 1, wherein a portion of the work function metal layer has an oxygen concentration decreasing in a direction away from the gate dielectric layer.

6. The method of claim 1, wherein a portion of the work function metal layer comprises has an oxygen concentration increasing in a direction away from the gate dielectric layer.

7. The method of claim 1, wherein a portion of the gate dielectric layer comprises has an oxygen concentration decreasing in a direction away from the work function metal layer.

8. The method of claim 1, wherein a portion of the gate dielectric layer has an oxygen concentration increasing in a direction away from the work function metal layer.

9. A method, comprising:
   patterning a substrate to form a fin, wherein the fin comprises alternately stacked first semiconductor structures and second semiconductor structures;
   removing the first semiconductor structures to form spaces each between the second semiconductor structures;
   forming a gate dielectric layer wrapping around the second semiconductor structures;
   forming a work function metal layer on the gate dielectric layer, wherein the work function metal layer has a first portion between the two adjacent second semiconductor structures, and the first portion of the work function metal layer comprises an oxygen concentration and an iodine concentration less than the oxygen concentration; and
   forming a fill metal layer on the work function metal layer.

10. The method of claim 9, wherein the work function metal layer further comprises:
   a second portion over a topmost one of the second semiconductor structures, and the second portion comprises iodine atoms.

11. The method of claim 10, wherein the work function metal layer further comprises:
   a second portion over a topmost one of the second semiconductor structures, and the second portion comprises oxygen atoms.

12. The method of claim 10, further comprising:
   after forming the work function metal layer, performing a deposition process to form a titanium nitride layer over the work function metal layer, the deposition process comprising:
      pulsing a $TiI_4$ to the work function layer; and
      pulsing an $NH_3$ to react with the $TiI_4$ to deposit a monolayer of titanium nitride over the work function metal layer.

13. The method of claim 10, wherein the first portion of the work function metal layer is in physical contact with the two adjacent second semiconductor structures.

14. The method of claim 10, wherein the gate dielectric layer has an iodine concentration in a range from about 0.05 at % to about 10 at %.

15. The method of claim 10, wherein forming the gate dielectric layer wrapping around the second semiconductor structures comprises:
   forming a first gate dielectric wrapping around the second semiconductor structures; and
   forming a second gate dielectric over the second gate dielectric, wherein second gate dielectric and the first gate dielectric have different compositions and different iodine concentrations.

16. The method of claim 15, wherein the second gate dielectric has an iodine concentration greater than an iodine concentration of the first gate dielectric.

17. The method of claim 15, wherein the second gate dielectric has a first interface between the work function metal layer and the second gate dielectric and a second interface between the second gate dielectric and the first gate dielectric, wherein the first interface has an iodine concentration greater than an iodine concentration of the second interface.

18. A method, comprising:
   patterning a substrate to form a fin, wherein the fin comprises alternately stacked first semiconductor structures and second semiconductor structures;
   removing the first semiconductor structures to form spaces each between the second semiconductor structures;
   forming a gate dielectric layer wrapping around each of the second semiconductor structures;
   forming a work function metal layer on the gate dielectric layer, wherein the work function metal layer has a portion having an oxygen concentration decreasing in a direction away from the gate dielectric layer; and
   forming a fill metal layer on the work function metal layer.

19. The method of claim 18, wherein the work function metal layer is titanium nitride.

20. The method of claim 18, wherein the gate dielectric layer comprises oxygen atoms and iodine atoms.

* * * * *